(12) United States Patent
Wu et al.

(10) Patent No.: US 12,727,240 B2
(45) Date of Patent: Sep. 1, 2026

(54) STACKED COMPLEMENTARY FinFET PROCESS AND DEVICE

(71) Applicant: Taiwan Semiconductor Manufacturing Co., Ltd., Hsinchu (TW)

(72) Inventors: Ting-Yun Wu, Taipei (TW); Jui-Chien Huang, Hsinchu (TW); Szuya Liao, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 541 days.

(21) Appl. No.: 18/323,561

(22) Filed: May 25, 2023

(65) Prior Publication Data

US 2024/0258314 A1 Aug. 1, 2024

Related U.S. Application Data

(60) Provisional application No. 63/481,642, filed on Jan. 26, 2023.

(51) Int. Cl.

*H10D 84/85* (2025.01)
*H10D 64/01* (2025.01)
*H10D 84/01* (2025.01)
*H10D 84/03* (2025.01)
*H10D 88/00* (2025.01)

(52) U.S. Cl.

CPC ......... *H10D 84/856* (2025.01); *H10D 64/017* (2025.01); *H10D 84/0188* (2025.01); *H10D 84/0193* (2025.01); *H10D 84/038* (2025.01); *H10D 84/853* (2025.01); *H10D 88/01* (2025.01)

(58) Field of Classification Search

CPC .. H10D 84/856; H10D 30/797; H10D 30/024; H10D 64/021; H10D 88/00; H10D 84/0167; H10D 84/0158; H10D 84/017

See application file for complete search history.

(56) References Cited

U.S. PATENT DOCUMENTS 11,069,684 B1 * 7/2021 Xie .................. H01L 21/02603
2020/0006479 A1 * 1/2020 Reznicek ............ H10D 86/201
2021/0265345 A1 * 8/2021 Xie ..................... H10D 62/116
2022/0085013 A1 * 3/2022 Reznicek ............ H10D 64/017

(Continued)

*Primary Examiner* — Fernando L Toledo
*Assistant Examiner* — Adam S Bowen
(74) *Attorney, Agent, or Firm* — Slater Matsil, LLP

(57) ABSTRACT

A method for forming complementary FinFET (CFET) in a stacked configuration includes forming a recess in a stacked fin, growing a first epitaxial structure in the recess, etching the first epitaxial structure to remove a portion of the first epitaxial structure, forming a first isolation structure over the first epitaxial structure, and forming a second epitaxial structure over the first isolation structure. In another method, a dummy gate electrode over the stacked fin is etched, a first gate electrode deposited over the stacked fin, a portion of the first gate electrode recessed, and a second gate electrode formed over the first gate electrode. A CFET device includes a second channel region stacked over a first channel region, associated pairs of epitaxial structures on opposing sides of each of the first and second channel regions, and associated gate electrodes for each of the first and second channel regions.

20 Claims, 75 Drawing Sheets

(56) References Cited

U.S. PATENT DOCUMENTS

2023/0086633 A1* 3/2023 Frougier .............. H10D 62/118
257/369
2023/0093897 A1* 3/2023 Kim ..................... H10D 84/853
257/288
2023/0197813 A1* 6/2023 Zhou .................... H10D 30/509
257/401
2023/0352528 A1* 11/2023 Park ................... H10D 84/0128
2023/0395600 A1* 12/2023 Xie ...................... H10D 64/018
2023/0420562 A1* 12/2023 Huang ................. H10D 62/121

* cited by examiner

52 { 52A and/or 52B

STACKED COMPLEMENTARY FinFET PROCESS AND DEVICE

PRIORITY CLAIM AND CROSS-REFERENCE

This application claims the benefit of U.S. Provisional Application No. 63/481,642, filed on Jan. 26, 2023, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4B, 4C, and 4D illustrate cross-sectional views of intermediate steps in the formation of a semiconductor stack, in accordance with some embodiments.

DETAILED DESCRIPTION

Figure 1:
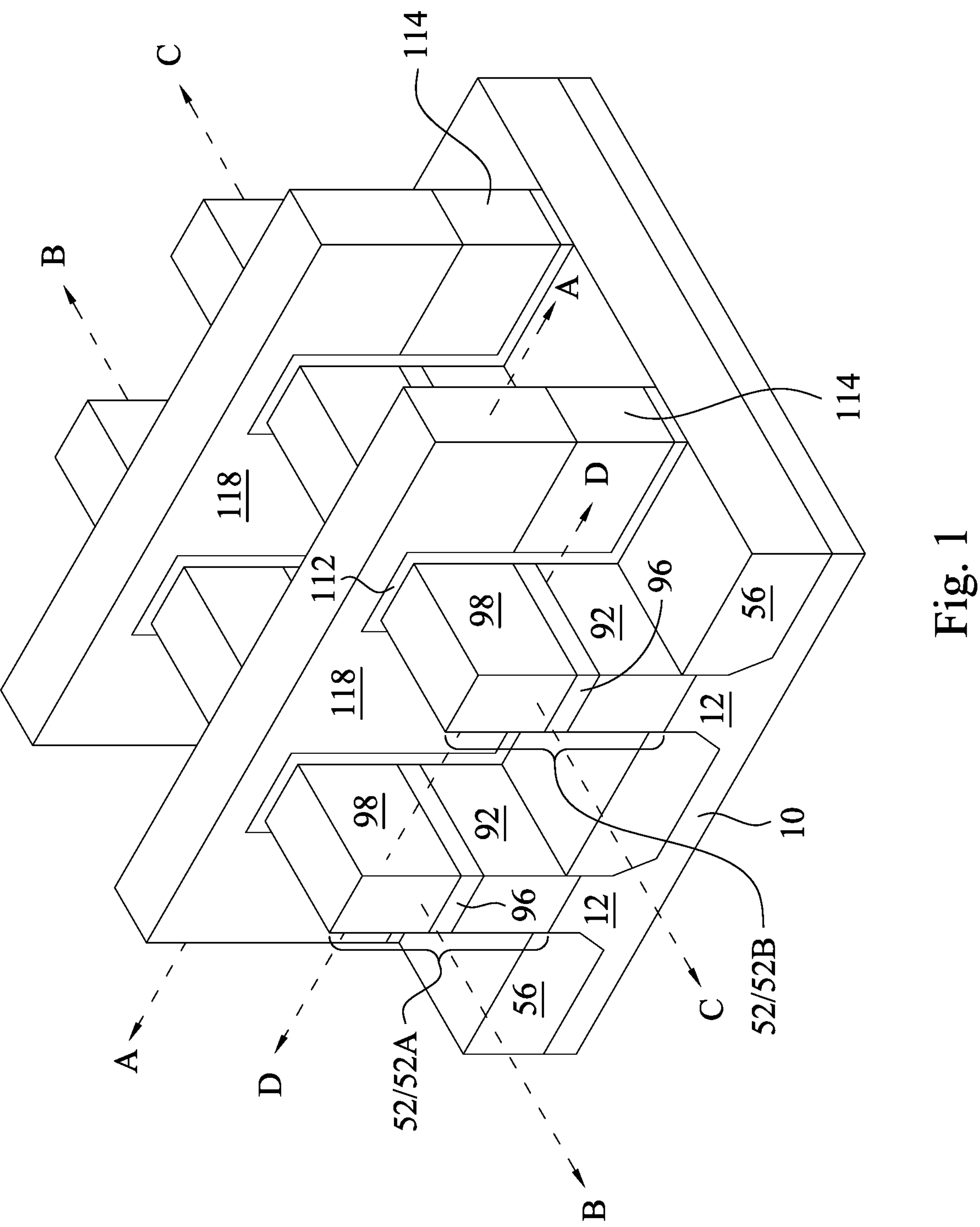
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Complementary field effect transistors (FETs) or CFETs provide both a NFET and PFET in a complementary or CMOS configuration. Typically NFETs and PFETs may be formed side-by-side. To reduce size and space, however, they can be formed on top of one another. Forming NFETs and PFETs in a stacked configuration presents various challenges. Embodiments of the present disclosure provide a stacked CFET device utilizing a FinFET processing knob. Embodiments advantageously provide the ability to use different channel materials for the NFET channels than the channel materials for the PFET channels, a result that can otherwise be challenging in a stacked configuration. The different channel materials can greatly enhance device performance, achieving better electron mobility and improving logic performance. Moreover, these different channel materials are compatible in the same wafer. As such, a logic element which might usually use one device type might use a different device type, since it can be readily available. For example, an SRAM pick up can adopt an Si channel (NFET) to weaken drive current for write margin optimization. Embodiments also provide both a monolithic and sequential configuration according to various embodiments. Embodiments further include optional designs such as hybrid fin configurations and a gate separation structure between the respective gates of the NFET and PFET. In the embodiments described below, the NFET is formed over the PFET, however it should be understood that one may reverse the order of the NFET and PFET, including their corresponding materials.

FIG. 1 illustrates an example of a FinFET formed CFET (which may also be referred to as a FinFET) in a three-dimensional view, in accordance with some embodiments. Some features have been omitted for clarity. The CFET comprises two parallel fins 52, fin 52A and 52B, on a substrate 10 (e.g., a semiconductor substrate). Isolation regions 56 are disposed in the substrate 10, and the fin 52 protrudes above and from between neighboring isolation regions 56. Although the isolation regions 56 are described/illustrated as being separate from the substrate 10, as used herein the term "substrate" may be used to refer to just the semiconductor substrate or a semiconductor substrate inclusive of isolation regions. In this context, the fin 52 refers to the portion extending between the neighboring isolation regions 56.

A gate dielectric layer 112 is along sidewalls and over a top surface of the fin 52, and an n-type gate electrode 118 and p-type gate electrode 114 are over the gate dielectric layer 112, the n-type gate electrode 118 being disposed over the p-type gate electrode 114. P-type epitaxial source/drain regions 92 are disposed in opposite sides of the fin 52 with respect to the gate dielectric layer 112 and p-type gate electrode 114. Epitaxial source/drain region(s) 92 and epitaxial source/drain region(s) 98 may refer to a source or a drain, individually or collectively dependent upon the context. N-type source/drain regions 98 are disposed in opposite sides of the fin 52 with respect to the gate dielectric layer 112 and n-type gate electrode 118. An isolation structure 96 is disposed between the p-type epitaxial source/drain regions 92 and the n-type epitaxial source/drain regions 98. Additional fins 52 may run parallel to the illustrated fins 52, and additional gate electrode stacks 114/118 may run parallel to the illustrated gate electrode stacks 114/118.

FIG. 1 further illustrates reference cross-sections that are used in later figures. Cross-section A-A is along a longitudinal axis of the n-type gate electrode 118 and p-type gate electrode 114 and in a direction, for example, perpendicular to the direction of current flow between the n-type source/drain regions 98 of the CFET, or for example, perpendicular to the direction of current flow between p-type epitaxial source/drain regions 92 of the CFET. Cross-section B-B is perpendicular to cross-section A-A and is along a longitudinal axis of the fin 52A and in a direction of, for example, a current flow between the n-type source/drain regions 98 of the CFET and between the p-type epitaxial source/drain regions 92 of the CFET. Cross-section C-C is parallel to the cross-section B-B and is along a longitudinal axis of the fin 52B. Cross-section D-D is parallel to cross-section A-A and extends through the n-type source/drain region 98 and p-type epitaxial source/drain region 92 of the FinFET. Subsequent figures refer to these reference cross-sections for clarity.

Some embodiments discussed herein are discussed in the context of CFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

Figures 2A, 2B:
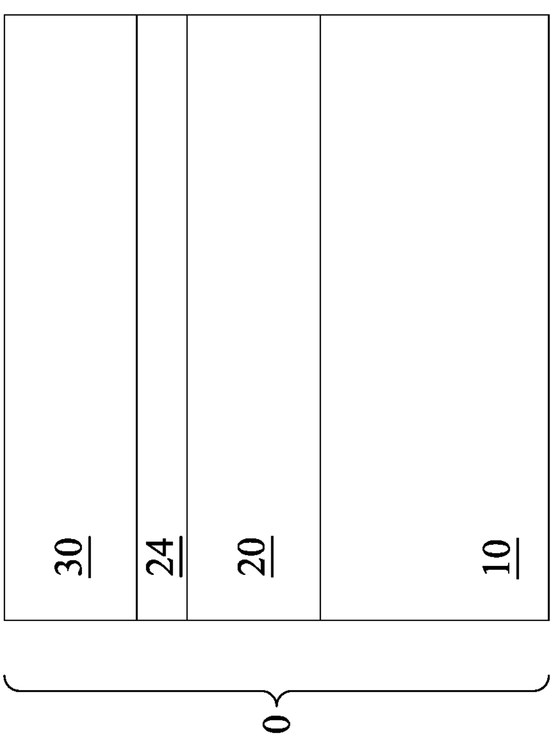
FIGS. 2A and 2B illustrate cross-sectional views of intermediate steps in the formation of a semiconductor stack, in accordance with some embodiments.
Figure 59B:
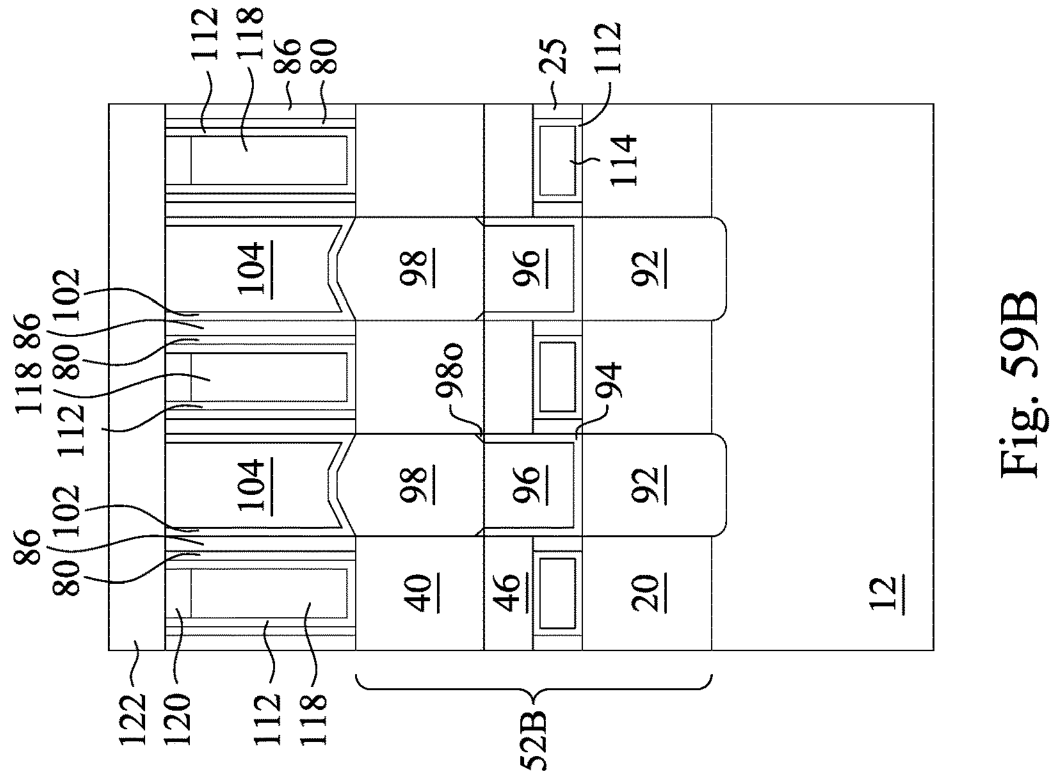
Figure 59A:
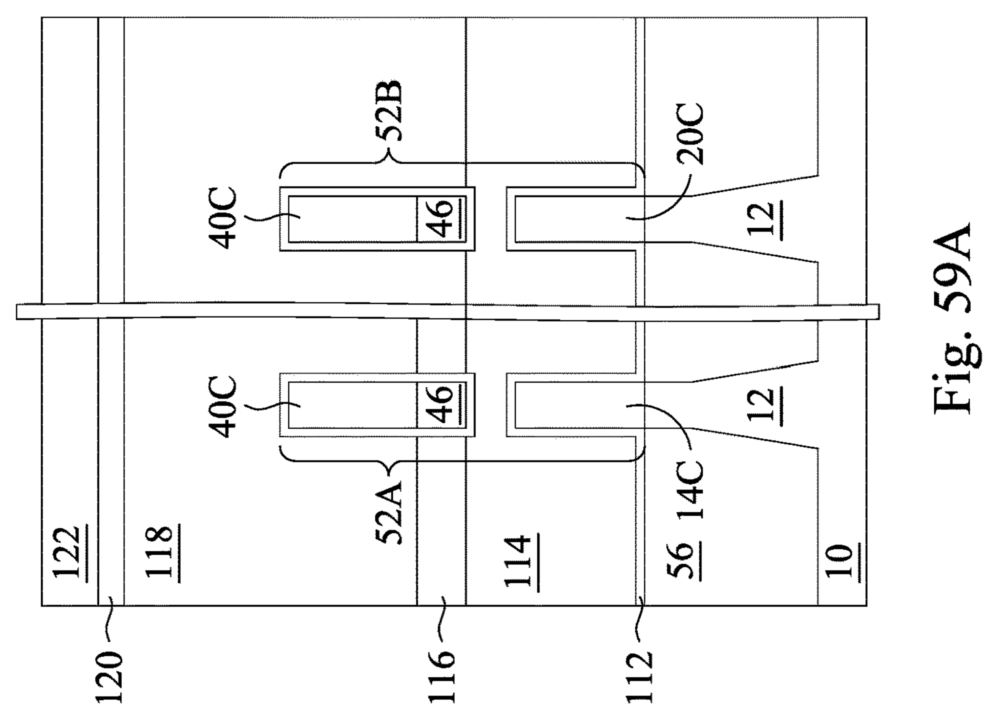
Figure 60B:
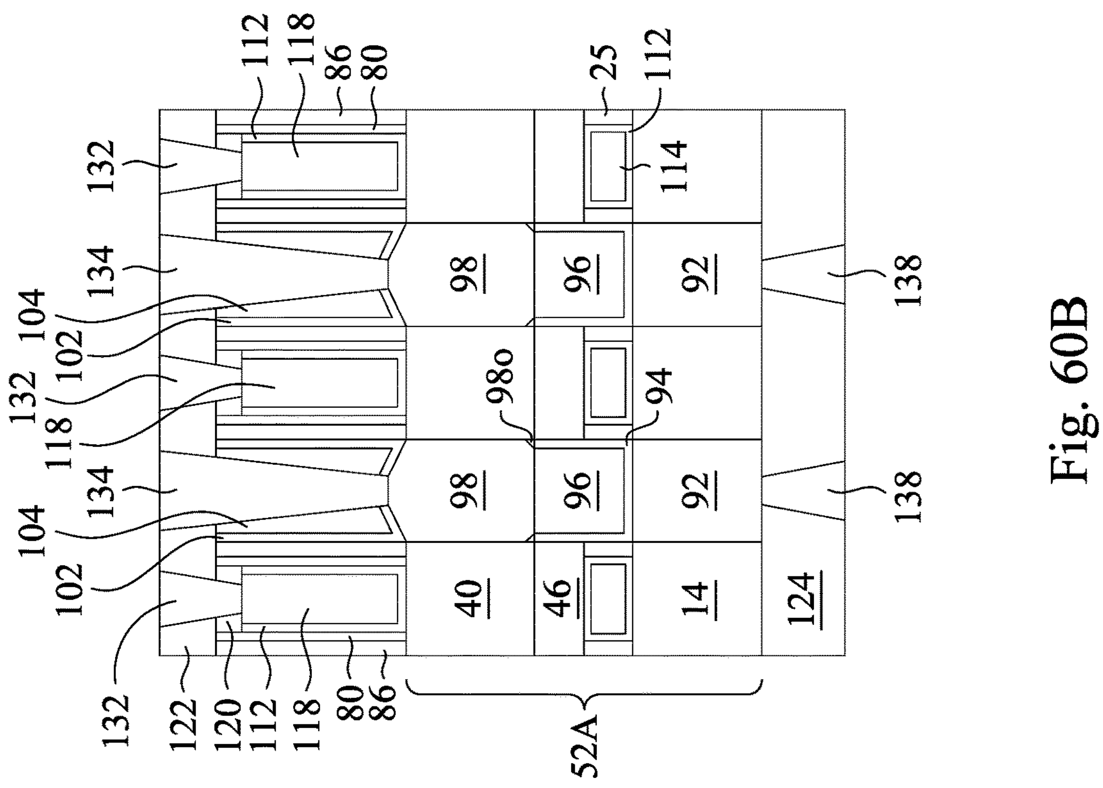
Figure 60A:
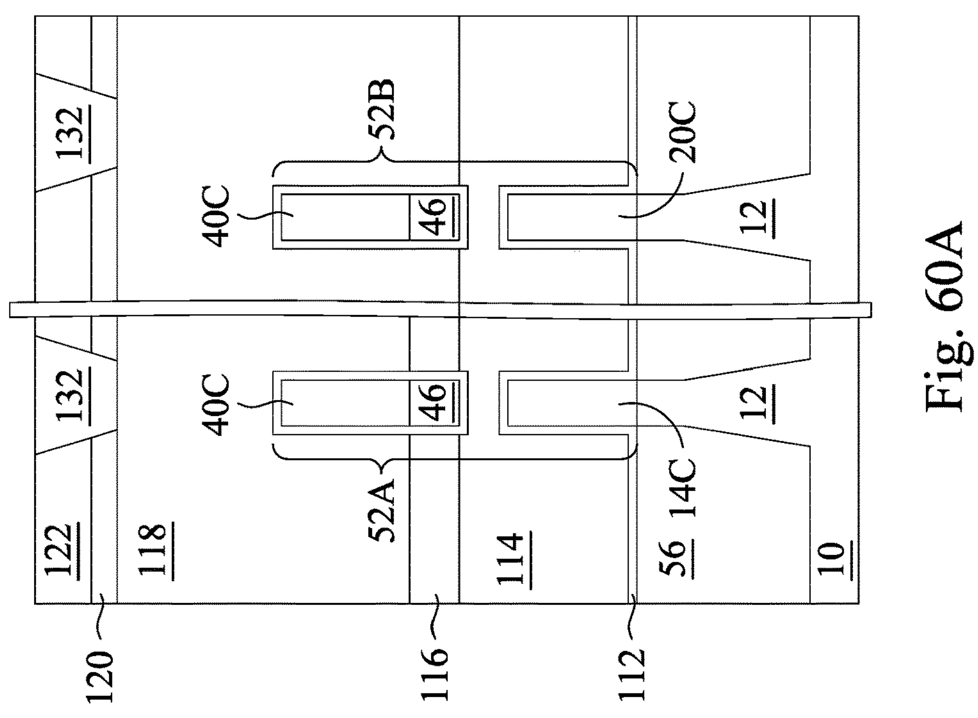
Figure 60D:
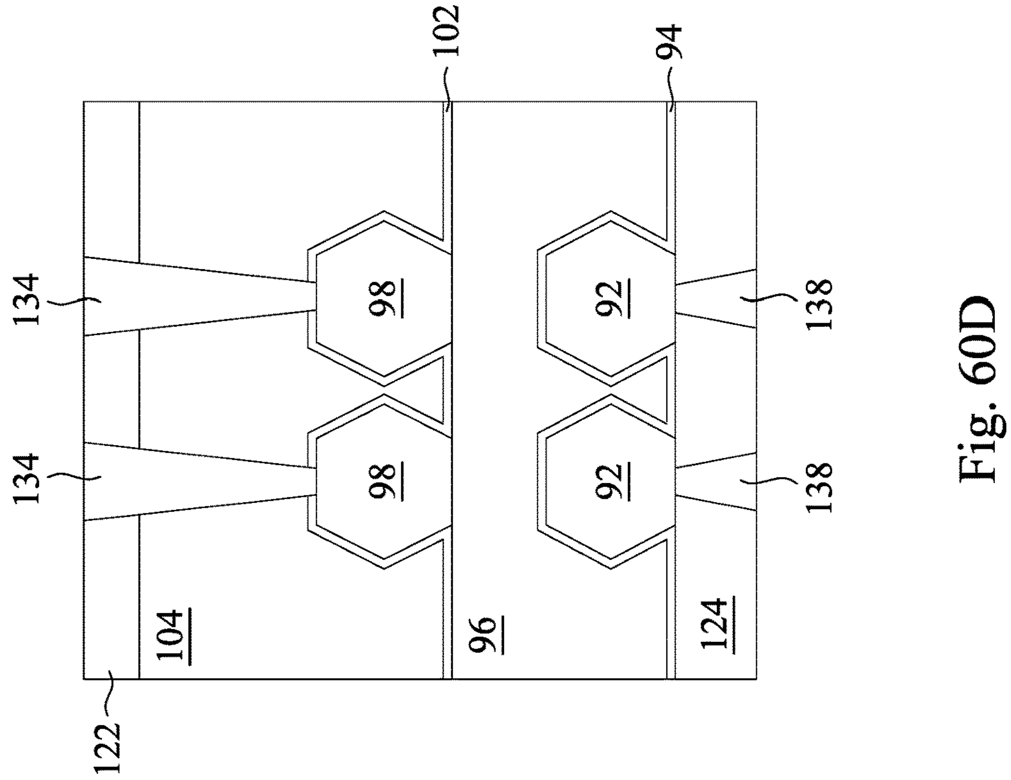
Figure 60C:
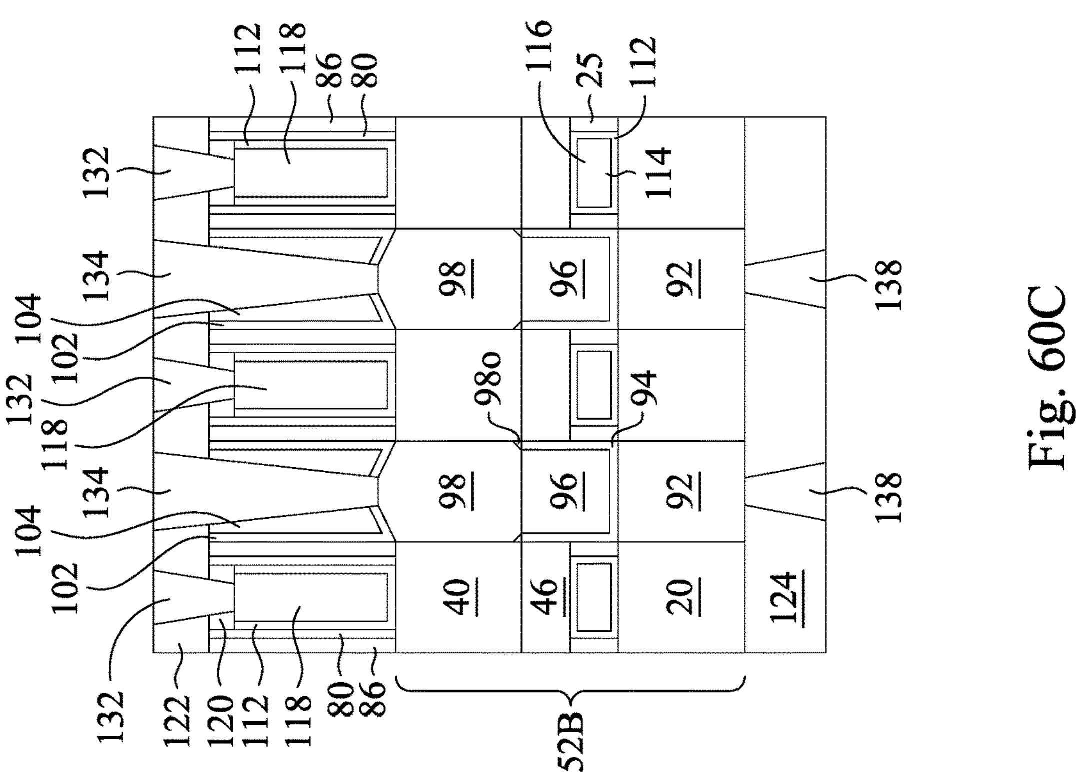

FIGS. 2A through 60D are cross-sectional views of intermediate stages in the manufacturing of CFETs, in accordance with some embodiments. The Figures are described in terms of four general stages. The first stage is the formation of the fins 52. The second stage is the formation of the dummy gates overlying the fins 52. The third stage is the formation of the epitaxial source/drain regions 92 and the epitaxial source/drain regions 98. The fourth stage is the replacement of dummy gates with replacement gates. Multiple embodiments are described in each of these stages. Each major embodiment is discussed in detail in each stage. FIGS. 2A through 8C illustrate the first stage where fins 52 are formed. FIGS. 9 through 14B illustrate the second stage where dummy gates are formed. FIGS. 15A through 35D illustrate the fourth stage where epitaxial source/drain regions 92 and 98 are formed. FIGS. 36A through 60D illustrate the third stage where the replacement gates are formed. Within each of these stages, various embodiments are discussed below.

FIGS. 2A, 2B, 3A, 3B, 3C, 3D, 4A, 4B, 4C, 4D, 5A, 5B, 6A, 6B, 7A, 7B, 8A, 8B, 8C, 9, 10, 11, 12, 13A, 14A, 15A, 16A, 17A, 18A, 19A, 24A, 25A, 26A, 30A, 31A, 34A, 35A, 36A, 37A, 39A, 40A, 41A, 42A, 44A, 45A, 46A, 47A, 48A, 49A, 50A, 51A, 52A, 53A, 54A, 55A, 56A, 57A, 58A, 59A, and 60A are illustrated along reference cross-section A-A illustrated in FIG. 1. FIGS. 13B and 14B are illustrated along reference cross-section B-B and/or C-C. FIGS. 23C, 24B, 30B, 32A, 33A, 35B, 46B, 53B, and 60B are illustrated along reference cross-section B-B. FIGS. 15B, 16B, 17B, 18B, 19B, 20A, 20C, 20E, 21A, 21B, 21C, 21D, 21E, 21G, 22A, 23A, 24C, 25B, 26B, 27A, 28A, 29A, 30C, 31B, 32B, 33B, 34B, 35C, 36B, 37B, 38, 39B, 40B, 41B, 42B, 43, 44B, 45B, 46C, 47B, 48B, 49B, 50B, 51B, 52B, 53C, 54B, 55B, 56B, 57B, 58B, 59B, and 60C are illustrated along reference cross-section C-C illustrated in FIG. 1. FIGS. 19C, 19D, 20B, 20D, 20F, 21F, 21H, 22B, 23B, 24D, 26C, 26D, 27B, 28B, 29B, 30D, 35D, 46D, 53D, and 60D are illustrated along reference cross-section D-D illustrated in FIG. 1.

FIGS. 2A through 7B illustrate various ways of forming a multi-layered semiconductor stack 50, in accordance with various embodiments. These layers are later patterned into the fins 52. FIGS. 2A through 2B and 3A through 3D illustrate a process of forming a semiconductor stack 50 in a monolithic way. In FIG. 2A, a substrate 10 is provided. The substrate 10 may be a semiconductor substrate, such as a bulk semiconductor, a semiconductor-on-insulator (SOI) substrate, or the like, which may be doped (e.g., with a p-type or an n-type dopant) or undoped. The substrate 10 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In FIG. 2B, a semiconductor layer 20 is epitaxially grown over the substrate 10. The semiconductor layer 20 will later be used for the PFET channel region. The material composition of the PFET channel region may therefore be made of any suitable p-type semiconductor material such as silicon germanium. In some embodiments, the material composition of the p-type semiconductor material is $Si_xGe_y$, where x=1−y and y=20-30%. The thickness of the semiconductor layer 20 may be selected based on the intended use. Eventually, the semiconductor layer 20 will become a channel, so the thickness may be increased or decreased as needed. For example, increasing the channel thicknesses for the NFET or PFET provides the ability to balance between the NFETs and PFETs to achieve power, performance, and area optimization. After the formation of the semiconductor layer 20, a semiconductor layer 24 may be formed over the semiconductor layer 20. The semiconductor layer 24 is formulated so that it may be selectively etched in a later process. The material composition of the semiconductor layer 24 may therefore be made of any suitable semiconductor material, such as silicon germanium, but in a different composition percentage. In some embodiments, the material composition of the semiconductor layer 24 is $Si_xGe_y$, where x=1−y and y=40-60%. For the sake of simplicity, the semiconductor layer 24 may be referred to as a high germanium or high Ge silicon germanium layer.

Maintaining a semiconductor material for the semiconductor layer 24 enables the semiconductor layer 30 to be epitaxially grown from the semiconductor layer 24. The semiconductor layer 30 will later be used for the NFET channel region. The material composition of the NFET channel region may therefore be made of any suitable n-type semiconductor material such as silicon, thereby forming the semiconductor stack 50. The thickness of the semiconductor layer 30 may be selected based on the intended use. Eventually, the semiconductor layer 30 will become a channel, so the thickness may be increased or decreased as needed. In some embodiments, the thickness of the semiconductor layer 30 (or of semiconductor layer 40 described below) may be between about 25% to about 75% of the thickness of the semiconductor layer 20. In some embodiments, the thicknesses may be about the same.

The semiconductor layer 20 may be doped with n-type impurities during, i.e., in situ, the growth of the semiconductor layer 20 or may be doped after the growth. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. Similarly, the semiconductor layer 30 may be doped with p-type impurities during, i.e., in situ, the growth of the semiconductor layer 20 or may be doped after the growth. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. Doped impurities determine conductivity type such that materials doped with n-type impurities have a first conductivity type and materials doped with p-type impurities have a second conductivity type opposite the first conductivity type.

In FIG. 3A through 3D a process is described for forming a hybrid semiconductor stack 50. Like references are used to refer to like structures to those previously discussed. For example, FIG. 3A utilizes the substrate 10 from FIG. 2A, however, instead of growing a silicon germanium semiconductor layer 20, a semiconductor layer 14 is grown utilizing silicon. The semiconductor layer 14 is still used as the channel region in the PFET. As such, it can be doped with p-type impurities as indicated above. The thickness of the semiconductor layer 14 may be selected based on the intended use. Eventually, the semiconductor layer 14 will become a channel, so the thickness may be increased or decreased as needed.

Figure 3B:
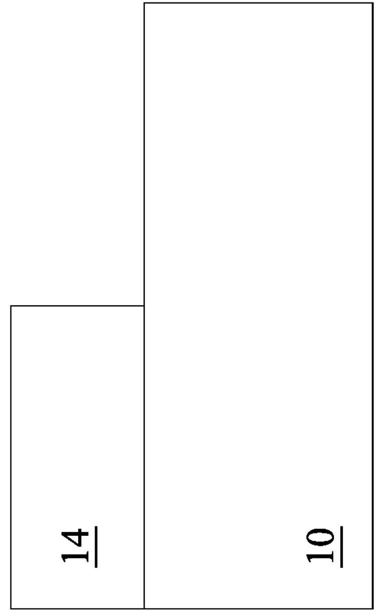
FIGS. 3A, 3B, 3C, and 3D illustrate cross-sectional views of intermediate steps in the formation of a semiconductor stack, in accordance with some embodiments.
Figure 3A:
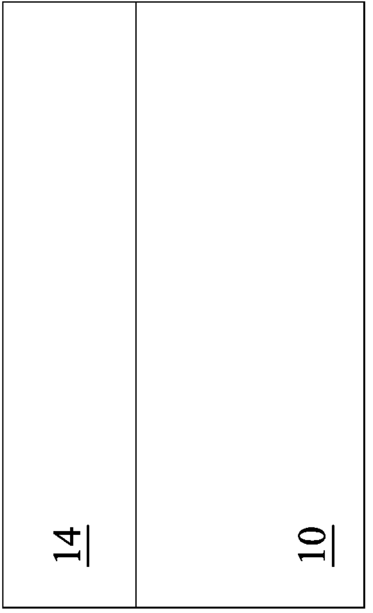

In FIG. 3B, the semiconductor layer 14 is patterned, for example, by a photopatterning process, to remove a portion of the semiconductor layer 14. As an example of using a photopatterning process, a photoresist is formed over the semiconductor layer 14. The photoresist is patterned to expose the portion of the semiconductor layer 14 which is to be removed. The photoresist can be formed by using a spin-on technique and can be patterned using acceptable photolithography techniques. Once the photoresist is patterned, the photoresist may act as an etch mask to protect a portion of the semiconductor layer 14 which is retained while allowing a suitable etchant to remove the exposed portion of the semiconductor layer 14. Although all of the semiconductor layer 14 is illustrated as being removed, in some embodiments less than all or more than all (i.e., including a portion of the substrate 10) may be removed. After the etching, the photoresist may be removed, such as by an acceptable ashing process.

Figure 3D:
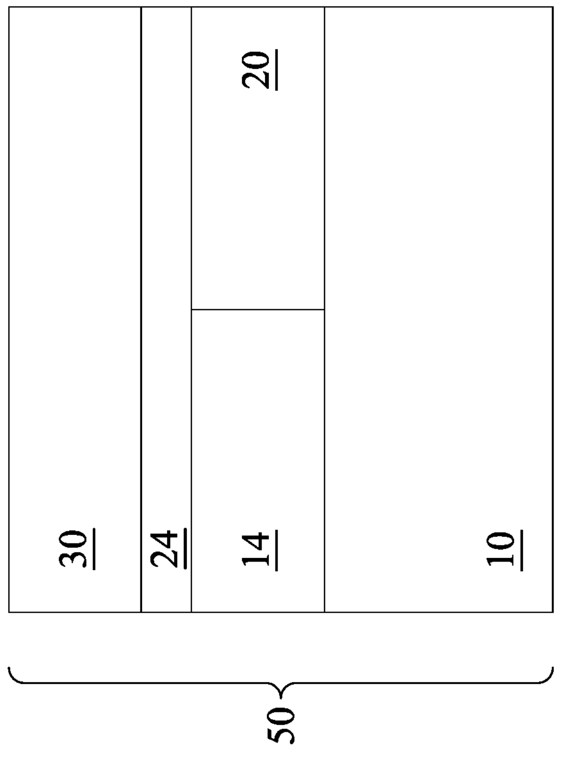
Figure 3C:
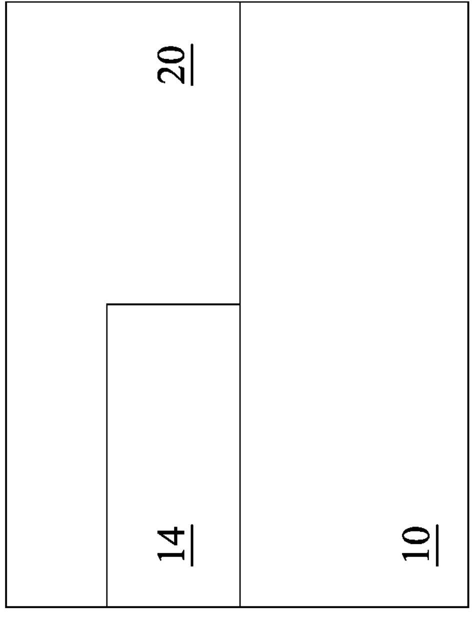

In FIG. 3C, the semiconductor layer 20 is grown over the semiconductor layer 14 and over the substrate 10. The semiconductor layer 20 is like unto the semiconductor layer 20 of FIG. 2B. That is, in some embodiments, the material composition of the semiconductor layer 20 is $Si_xGe_y$, where x=1−y and y=20-30%. Following the deposition of the semiconductor layer 20, a planarization process, such as a chemical mechanical planarization (CMP) process may be used to level upper surfaces of the semiconductor layer 20 with upper surfaces of the semiconductor layer 14.

In FIG. 3D, the semiconductor layer 24 is epitaxially grown from the semiconductor layer 14 and the semiconductor layer 20. The semiconductor layer 24 is like unto the semiconductor layer 24 discussed above with respect to FIG. 2B. That is, in some embodiments, the material composition of the semiconductor layer 24 is SixGey, where x=1-y and y=40-60%. Following the formation of the semiconductor layer 24, the semiconductor layer 30 may be epitaxially grown from the semiconductor layer 24. The semiconductor layer 30 is like unto the semiconductor layer 30 discussed above with respect to FIG. 2B.

The semiconductor stack 50 in FIG. 3D is a hybrid stack, and as will be discussed in further detail below, it may be patterned to form a fin with a p-channel of silicon (e.g., from semiconductor layer 14) and another adjacent fin with a p-channel of silicon germanium (e.g., from semiconductor layer 20). As such, the electrical characteristics may be customized for different PFET devices in the same device wafer.

FIGS. 4A through 7B illustrate ways of forming the semiconductor stack 50 using sequential processes. In sequential processes, a portion of the device is preformed separately and then bonded at some point in the process to the device wafer. Following the bonding, the different devices still need to be formed. One advantage, however, of utilizing the sequential processes is that more flexibility is provided for forming some of the layers of the semiconductor stack 50. Further, time can be reduced by forming some of the layers at other separate stages or by providing some of the layers by preformed materials.

Figures 4A, 4B:
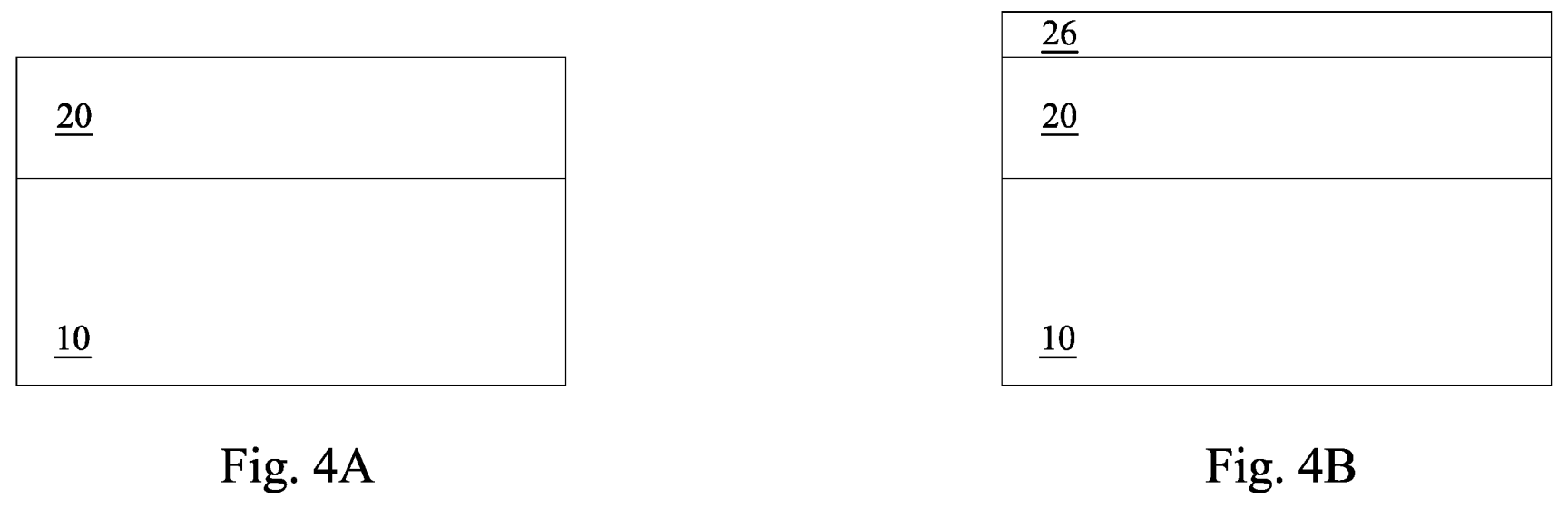

In FIG. 4A, the semiconductor layer 20 is grown on the substrate 10, such as discussed above with respect to FIG. 2B. In FIG. 4B, however, instead of growing the semiconductor layer 24, an insulating layer 26 (or dielectric layer) is formed on the semiconductor layer 20. Besides providing isolation between the subsequently formed source/drain regions, the insulating layer 26 is used as a bonding layer. The insulating layer 26 may be formed of any suitable material, such as silicon oxide, silicon nitride, silicon carbide, silicon oxynitride, silicon oxycarbide, silicon oxycarbontride, silicon carbonitride, the like, or combinations thereof. The insulating layer 26 may 26 may be deposited using any suitable technique, such as by CVD, PVD, ALD, the like, or combinations thereof.

Figure 4D:
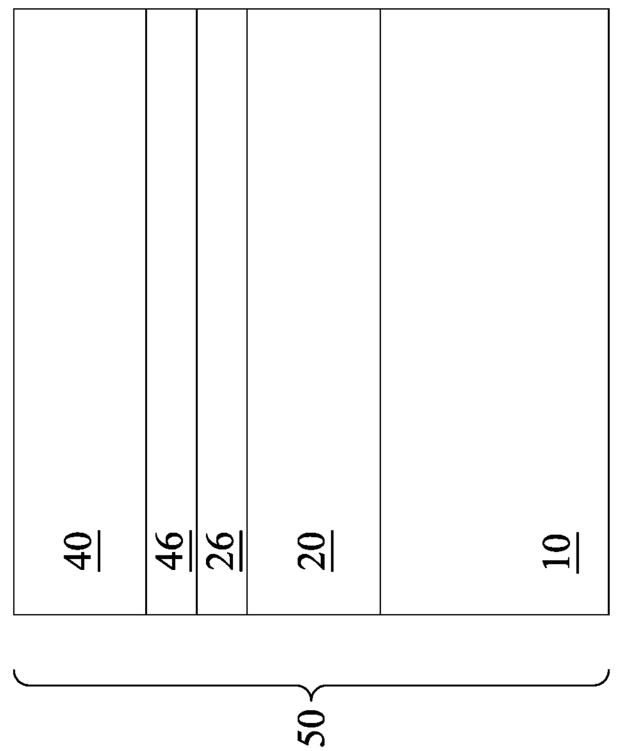
Figure 4C:
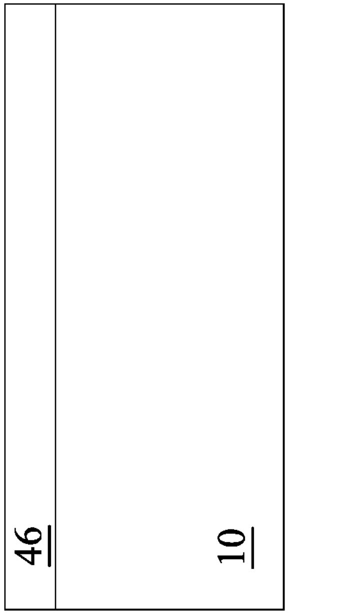

In FIG. 4C a substrate 40 is provided. The substrate 40 may be formed from any of the candidate materials as the substrate 10. In some embodiments, the substrate 40 is an n-type doped silicon substrate. The substrate 40 will be used as the NMOS channel, in accordance with some embodiments. An insulating layer 46 (or dielectric layer) is disposed on the substrate 40 and may be used as a bonding layer. The insulating layer 46 may be preformed on the substrate 40 or may be formed on the substrate 40 by any suitable technique, such as by CVD, PVD, ALD, the like, or combinations thereof. The insulating layer 46 may be formed of any of the candidate materials as the insulating layer 26. Generally, the insulating layer 46 is the same material as the insulating layer 26, however, they may be different in some embodiments.

In FIG. 4D, the substrate 40 and insulating layer 46 are flipped over and bonded in a direct fusion bond with the insulating layer 26. That is, the insulating layer 46 is pressed against the insulating layer 26 and heat is applied. The pressure and heat cause the bonds of the insulating material to cross-link between the insulating layer 26 and the insulating layer 46, thereby fusing the two together. Under examination, the insulating layer 46 may be distinguishable from the insulating layer 26. After bonding the substrate 40, the back side of the substrate 40 may be ground down or planarized, so that a thickness of the substrate 40 is similar to the thickness of the semiconductor layer 20, thereby forming the semiconductor stack 50. The thickness of the semiconductor layer 40 may be selected based on the intended use. Eventually, the semiconductor layer 40 will become a channel, so the thickness may be increased or decreased as needed.

Figure 5B:
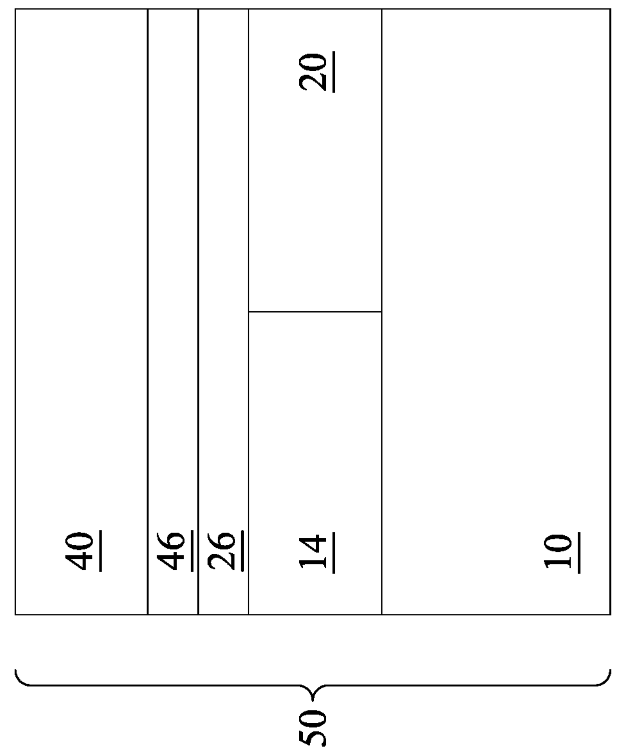
FIGS. 5A and 5B illustrate cross-sectional views of intermediate steps in the formation of a semiconductor stack, in accordance with some embodiments.
Figure 5A:
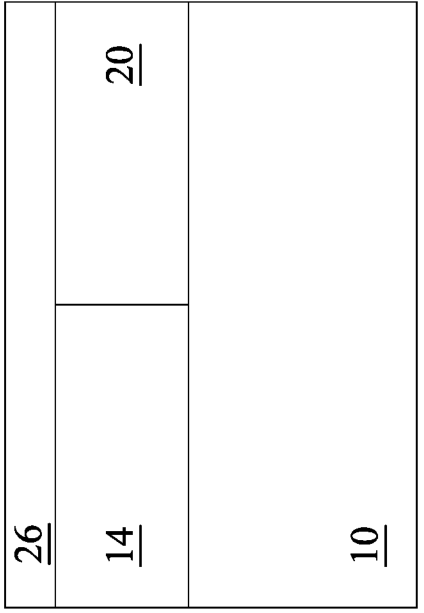

FIGS. 5A and 5B illustrate a process similar to that described with respect to the process of FIGS. 4A through 4D, however, a hybrid semiconductor stack 50 is formed. In FIG. 5A, rather than growing the semiconductor layer 20, the semiconductor layer 14 is grown, such as described above with respect to FIG. 3A. Then, the semiconductor layer 14 is partially removed, such as described above with respect to FIG. 3B. Next, the semiconductor layer 20 is grown from the substrate 10 and the semiconductor layer 14. Then, a planarization process is used to level the upper surfaces. In FIG. 5A, instead of growing a semiconductor layer 24, the insulating layer 26 is deposited over the hybrid stack which includes the semiconductor layer 14 and the semiconductor layer 20.

In FIG. 5B, the substrate 40 and insulating layer 46 are bonded to the insulating layer 26, such as described with respect to FIG. 4D. The substrate 40 is then thinned, thereby forming the hybrid semiconductor stack 50.

Figure 6B:
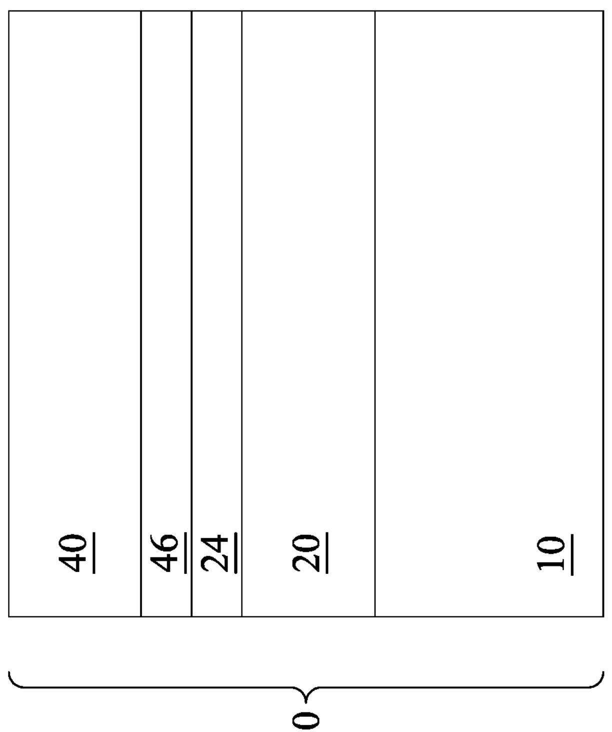
FIGS. 6A and 6B illustrate cross-sectional views of intermediate steps in the formation of a semiconductor stack, in accordance with some embodiments.
Figure 6A:
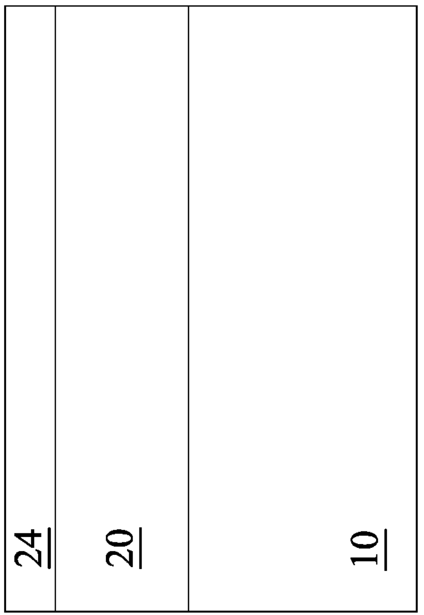

FIGS. 6A and 6B illustrate the formation of a semiconductor stack 50 using a combined process. After forming the semiconductor layer 24, such as described above with respect to FIG. 2B, instead of growing another epitaxial layer thereon, the substrate 40 and insulating layer 46 are bonded to the semiconductor layer 24. There is a further advantage to this process when making the gate electrode, which is described below. The bonding of the insulating layer 46 to the semiconductor layer 24 may be performed using similar techniques as bonding the insulating layer 46 to the insulating layer 26, described with respect to FIG. 4D. As discussed above, the insulating layer 46 may be made of a silicon-based insulating material. The pressure and heat of the bonding process can cause some of the oxygen, for example, from the silicon oxide of the insulating layer 46 to bond with some of the silicon from the semiconductor layer 24, and some of the germanium from the semiconductor layer 24 to bond (or crystalize) with some of the silicon from the insulating layer 46.

After bonding the substrate 40 to the semiconductor layer 24 by way of the insulating layer 46, the substrate 40 may be thinned to form the semiconductor layer 40, thereby forming the semiconductor stack 50.

Figure 7B:
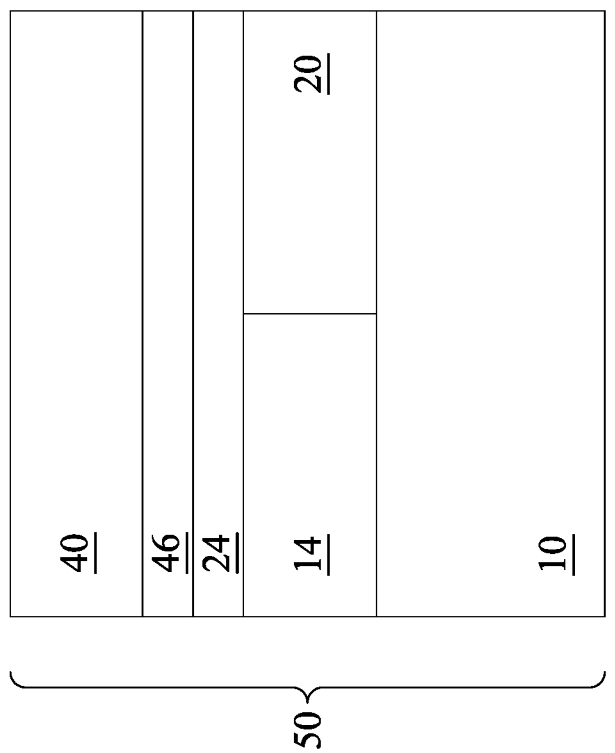
FIGS. 7A and 7B illustrate cross-sectional views of intermediate steps in the formation of a semiconductor stack, in accordance with some embodiments.
Figure 7A:
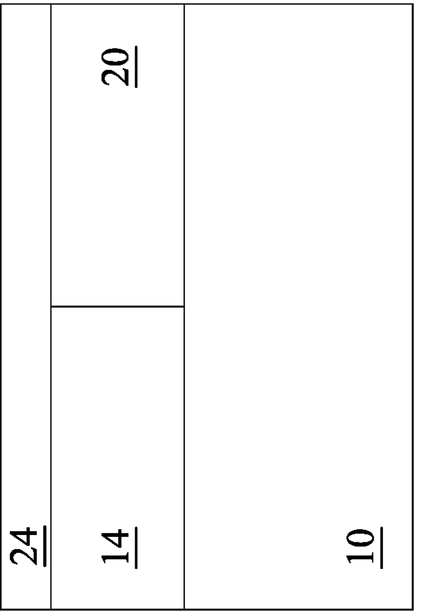

FIGS. 7A and 7B illustrate a process similar to that described with respect to the process of FIGS. 6A and 6B, however, a hybrid semiconductor stack 50 is formed. In FIG. 7A, rather than growing the semiconductor layer 20, the semiconductor layer 14 is grown, such as described above with respect to FIG. 3A. Then, the semiconductor layer 14 is partially removed, such as described above with respect to FIG. 3B. Next, the semiconductor layer 20 is grown from the substrate 10 and the semiconductor layer 14. Then, a planarization process is used to level the upper surfaces. The semiconductor layer 24 is then grown from the semiconductor layer 14 and the semiconductor layer 20.

In FIG. 7B, the substrate 40 and insulating layer 46 are bonded to the semiconductor layer 24, such as described with respect to FIG. 6B. The substrate 40 is then thinned, thereby forming the hybrid semiconductor stack 50.

It should be appreciated that, in the formation of the hybrid semiconductor stack 50, described above with respect to the various embodiments, rather than forming the semiconductor layer 14 first, the semiconductor layer 20 may be formed first, patterned, and then the semiconductor layer 14 may be formed over the semiconductor layer 20. Then, a CMP process may be used to level the upper surfaces of the semiconductor layer 14 and semiconductor layer 20, thereby achieving the hybrid semiconductor layer 14/20 of the hybrid semiconductor stack 50.

Figure 8B:
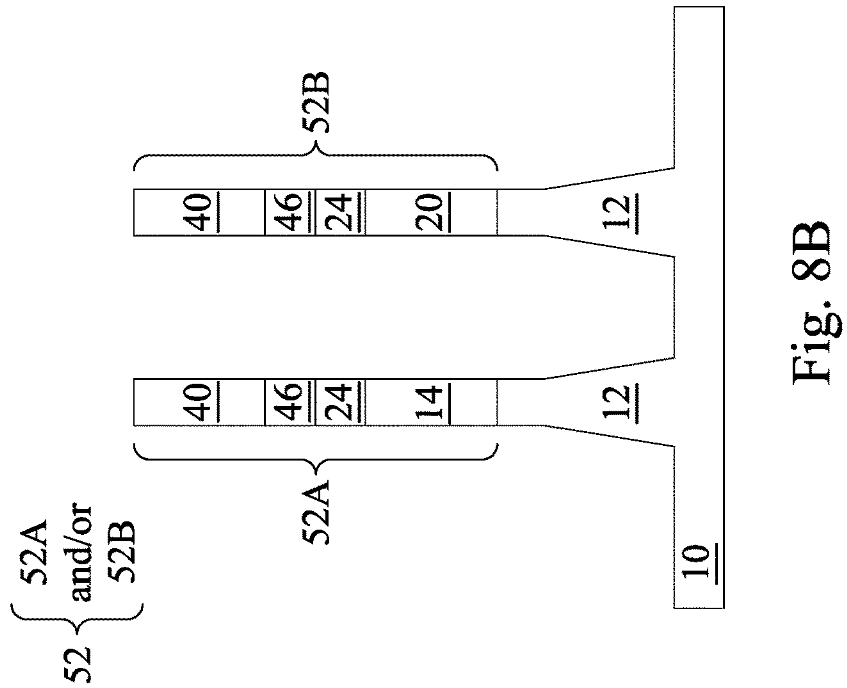
FIGS. 8A, 8B, and 8C illustrate cross-sectional views of intermediate steps in the formation of a multi-layered fin structure in accordance with various embodiments.
Figure 8A:
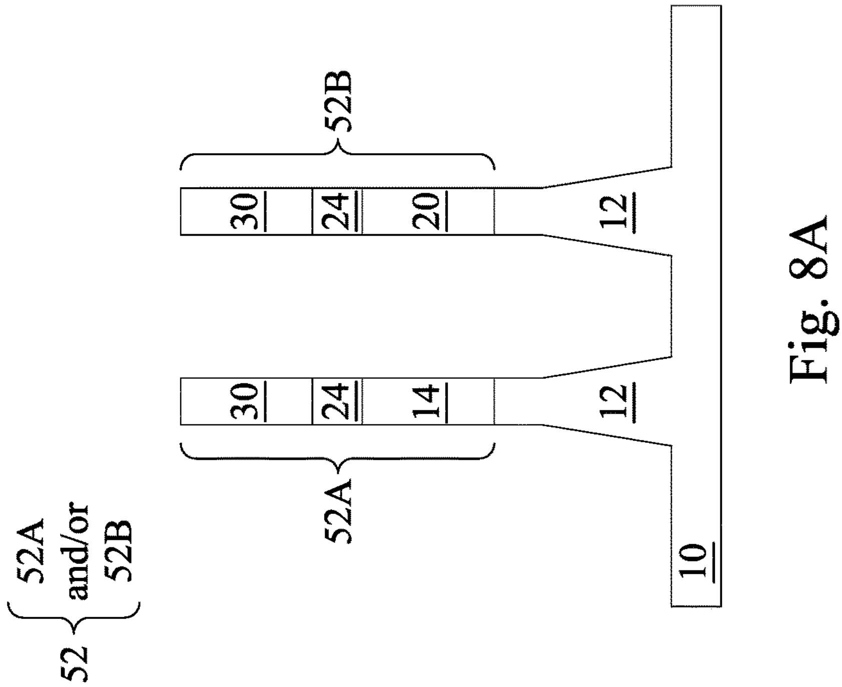
Figure 8C:
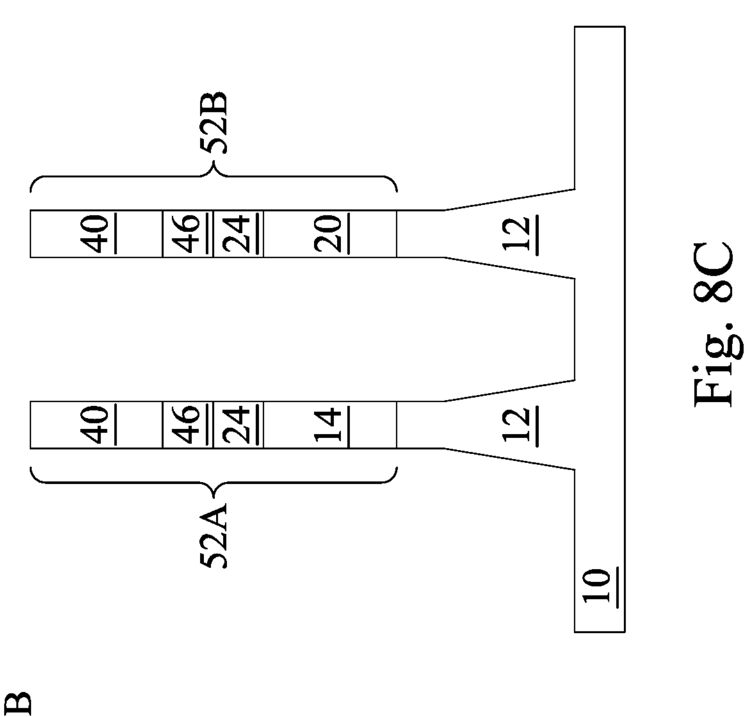

In FIGS. 8A, 8B, and 8C, fins 52 (including fins 52A and 52B) are formed in the semiconductor stack 50. For the sake of simplicity, FIGS. 8A, 8B, and 8C proceed from the hybrid semiconductor stack 50 of FIGS. 3D, 5B, and 7B, respectively, however, it should be appreciated that the illustrated embodiments for FIG. 8A may proceed from either FIG. 2B or 3D, the illustrated embodiments for FIG. 8B may proceed from either FIG. 4D or 5B, and the illustrated embodiments for FIG. 8C may proceed from either FIG. 6B or 7B. In such cases, the semiconductor layer 14 is substituted with the semiconductor layer 20 (i.e., only the semiconductor layer 20 is used). Embodiments also contemplate where only the semiconductor layer 14 is used such can be substituted accordingly for references to the semiconductor layer 20.

The fins 52 are semiconductor strips. In some embodiments, the fins 52 may be formed in the semiconductor stack

50 by etching trenches in the semiconductor stack 50. The etching may be any acceptable etch process, such as a reactive ion etch (RIE), neutral beam etch (NBE), the like, or a combination thereof. The etch may be anisotropic. The fins 52 are disposed over a lower fin 12 which is etched from the substrate 10. The fins 52 include a p-type semiconductor layer 14 or 20 over the lower fin 12 which is patterned from the semiconductor layer 14 and semiconductor layer 20, an n-type semiconductor layer 30 or 40 which is patterned from the semiconductor layer 30 or semiconductor layer 40, and an isolation structure 106 which is patterned from the semiconductor layer 24 and/or insulating layer 26 and/or insulating layer 46. The isolation structure 106 is disposed between the n-type semiconductor layer 30 or 40 and the p-type semiconductor layer 14 and/or 20.

The resulting fins 52 include fins 52A and fins 52B. The fins 52A are fins which are unique to embodiments formed from the hybrid semiconductor stack 50, while the fins 52B are formed from both the hybrid semiconductor stack 50 (i.e., from FIGS. 3D, 5B, and 7B) and the non-hybrid semiconductor stack 50 (i.e., from FIGS. 2B, 4D, and 6B). Thus, although the illustrated embodiments include the hybrid configuration, it is done so merely for the sake of simplicity, and it should be understood that the fins 52B may be substituted for the fins 52A (or vice versa) for the non-hybrid configurations.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

The processes of FIGS. 9 through 14B apply to each of the embodiments. As such, the details of the fins 52A and fins 52B are omitted for the sake of simplicity. In FIGS. 9 through 14B, processes associated with the second stage as noted above are performed, i.e., dummy gate stacks are formed over the fins 52.

Figure 9:
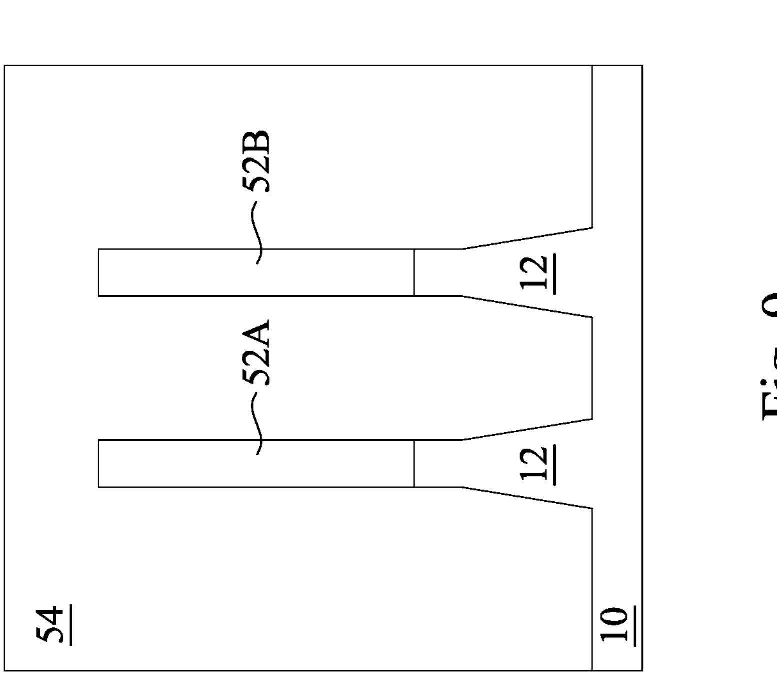

In FIG. 9, an insulation material 54 is formed over the substrate 10 and between neighboring fins 52A and 52B. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 10 and the fins 52. Thereafter, a fill material, such as those discussed above may be formed over the liner.

Figure 10:
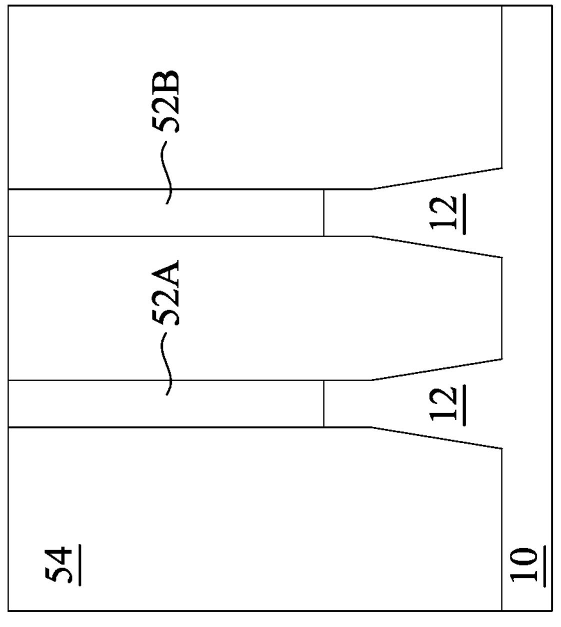
FIGS. 9, 10, 11, 12, 13A, 13B, 14A, and 14B illustrate various cross-sectional views of intermediate steps in the formation of a dummy gate structure, in accordance with various embodiments.

In FIG. 10, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 11:
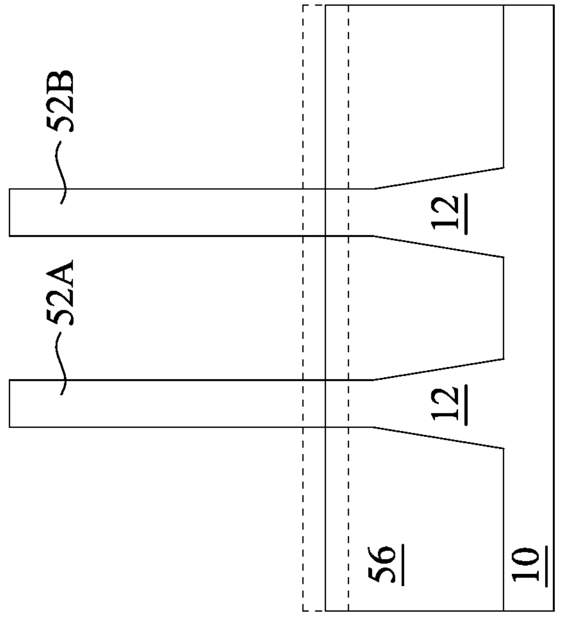

In FIG. 11, the insulation material 54 is recessed to form Shallow Trench Isolation (STI) regions 56. The insulation material 54 is recessed such that the fins 52 protrude from between neighboring STI regions 56. The STI regions 56 may have upper surfaces which are level with the upper surfaces of the lower fins 12, or, as illustrated in dashed lines, upper surfaces which are above or below the upper surfaces of the lower fins 12, or a combination thereof. Further, the upper surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2A through 11 is just one example of how the fins 52 may be formed. In some embodiments, the fins may be formed by a different epitaxial growth process. For example, a dielectric layer can be formed over a top surface of the substrate 10, and trenches can be etched through the dielectric layer to expose the underlying substrate 10. Heteroepitaxial structures can be epitaxially grown in the trenches, layer by layer, and the dielectric layer can be recessed such that the heteroepitaxial structures protrude from the dielectric layer to form the fins 52. Additionally, in some embodiments, the lower fins 12 may be formed and then the semiconductor layers selectively epitaxially grown on upper surfaces of the lower fins 12 and then each successive semiconductor layer, for example, by blocking the area of the substrate 10 surrounding the upper surface of the lower fin 12 with, for example, a masking structure and then exposing an upper surface of the lower fin 12, for example through a trench etched through the masking structure. The masking structure may be a dielectric material which is then recessed to form the STI regions 56, the lower fin 12 and grown semiconductor layers forming the fins 52.

As noted above, the semiconductor layers of the fins 52 may be in situ doped during growth, which may obviate prior and subsequent implantations although in situ and implantation doping may be used together. In some embodiments, implantation may be used instead of or in addition to in situ doping for one or more of the semiconductor layers 14, 20, 30, or 40. In particular, the PFET semiconductor layers 14 and/or 20 may be implanted after growing with n-type impurities, such as those described above, and the NFET semiconductor layers 30 or 40 may be implanted after growing with p-type impurities, such as those described above. After the implants of the n-type impurities and/or p-type impurities, an anneal may be performed to repair implant damage and to activate the p-type and/or n-type impurities that were implanted.

Figure 12:
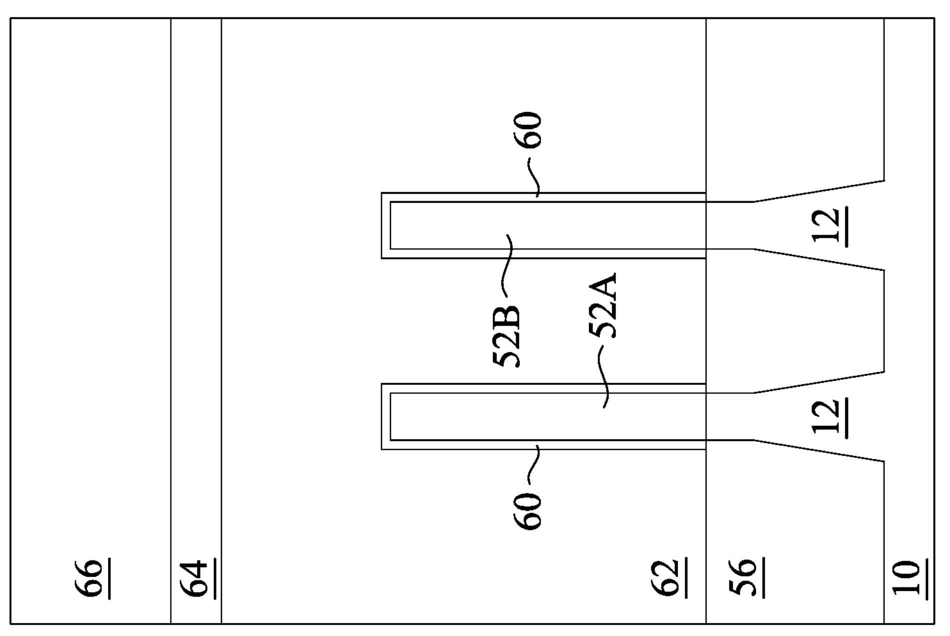
Figure 13B:
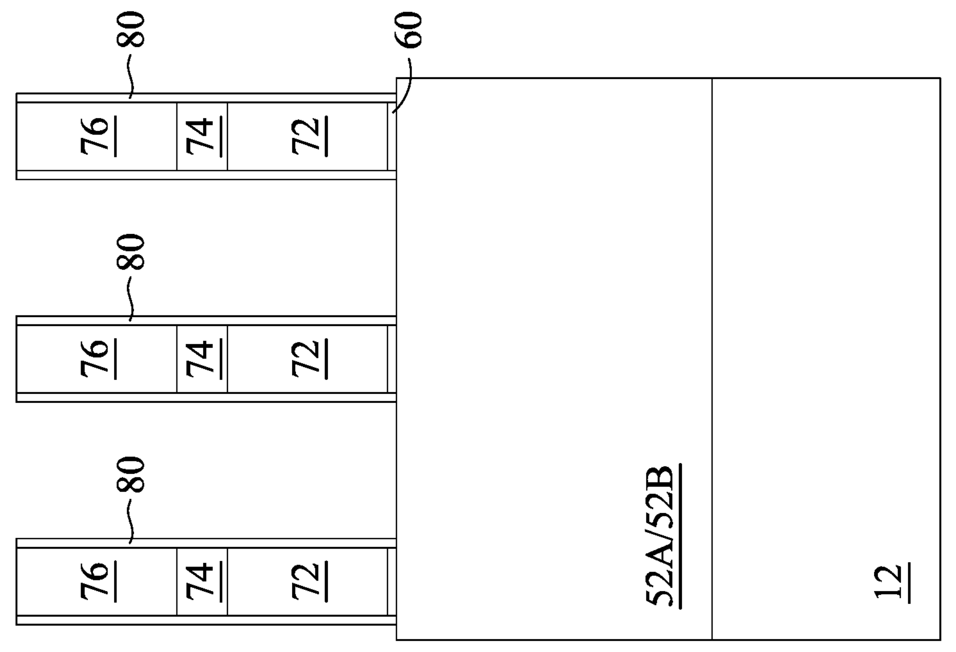

In FIG. 12, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, a pad layer 64 is formed over the dummy gate layer 62, and a mask layer 66 is formed over the pad layer 64. The dummy gate layer 62 may be deposited over the dummy dielectric layer 60 and then planarized, such as by a CMP. The pad layer 64 may be deposited over the dummy gate layer 62, though in some embodiments the pad layer 64 may be omitted. The mask layer 66 may be deposited over the pad layer 64. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The pad layer 64 may include one or more layers of, for example, silicon oxide, silicon carbide, silicon oxycarbide, or the like, and may be deposited by PVD, CVD, sputter, or other deposition techniques. The mask layer 66 may include one or more layers of, for example, silicon nitride, silicon oxynitride, or the like. In this example, a single dummy gate layer 62, a single pad layer 64, and a single mask layer 66 are formed over each of the fins 52A and fins 52B across the workpiece. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

Figure 13A:
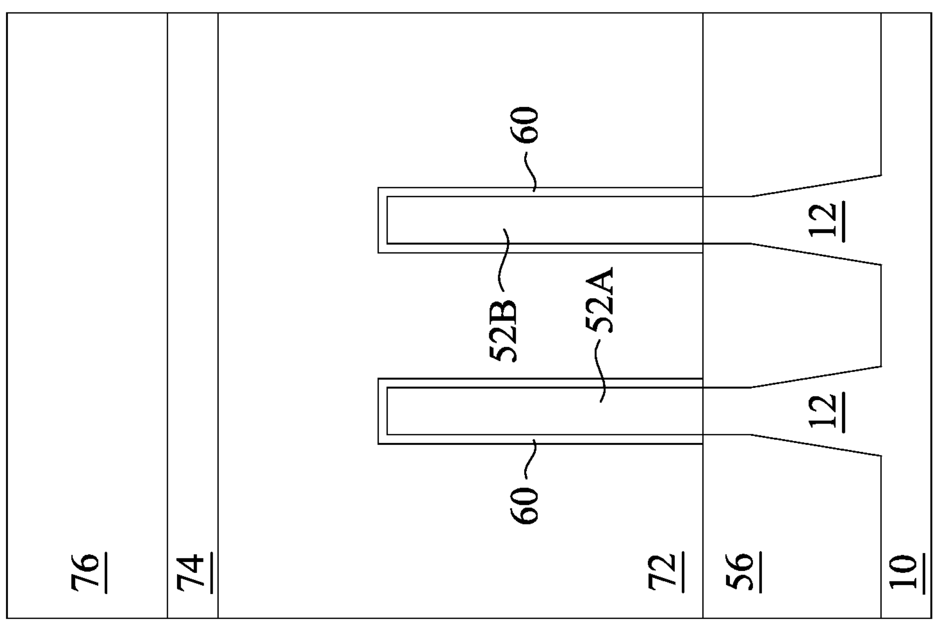
Figure 14B:
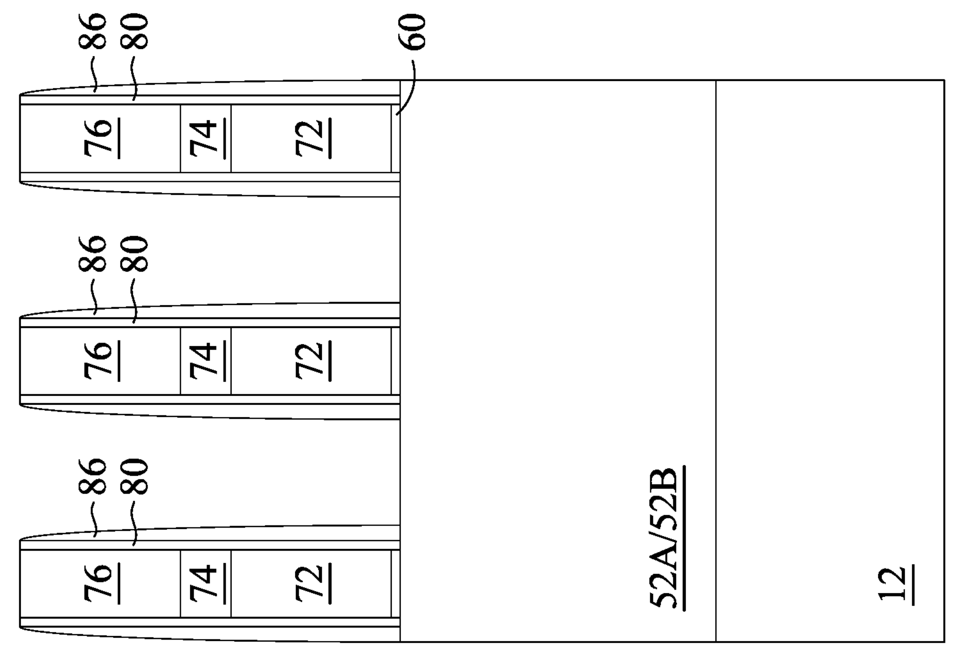

In FIGS. 13A and 13B, the mask layer 66 (see FIG. 12) may be patterned using acceptable photolithography and etching techniques to form masks 76. The pattern of the masks 76 then may be transferred to the pad layer 64 to form the pad layers 74 and to the dummy gate layer 62 to form the dummy gates 72. In some embodiments, the pattern of the masks 76 may also be transferred to the dummy dielectric layer 60 by an acceptable etching technique. In other embodiments, the dummy dielectric layer 60 may continue to extend along an upper surface of the fins 52 between adjacent dummy gates 72. The dummy gates 72 cover respective channel regions of the fins 52. The pattern of the masks 76 may be used to physically separate each of the dummy gates 72 from adjacent dummy gates. The dummy gates 72 may also have a lengthwise direction substantially perpendicular to the lengthwise direction of respective fins 52.

Further in FIGS. 13A and 13B, gate seal spacers 80 can be formed on exposed surfaces of the dummy gates 72, the pad layer 74, and the masks 76, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

Figure 14A:
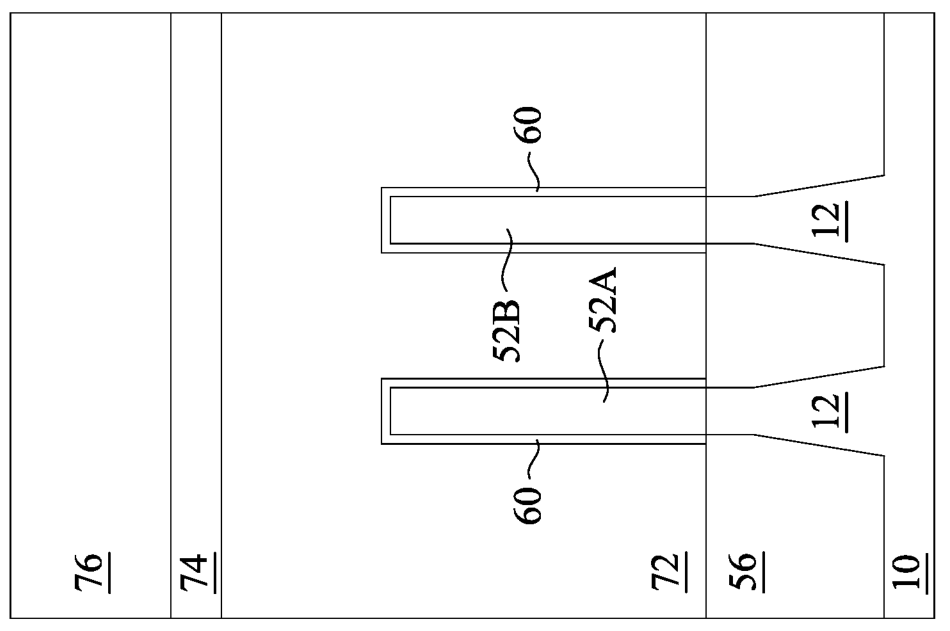

In FIGS. 14A and 14B, gate spacers 86 are formed on the gate seal spacers 80 along sidewalls of the dummy gates 72, the pad layer 74, and the masks 76. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like).

FIGS. 15A through 35D illustrate the third stage noted above, including a process of forming epitaxial source/drain regions 92 and 98 for each of the embodiments discussed above. FIGS. 15A, 15B, 16A, 16B, 17A, 17B, 18A, 18B, 19A, 19B, 19C, 19D, 21A, 21B, 22A, 22B, 23A, 23B, 23C, 24A, 24B, 24C, and 24D illustrate continuing processes on the structure of FIGS. 14A and 14B for embodiments consistent with those originating from FIGS. 2B and 3D. FIGS. 25A, 25B, 26A, 26B, 26C, 26D, 27A, 27B, 28A, 28B, 29A, 29B, 30A, 30B, 30C, and 30D illustrate continuing processes on the structure of FIGS. 14A and 14B for embodiments consistent with those originating from FIGS. 4D and 5B. FIGS. 31A, 31B, 32A, 32B, 33A, 33B, 34A, 34B, 35A, 35B, 35C, and 35D illustrate continuing processes on the structure of FIGS. 14A and 14B for embodiments consistent with those originating from FIGS. 6B and 7B.

Figure 15B:
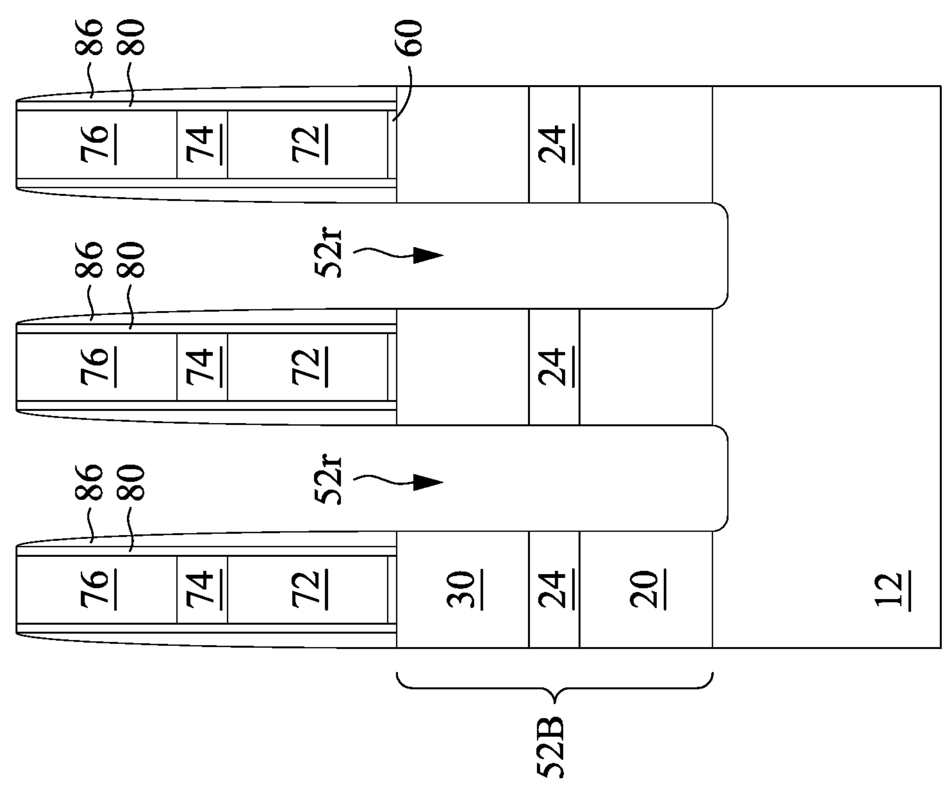
FIGS. 15A, 15B, 16A, 16B, 17A, 17B, 18A, 18B, 19A, 19B, 19C, 19D, 20A, 20B, 20C, 20D, 20E, 20F, 21A, 21B, 21C, 21D, 21E, 21F, 21G, 21H, 22A, 22B, 23A, 23B, 23C, 24A, 24B, 24C, and 24D illustrate various cross-sectional views of intermediate steps in the formation of source/drain regions in accordance with some embodiments.
Figure 15A:
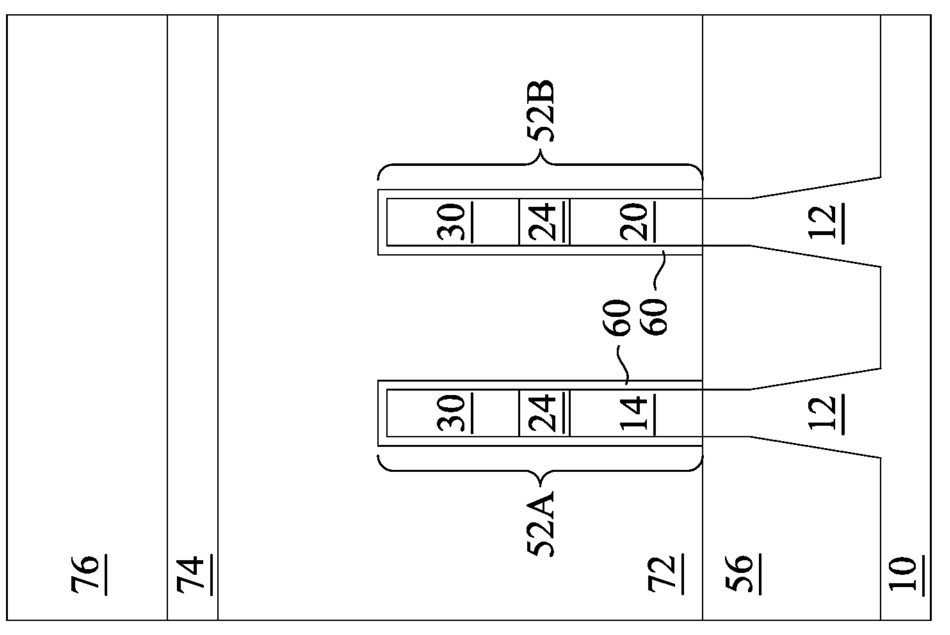

In FIGS. 15A and 15B, recesses **52*r* are formed in the fins 52. The recesses 52*r* may be formed by a suitable etching process, such as an anisotropic etch, for example, by forming a photomask over portions of the workpiece that should not be etched, and then etching the recesses 52*r* in the fin 52 between the dummy gate structures. As illustrated in FIG. 15B, in some embodiments the recesses 52*r* may protrude into the lower fin 12. In some embodiments, the recesses 52*r* may be etched using a self-aligning technique, e.g., by using the dummy gate structures as masks for etching the recesses 52*r*. The remaining portions of the semiconductor layer 20, the semiconductor layer 14, and the semiconductor layer 30** are subsequently used as channel regions for the PFETs and NFETs.

Figure 16B:
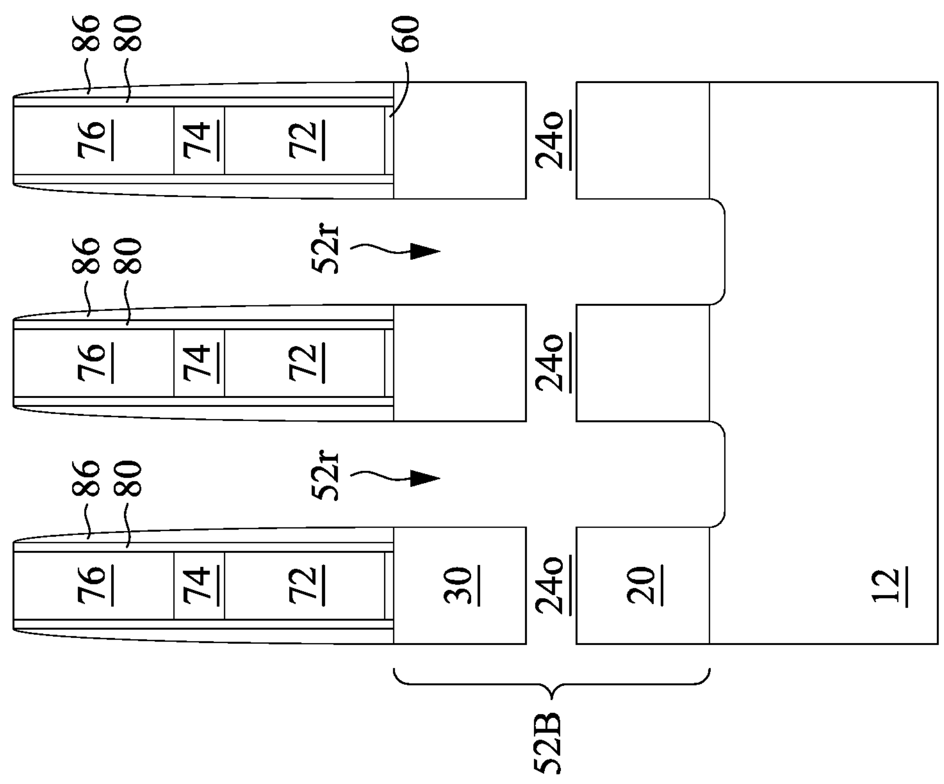
Figure 16A:
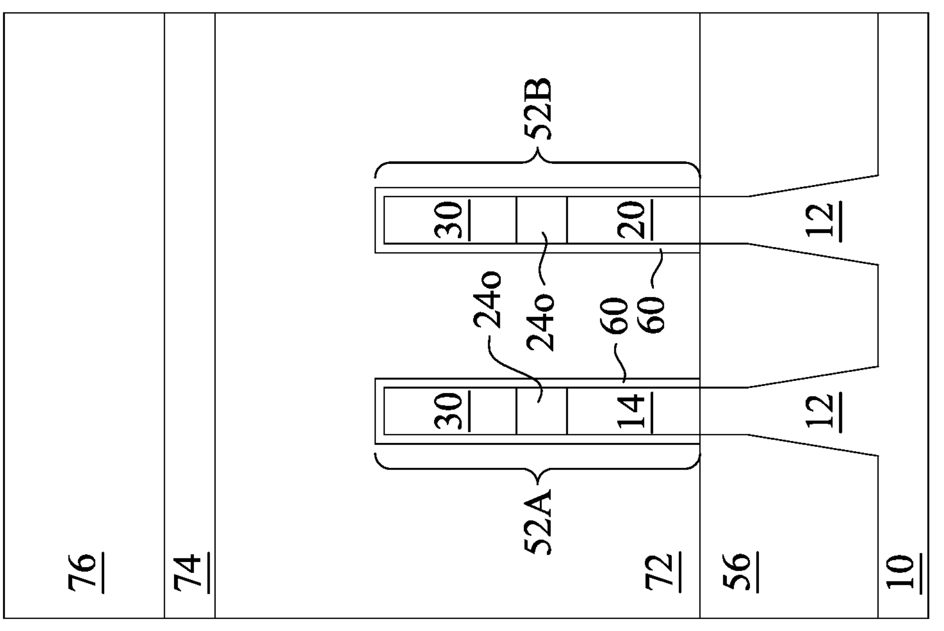

In FIGS. 16A and 16B, an etching process may be used in the recesses **52*r* to remove the semiconductor layer 24 to form openings 24*o* between the semiconductor layer 20 and the semiconductor layer 30 and/or between the semiconductor layer 14 and the semiconductor layer 30. Due to the high germanium content of the semiconductor layer 24, the semiconductor layer 24 may be selectively removed without overly damaging the semiconductor layers 14, 20, and 30**. In some embodiments, the etching process may be a wet etch using suitable etchants.

Figure 17B:
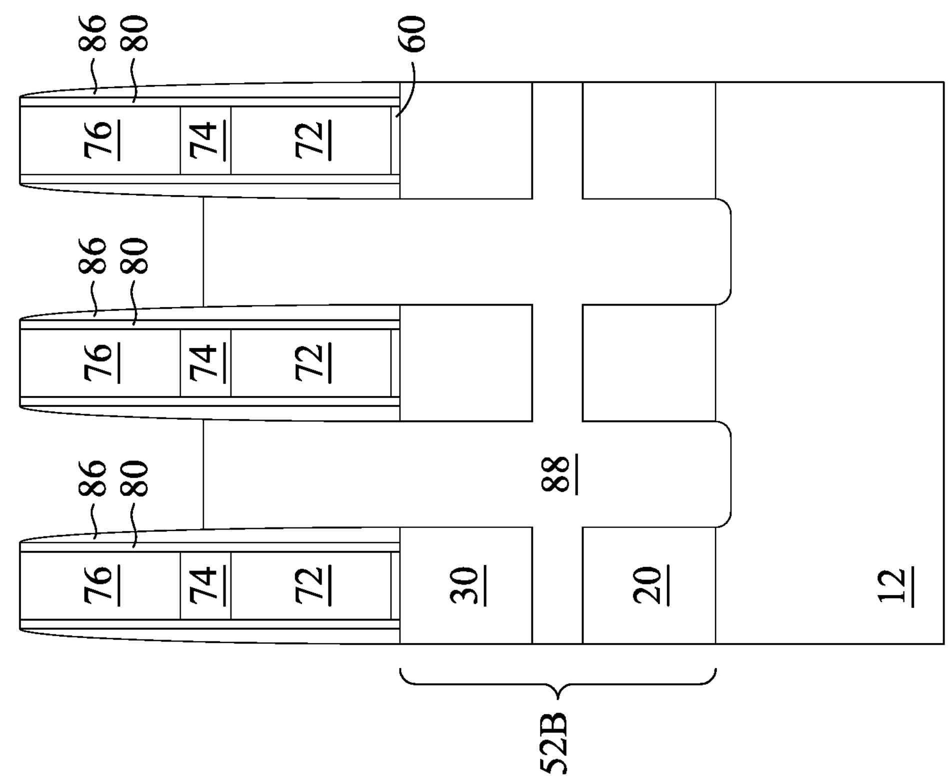
Figure 17A:
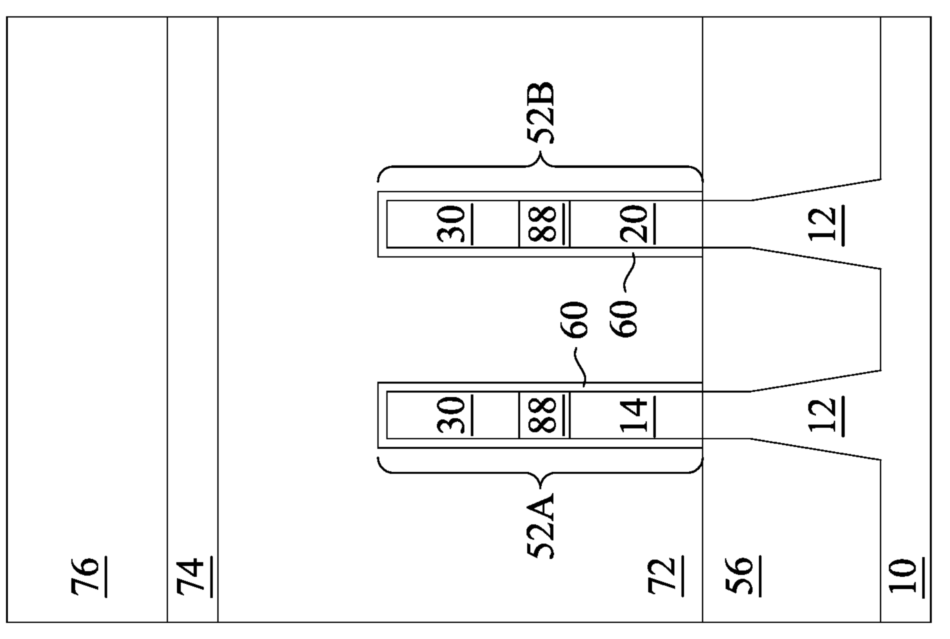

In FIGS. 17A and 17B, an insulating material 88 is formed in the recesses **52*r* and in the openings 24*o*. The insulating material 88 may be any suitable material, such as silicon oxide, silicon nitride, silicon oxynitride, silicon carbide, silicon oxycarbonitride, the like, or combinations thereof. The insulating material 88 may be deposited by any suitable deposition technique, such as by CVD, flowable CVD, spin-on, sputtering, PVD, ALD, the like, or combinations thereof. In some embodiments the insulating material 88** may have upper surfaces which are higher than upper surfaces of the dummy gate stacks.

Figure 18B:
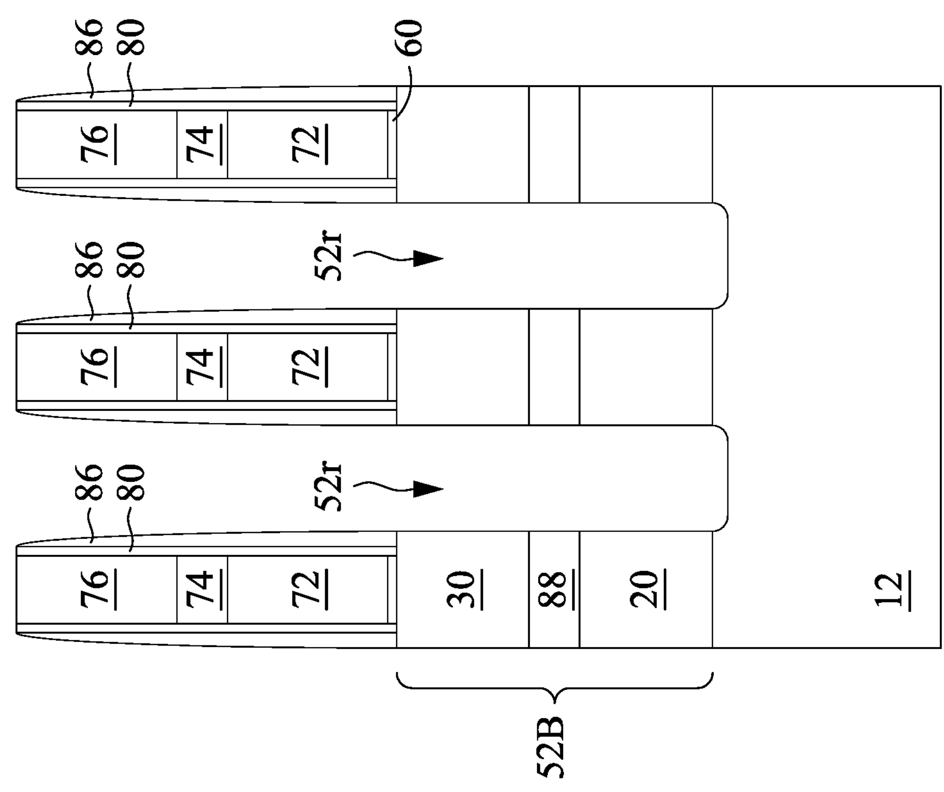
Figure 18A:
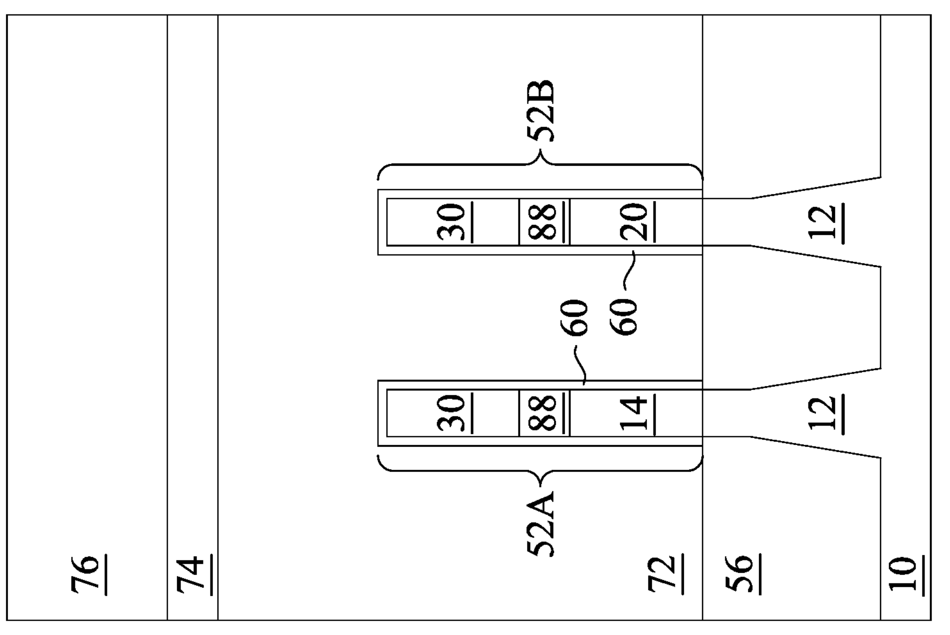

In FIGS. 18A and 18B, the recesses 52*r* are formed again, for example, by an anisotropic etch, such as described above, to remove the insulating material 88 in the recesses 52*r*, but leaving the insulating material 88 in the openings 24*o* (see FIGS. 17A and 17B).

In FIGS. 19A, 19B, 19C, and 19D epitaxial source/drain regions 92 are formed in the recesses 52*r* in the fins 52. The epitaxial source/drain regions 92 are formed in the fins 52 such that each dummy gate 72 is disposed between respective neighboring pairs of the epitaxial source/drain regions 92. In some embodiments, the gate spacers 86 are used to separate the epitaxial source/drain regions 92 from the dummy gates 72 by an appropriate lateral distance so that the epitaxial source/drain regions 92 do not short out subsequently formed gates of the resulting FinFETs. Materials of the epitaxial source/drain regions 92 may be selected to exert stress in the respective channel regions, thereby improving performance.

Figure 19B:
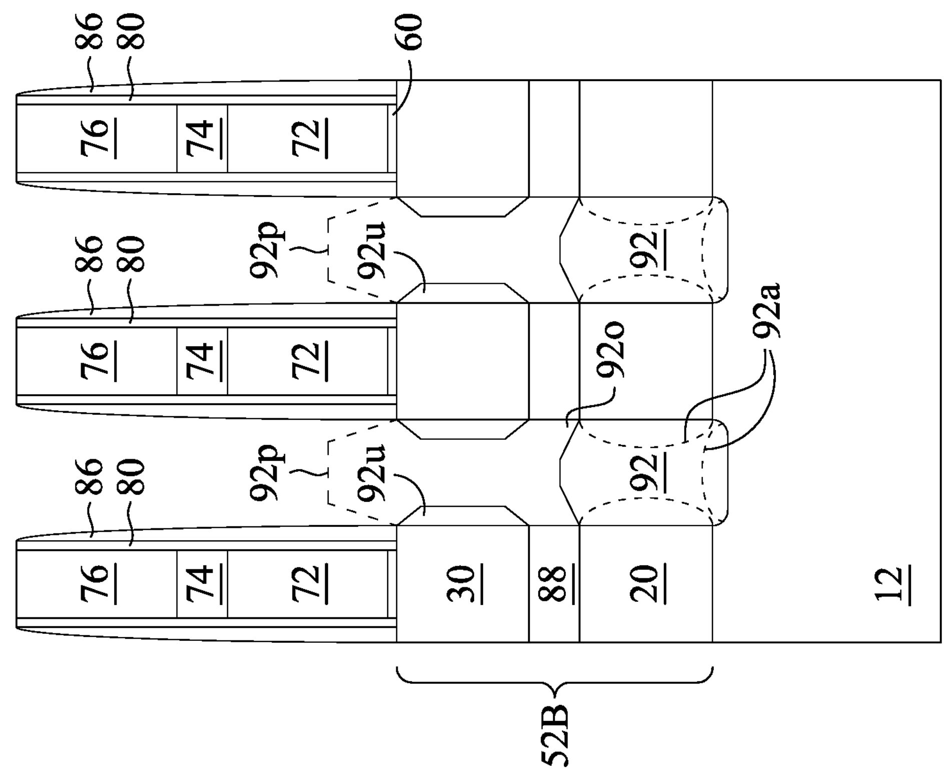
Figure 19A:
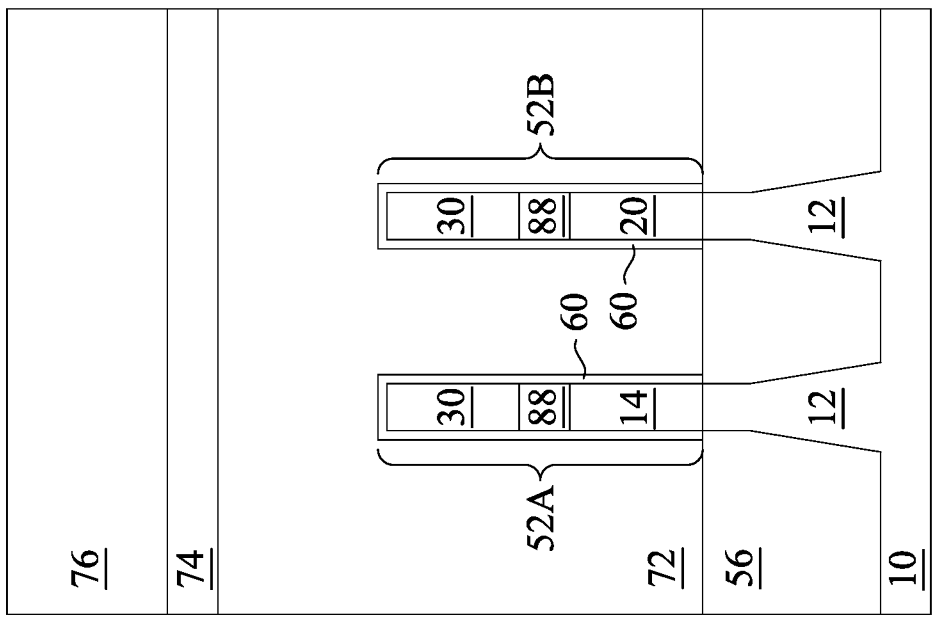

The epitaxial source/drain regions 92 for the PFET may be formed by epitaxially growing a semiconductor material of the epitaxial source/drain regions 92 from the lower fin 12 and from the ends of the semiconductor layer 20 and/or semiconductor layer 14 until they meet and merge together. Because the semiconductor layer 30 is also exposed, an upper portion 92*u* of the epitaxial source/drain regions 92 may also grow from the exposed ends of the semiconductor layer 30. The growth surface of the upper portion 92*u* may be less than the lower portion so that it grows more slowly than the lower portion, so that when the lower portion of the epitaxial source/drain region 92 is completed, the upper portion 92*u* is smaller than the lower portion. In some embodiments, the lower portion of the epitaxial source/drain region 92 has a volume which is between 20% and 60% greater than the volume of the upper portion 92*u*. In some embodiments, the upper portions 92*u* may also meet and merge together, while in other embodiments, such as illustrated in FIG. 19B, the upper portions 92*u* may not merge together. The dashed lines 92*p* extending above the upper portion 92*u* illustrate an example where growth is allowed to continue until the entire recess 52*r* is filled with the merged epitaxial source/drain region 92. The dashed lines for the bottom portion 92*a* and two side portions 92*a* in the lower portion of the epitaxial source/drain regions 92 show, as an example, approximately where the epitaxial source/drain regions 92 may be at an intermediate stage of the growth process. At such a stage, a gap may exist between the two sides of the epitaxial source/drain regions 92 until they finally meet and grow together. As such, where the two side portions of the epitaxial source/drain regions 92 meet, a vertical seam may be observed. Similarly, where the upper surface of the bottom portion 92*a* of the epitaxial source/drain regions 92 meet the bottoms of the two side portions 92*a*, another seam may be observed.

The epitaxial source/drain regions 92 may include any acceptable material, such as appropriate for p-type FinFETs. For example, the epitaxial source/drain regions 92 may comprise materials exerting a compressive strain in the channel region corresponding to the semiconductor layer 20, such as silicon-germanium, boron doped silicon-germanium, germanium, germanium tin, or the like. The epitaxial source/drain regions 92 may have surfaces raised from respective surfaces of the fins 52 and may have facets.

The epitaxial source/drain regions 92 may be implanted with p-type impurities to improve the electrical function of the resulting PFET, followed by an anneal to repair and activate the dopants. The source/drain regions may have an impurity concentration of between about $10^{19}$ $cm^{-3}$ and about $10^{21}$ $cm^{-3}$. The p-type impurities for epitaxial source/drain regions 92 may be any of the impurities previously discussed. In some embodiments, the epitaxial source/drain regions 92 may be in situ doped during growth. In some embodiments, the anneal may be performed at a later process step. The anneal will activate the impurities by incorporating the impurities into a crystalline lattice, at which time, the seams may be substantially healed and eliminated and a strain may be produced on the channel regions made from the semiconductor layer 14 and/or 20.

Figure 19D:
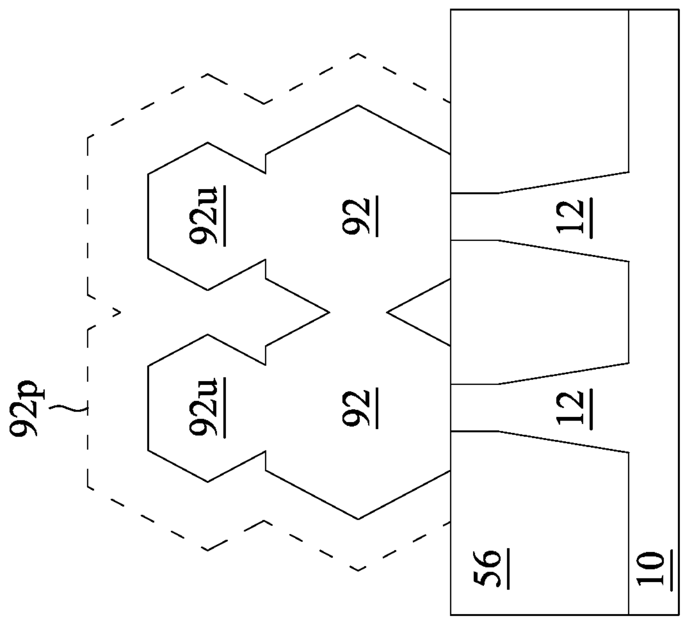
Figure 19C:
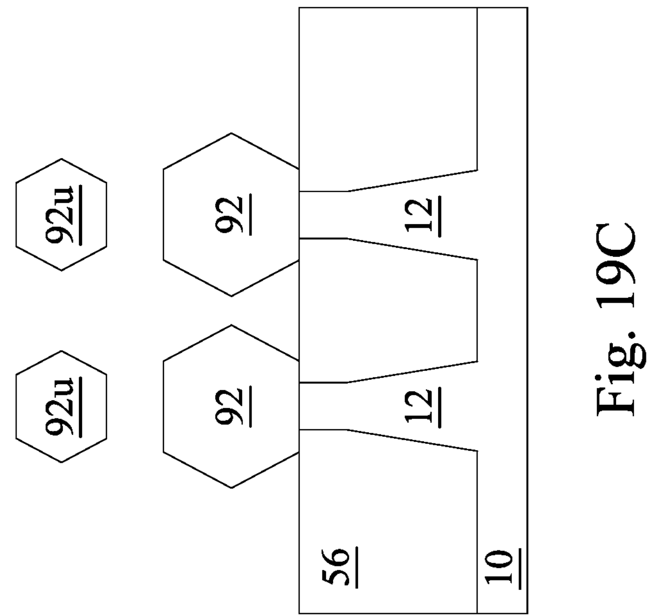

As a result of the epitaxy processes used to form the epitaxial source/drain regions 92, upper surfaces of the epitaxial source/drain regions have facets which expand laterally outward beyond sidewalls of the fins 52. In some embodiments, these facets cause adjacent epitaxial source/drain regions 92 of a same FinFET to merge as illustrated by FIG. 19D. In other embodiments, adjacent epitaxial source/drain regions 92 remain separated after the epitaxy process is completed as illustrated by FIG. 19C. As illustrated in FIGS. 19D, the epitaxial source/drain regions 92 may also merge vertically so that the epitaxial source/drain regions 92 include an upper portion and a lower portion which are merged together. In other embodiments, the upper portion and lower portion may not be merged together, such as illustrated, for example with respect to FIG. 19C. In some embodiments, the gate spacers 86 may cover a portion of the sidewalls of the fins 52 that extend above the STI regions 56 thereby blocking the epitaxial growth from contacting the STI regions 56. In some other embodiments, the spacer etch used to form the gate spacers 86 may be adjusted to remove the spacer material to allow the epitaxially grown region to extend to the surface of the STI region 56.

The epitaxial source/drain regions 92 are formulated for a PFET, e.g., doped with p-type impurities. As such, they are generally unsuitable for use for the NFET which is being formed over the PFET. Therefore, in the next process, the upper portion 92*u* of the epitaxial source/drain regions 92 are removed. For the purposes of illustration, the embodiment illustrated in FIG. 19C is used in illustrating the removal of the upper portion 92*u* of the epitaxial source/drain regions 92, however, it should be understood that any of the illustrated and/or described embodiments may be substituted.

Figure 20B:
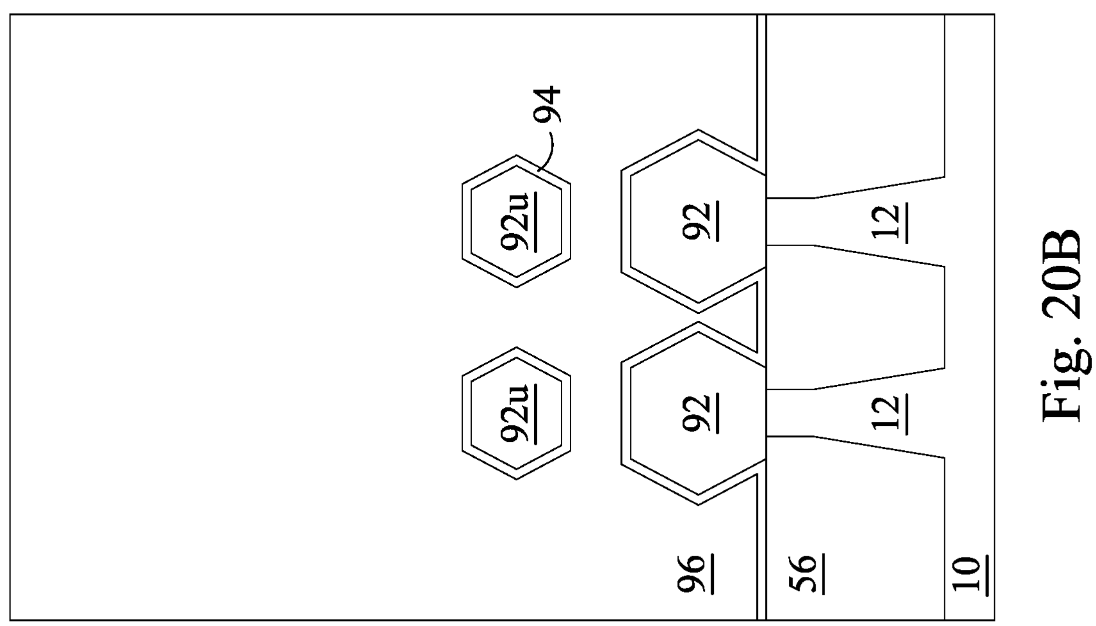
Figure 20A:
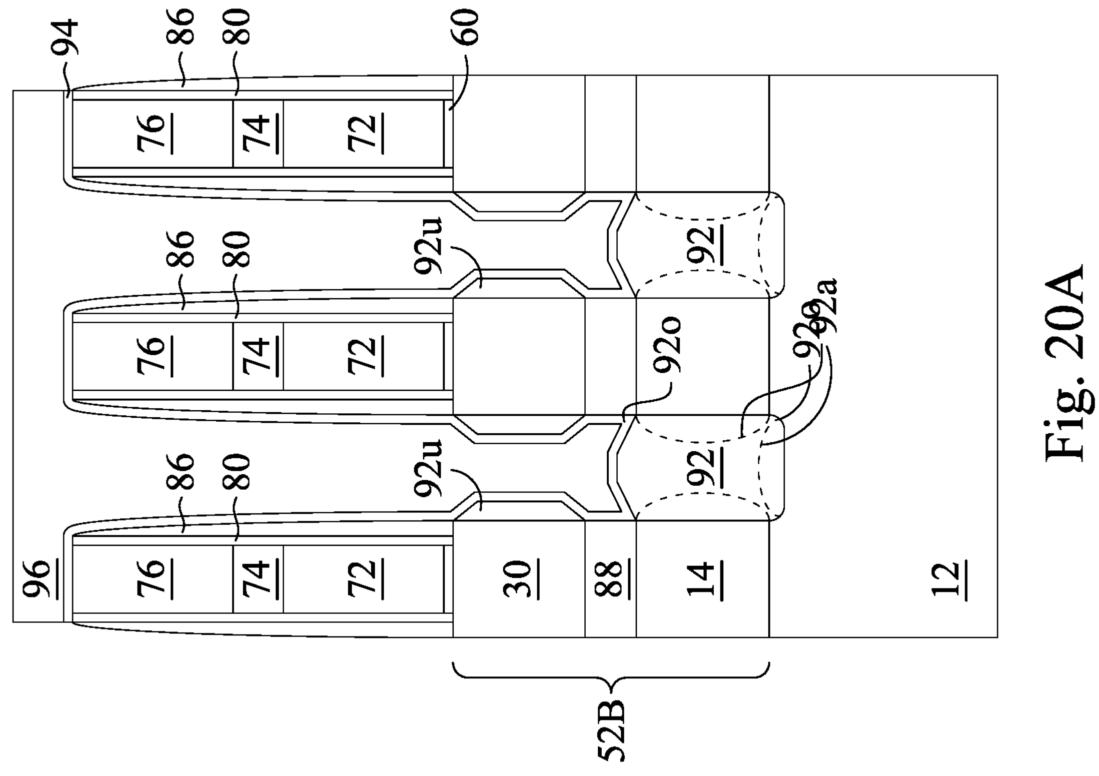

In FIGS. 20A and 20B, an isolation structure 96 is deposited over the structure illustrated in FIG. 19A, 19B, and 19C or 19D. The isolation structure 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a liner layer or etch stop layer 94 is disposed between the isolation structure 96 and the epitaxial source/drain regions 92, the gate stacks, and the gate spacers 86. The liner layer 94 may comprise a dielectric material, such as, silicon nitride, silicon oxide, silicon oxynitride, or the like, having a lower etch rate than the material of the overlying isolation structure 96. In some embodiments, the isolation structure 96 may only partially fill the openings.

Figure 20D:
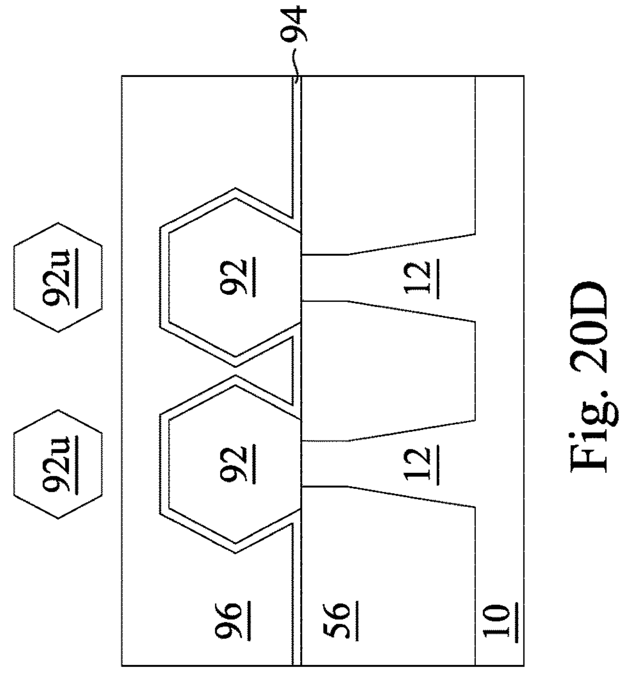
Figure 20C:
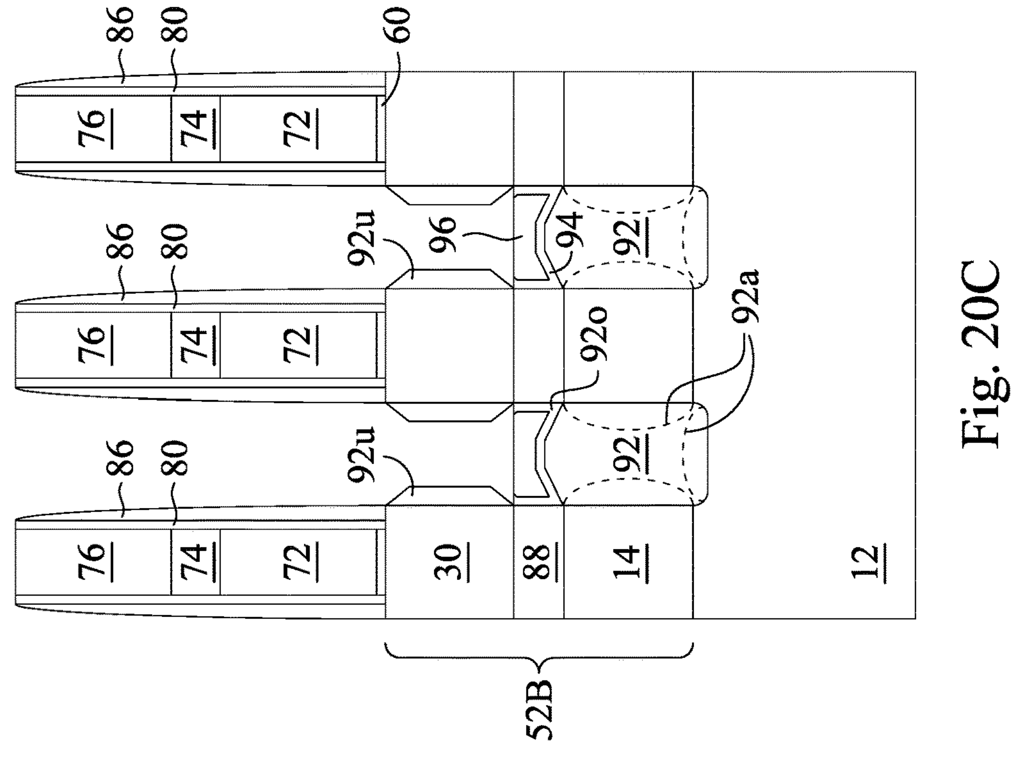

In FIGS. 20C and 20D, the isolation structure 96 and liner layer 94 are recessed so that the upper portion 92*u* of the epitaxial source/drain region s 92 are exposed. The lower epitaxial source/drain regions 92 remain covered by the isolation structure 96. The upper surfaces of the isolation structure 96 and liner layer 94 is illustrated as being in line with the upper surface of the insulating material 88, however, the upper surfaces of the isolation structure 96 and liner layer 94 may be below the upper surface of the insulating material 88.

Figure 20F:
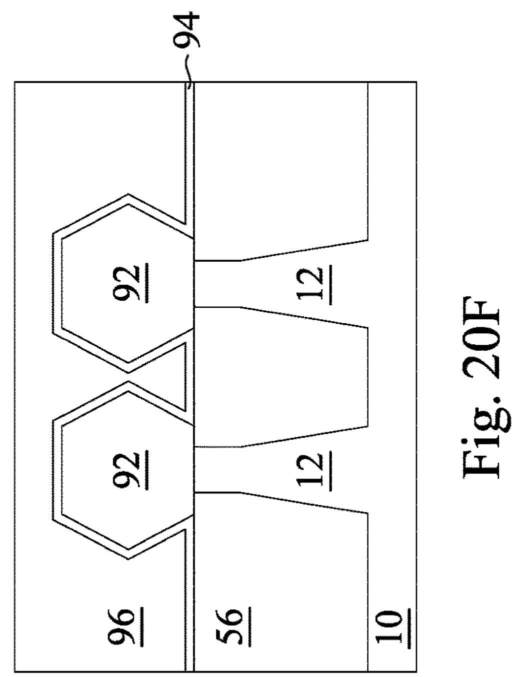
Figure 20E:
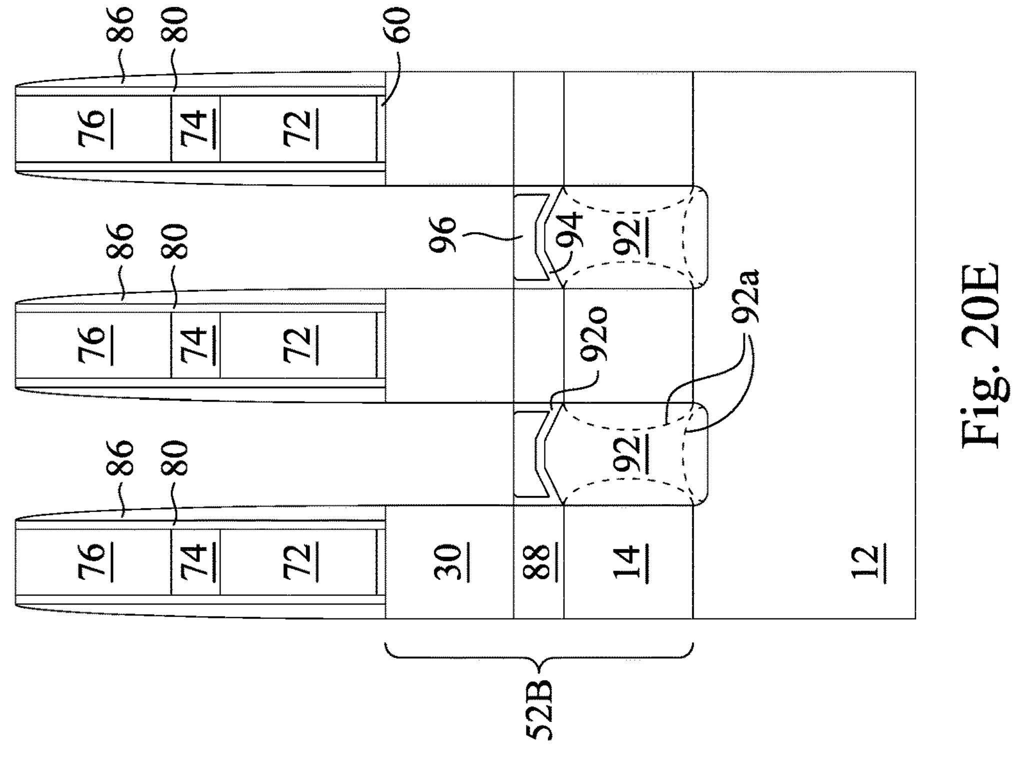

In FIGS. 20E and 20F, the upper portion 92*u* of the epitaxial source/drain regions 92 are removed, for example, by a suitable etching process, such as a wet etch, dry etch, or RIE process. The isolation structure 96 can protect the lower portion of the epitaxial source/drain regions 92 during the etching process.

Figure 21B:
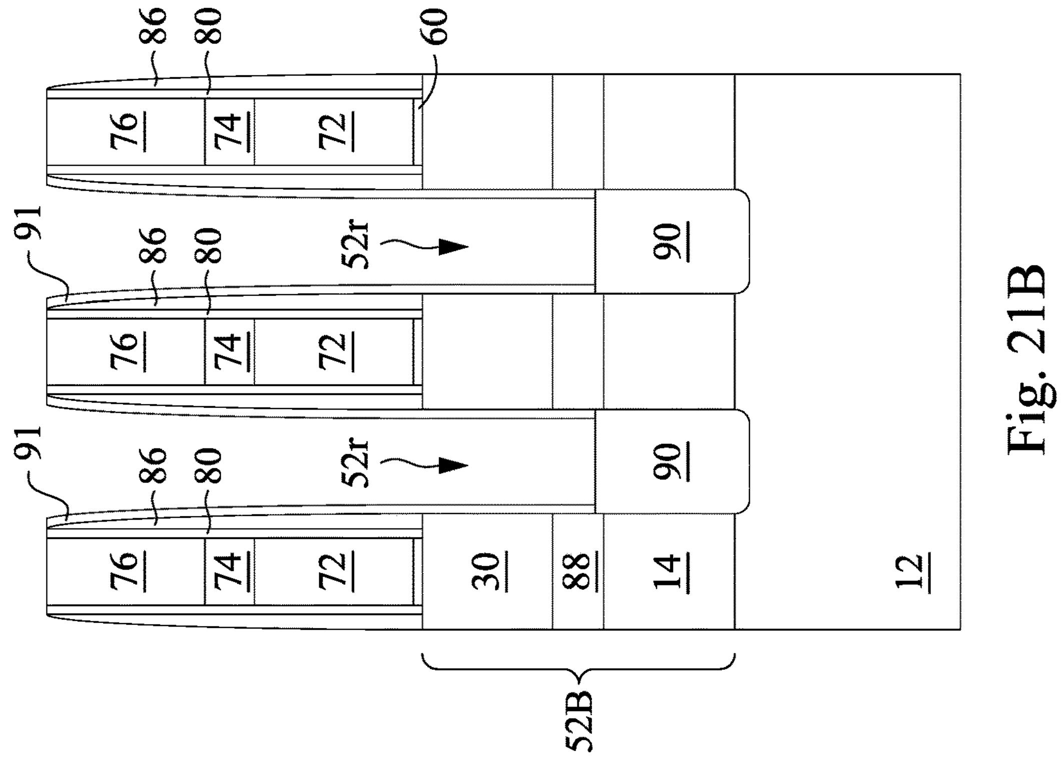
Figure 21A:
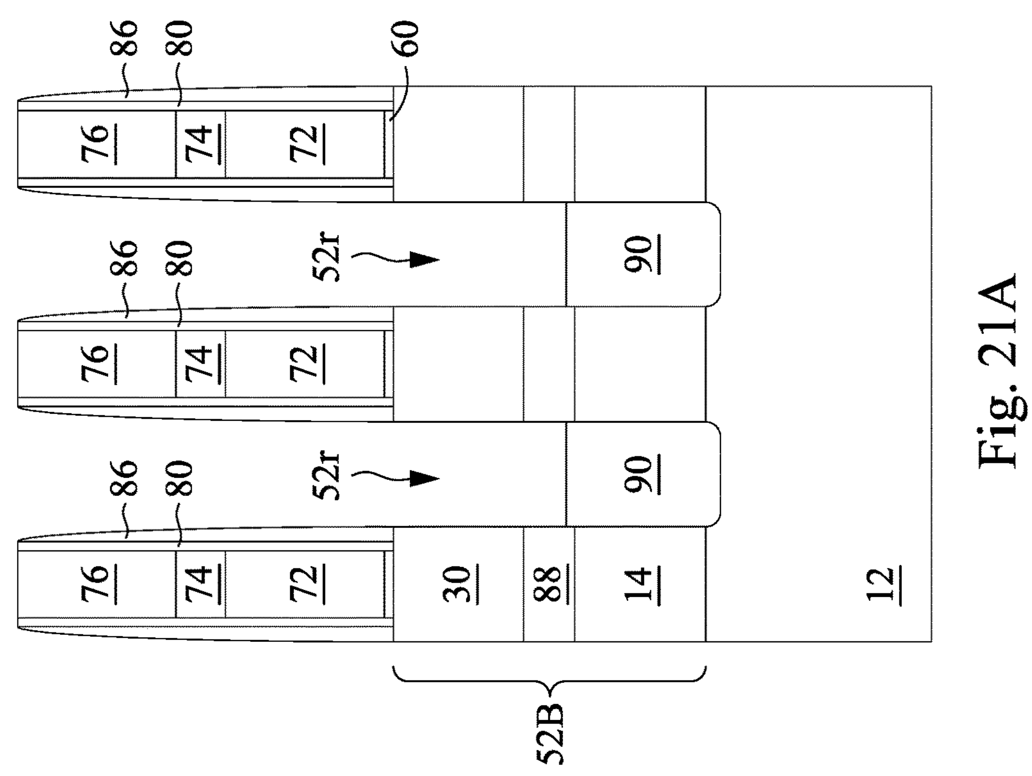

FIGS. 21A-21H illustrate another way of forming the epitaxial source/drain regions 92. FIG. 21A continues the process flow from the structure illustrated in FIG. 18B. In FIG. 21A, a sacrificial dielectric 90 is formed in the lower portions of the recesses 52*r*. The sacrificial dielectric 90 is disposed on the sidewalls of the semiconductor layer 20 (or 14). The sacrificial dielectric 90 may be formed by conformally forming a dielectric material and subsequently recessing the dielectric material. Acceptable dielectric materials may include silicon oxide, silicon nitride, silicon oxynitride, silicon oxycarbonitride, combinations thereof, or the like, which may be formed by a deposition process such as chemical vapor deposition (CVD), atomic layer deposition (ALD), or the like. Other dielectric materials formed by any acceptable process may be used. The dielectric material of the sacrificial dielectric 90 has a high etching selectivity to the dielectric material of the insulating material 88. Any acceptable etch process, such as a dry etch, a wet etch, the like, or a combination thereof, may be performed to recess the dielectric material. The etching may be isotropic, such as an etch-back process that removes the dielectric material from the upper portions of the recesses 52*r*. The dielectric material, when etched, has portions left in the lower portions of the recesses 52*r* (thus forming the sacrificial dielectric 90).

In FIG. 21B, dummy spacers 91 are formed over the sacrificial dielectric 90 and in the upper portions of the recesses 52*r*. The dummy spacers 91 are disposed on the sidewalls of the semiconductor layer 30 and the insulating material 88. The dummy spacers 91 may be formed by conformally forming a dielectric material and subsequently etching the dielectric material. Acceptable dielectric materials may include silicon oxide, silicon nitride, silicon oxynitride, silicon oxycarbonitride, aluminum oxide, combinations thereof, or the like, which may be formed by a deposition process such as chemical vapor deposition (CVD), atomic layer deposition (ALD), or the like. Other dielectric materials formed by any acceptable process may be used. The dielectric material of the dummy spacers 91 has a high etching selectivity to the dielectric materials of the sacrificial dielectric 90 and the insulating material 88. In some embodiments, the dummy spacers 91 and/or the sacrificial dielectric 90 each comprise silicon oxycarbonitride, and an amount of carbon in each of the dummy spacers 91 and the sacrificial dielectric 90 may be selected to tune an etching selectivity of the dummy spacers 91 and/or the sacrificial dielectric 90. Further, although the dummy spacers 91 are each illustrated as a single layer having a uniform material composition, the dummy spacers 91 may have a multilayer structure including different layers of different dielectric materials. Any acceptable etch process, such as a dry etch, may be performed to pattern the dielectric material. The etching may be anisotropic. The etching is selective to the dummy spacers 91 (e.g., selectively etches the material of the dummy spacers 91 at a faster rate than the material of the sacrificial dielectric 90). The dielectric material, when etched, has portions left on the sidewalls of the upper semiconductor layer 30 and the insulating material 88 (thus forming the dummy spacers 91).

Figure 21D:
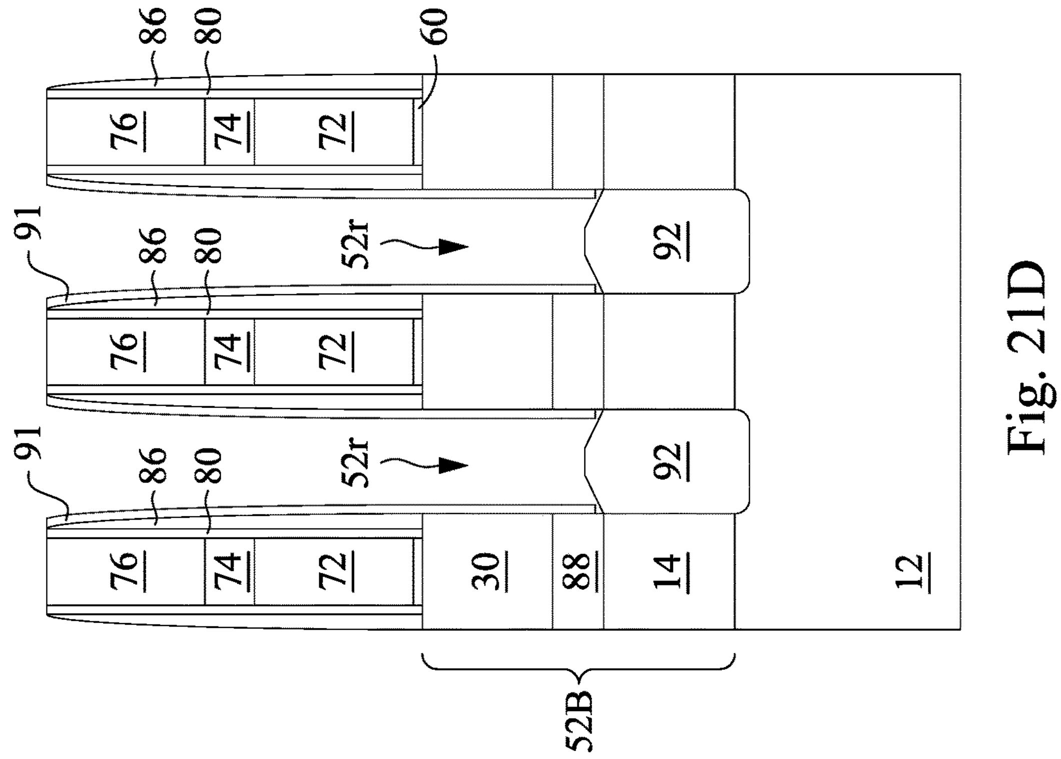
Figure 21C:
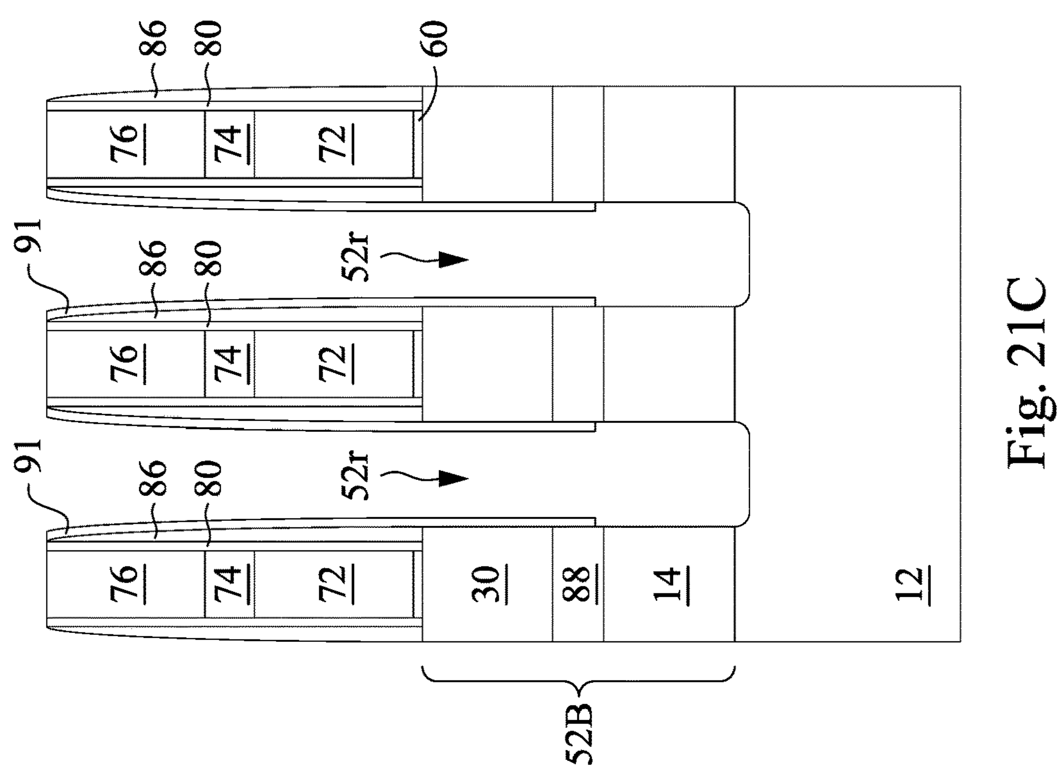

In FIG. 21C, the sacrificial dielectric 90 is removed from the recesses 52*r*. Any acceptable etch process, such as a dry etch, a wet etch, the like, or a combination thereof, may be performed to remove the sacrificial dielectric 90. The etching may be isotropic. The etching is selective to the sacrificial dielectric 90 (e.g., selectively etches the material of the sacrificial dielectric 90 at a faster rate than the materials of the semiconductor layer 20 (or 14) (or 14), dummy spacers 91, and insulating material 88). Removing the sacrificial dielectric 90 exposes the sidewalls of the lower semiconductor layer 20 (or 14), while the sidewalls of the upper semiconductor layer 30 remain covered by the dummy spacers 91. In FIG. 21D, lower epitaxial source/drain regions 92 are formed.

Figure 21F:
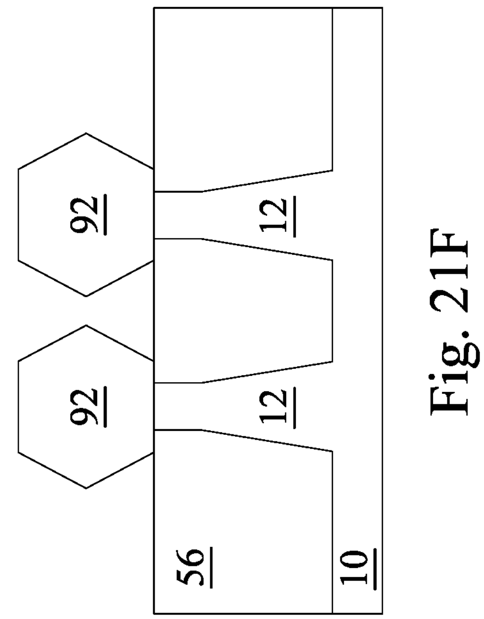
Figure 21E:
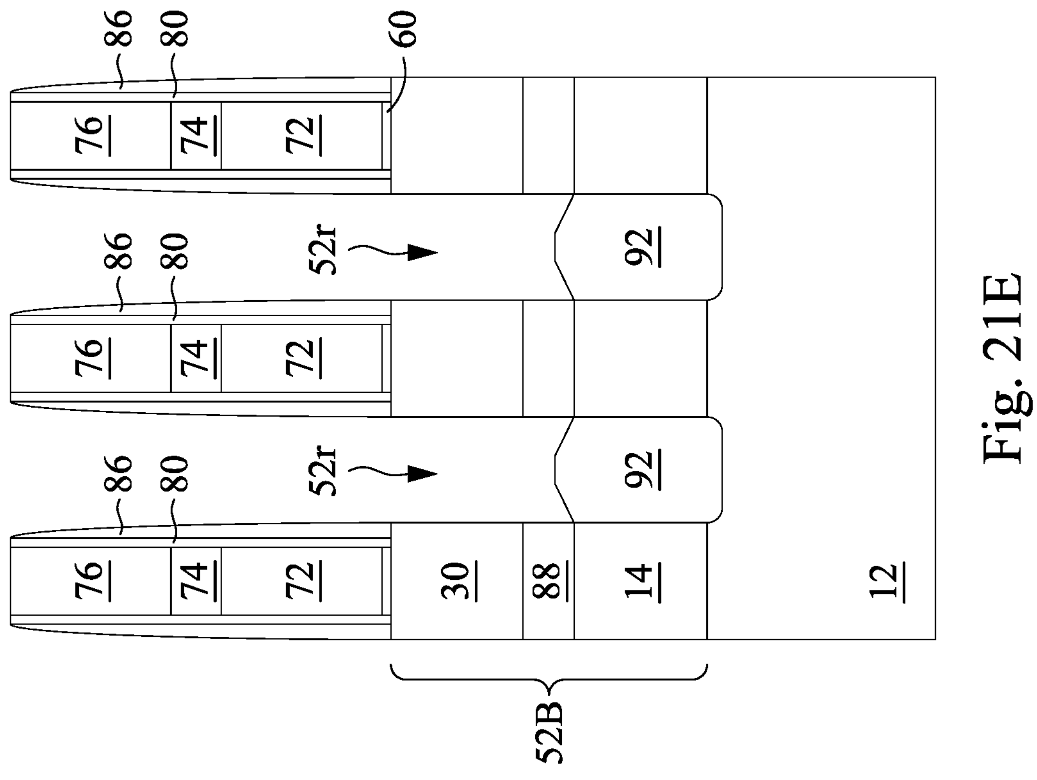

In FIGS. 21E and 21F, the dummy spacers 91 are removed from the recesses 52*r*. Any acceptable etch process, such as a dry etch, a wet etch, the like, or a combination thereof, may be performed to remove the dummy spacers 91. The etching may be isotropic. The etching is selective to the dummy spacers 91 (e.g., selectively etches the material of the dummy spacers 91 at a faster rate than the materials of the lower epitaxial source/drain regions 92 and the insulating material 88). Removing the dummy spacers 91 exposes the sidewalls of the upper semiconductor layer 30.

Figure 21H:
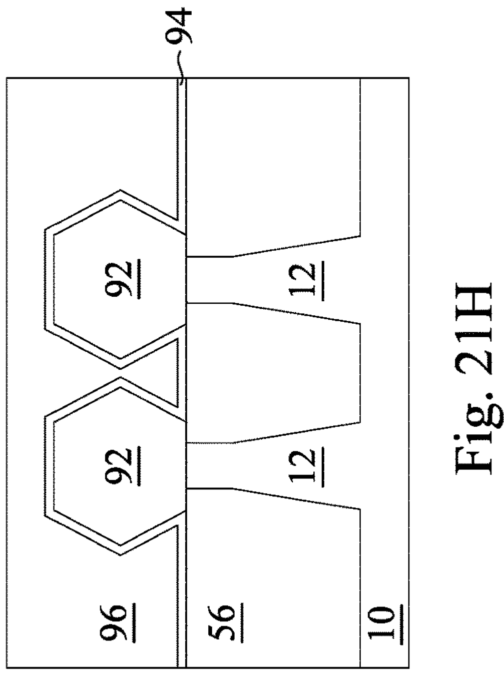
Figure 21G:
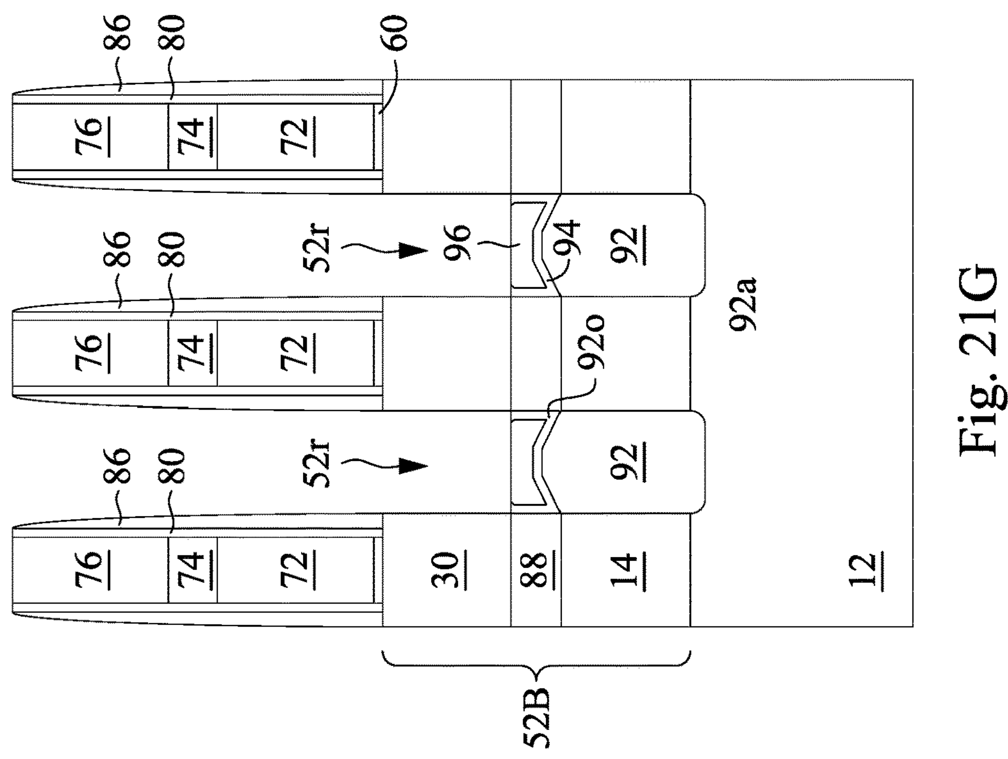

In FIGS. 21G and 21H, an isolation structure 96 and liner layer 94 may be deposited over the lower epitaxial source/drain regions 92 and subsequently recessed so that the sides of the semiconductor layer 30 are exposed. The isolation structure 96 and liner layer 94 may be formed using processes and materials similar to those discussed above. Likewise, the isolation structure 96 and liner layer 94 may be recessed using similar processes as those described above. The epitaxial source/drain regions 92 remain covered by the isolation structure 96. The upper surfaces of the isolation structure 96 and liner layer 94 is illustrated as being in line with the upper surface of the insulating material 88, however, the upper surfaces of the isolation structure 96 and liner layer 94 may be above or below the upper surface of the insulating material 88.

Figure 22B:
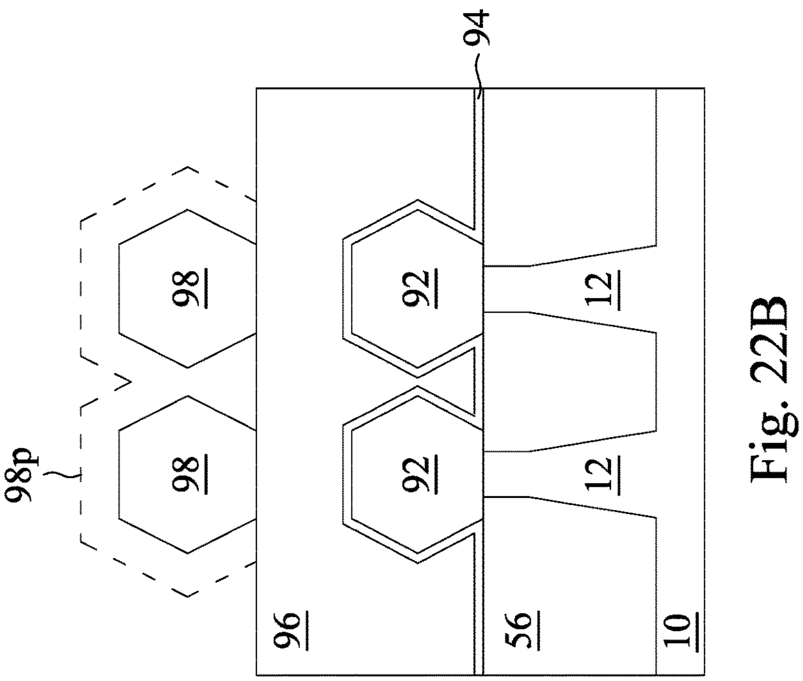
Figure 22A:
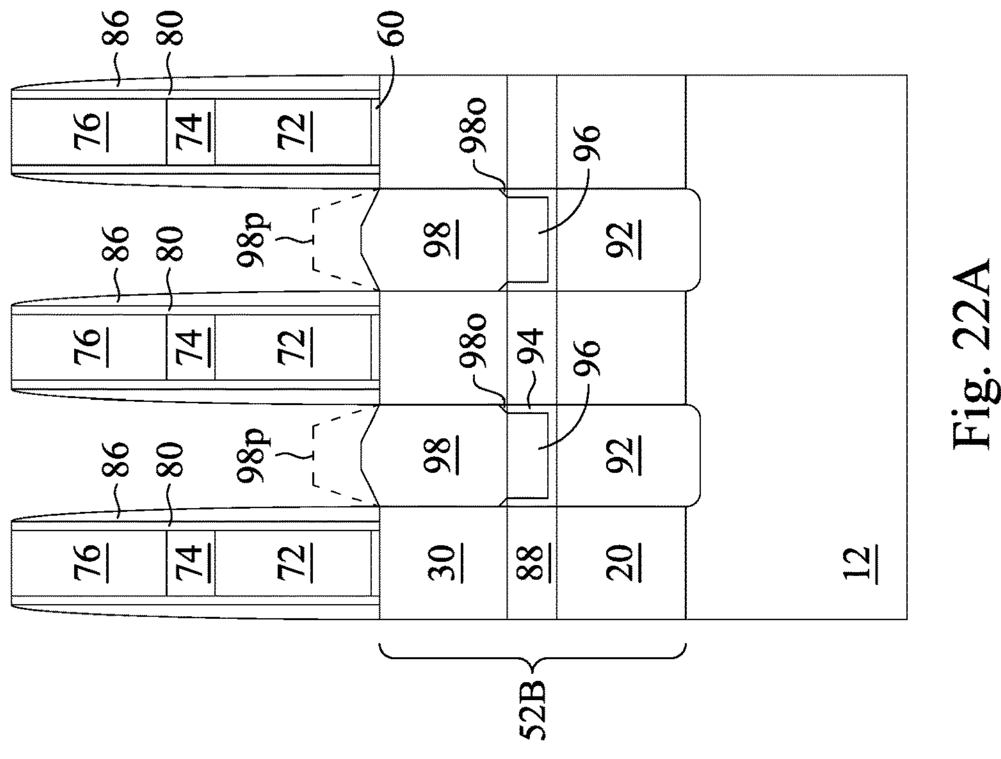

FIGS. 22A and 22B may follow either from the structures in FIGS. 21G and 21H or from the structures in FIGS. 20E and 20F. In FIGS. 22A and 22B, after recessing the isolation structure 96 and the liner layer 94, epitaxial source/drain regions 98 are grown from the channel regions (sidewalls) of the semiconductor layer 30. Illustrations for the lower epitaxial source/drain regions 92 have been simplified. The epitaxial source/drain regions 98 are formed in the fins 52 such that each dummy gate 72 is disposed between respective neighboring pairs of the epitaxial source/drain regions 98. Materials of the epitaxial source/drain regions 98 may be selected to exert stress in the respective channel regions, thereby improving performance.

The epitaxial source/drain regions 98 for the NFET may be formed by epitaxially growing a semiconductor material of the epitaxial source/drain regions 98 from the ends of the semiconductor layer 30 until they meet and merge together. In some embodiments, the epitaxial source/drain regions 98 may also merge together laterally, i.e., with a neighboring epitaxial source/drain region 98, such as illustrated by the dashed lines 98*p*. Where the two side portions of the epitaxial source/drain regions 98 meet, a vertical seam may be observed. An opening 980 may be disposed between the epitaxial source/drain regions 98 and the isolation structure 96, in some embodiments.

The epitaxial source/drain regions 98 may include any acceptable material, such as appropriate for n-type FinFETs. For example, the epitaxial source/drain regions 98 may comprise materials exerting a compressive strain in the channel region corresponding to the semiconductor layer 30, such as silicon, phosphorous doped silicon, or other doped silicon materials, doped with an n-type impurity, or the like. The epitaxial source/drain regions 98 may have surfaces raised from respective surfaces of the fins 52 and may have facets.

The epitaxial source/drain regions 98 may be implanted with n-type dopants to improve the electrical function of the resulting NFET, followed by an anneal. The epitaxial source/drain regions 98 may have an impurity concentration of between about $10^{19}$ $cm^{-3}$ and about $10^{21}$ $cm^{-3}$. The n-type impurities for source/drain regions may be any of the impurities previously discussed. In some embodiments, the epitaxial source/drain regions 98 may be in situ doped during growth. In some embodiments, the anneal may be performed at a later process step. The anneal will activate the impurities by incorporating the impurities into a crystalline lattice, at which time, the seams may be substantially healed and eliminated and a strain may be produced on the channel regions made from the semiconductor layer 30.

As a result of the epitaxy processes used to form the epitaxial source/drain regions 98, upper surfaces of the epitaxial source/drain regions have facets which expand laterally outward beyond sidewalls of the fins 52. In some embodiments, these facets cause adjacent source/drain regions 98 of a same FinFET to merge as illustrated by the dashed lines 98*p*. In other embodiments, adjacent source/drain regions 98 remain separated after the epitaxy process is completed as illustrated by FIG. 22B.

Figure 23B:
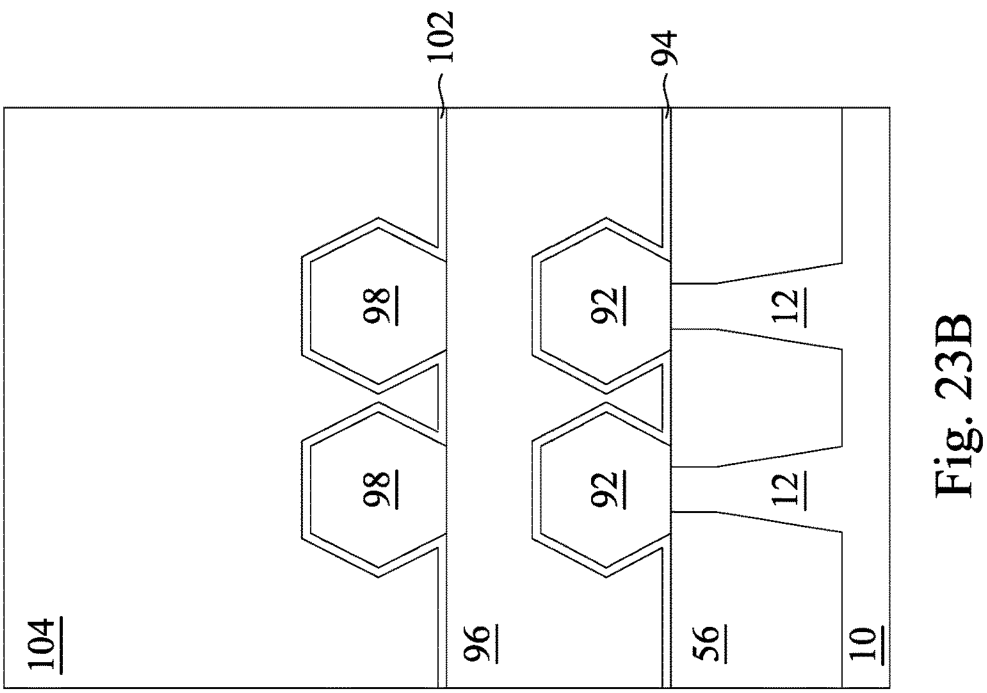
Figure 23A:
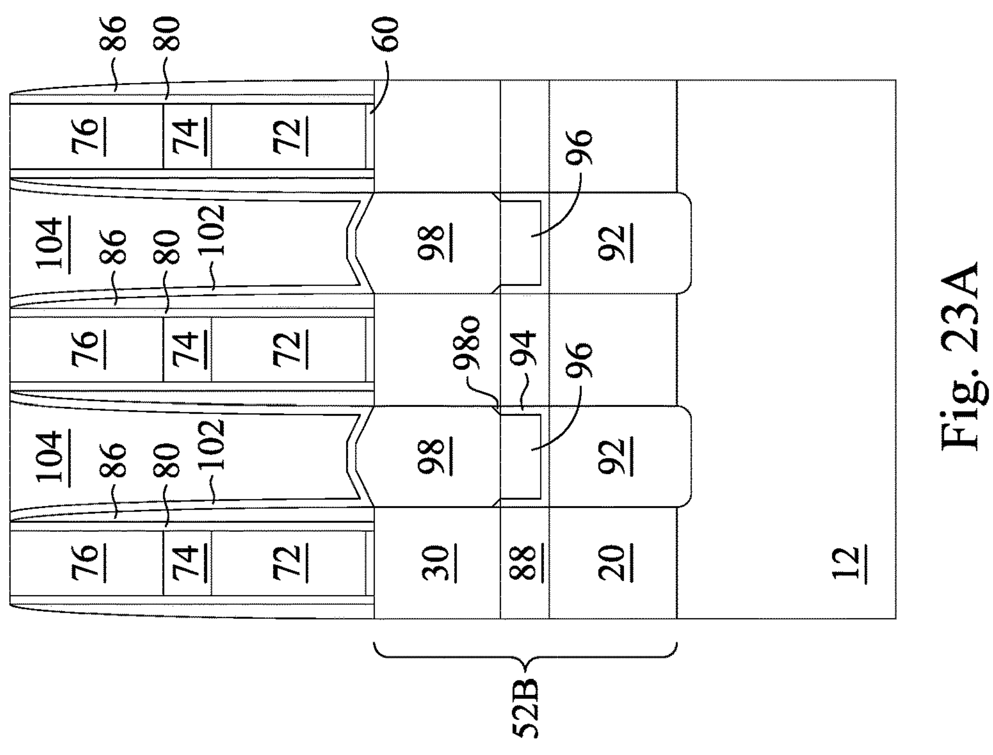
Figure 23C:
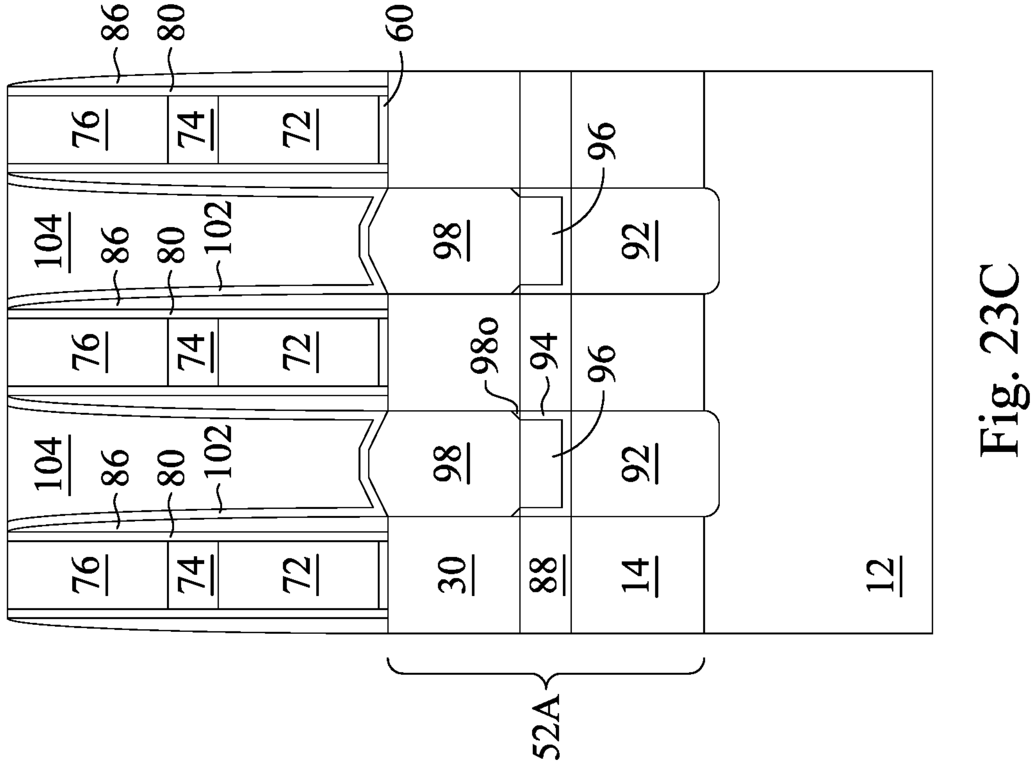
Figure 24B:
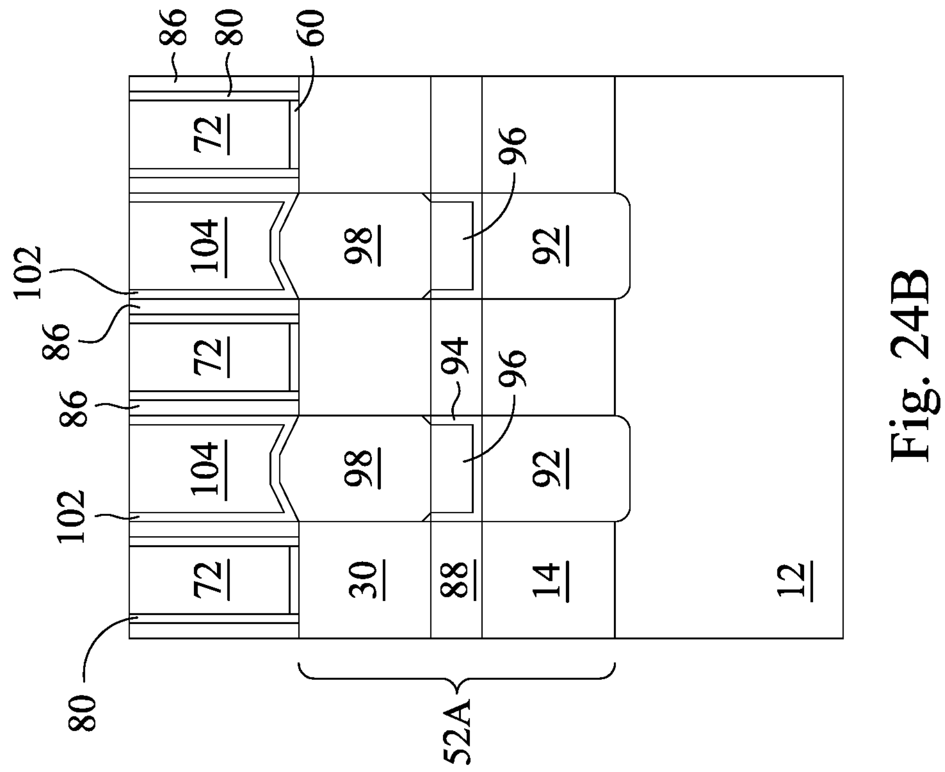
Figure 24A:
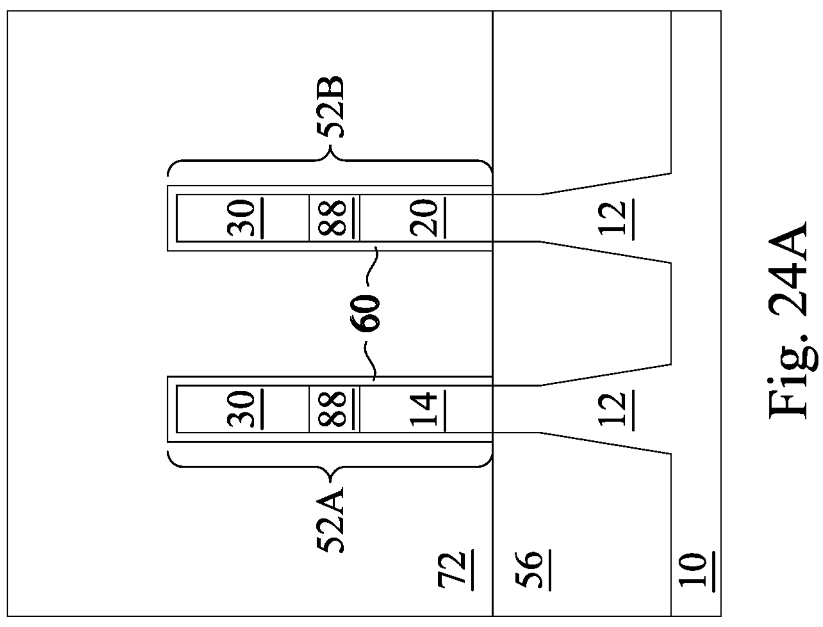
Figure 24D:
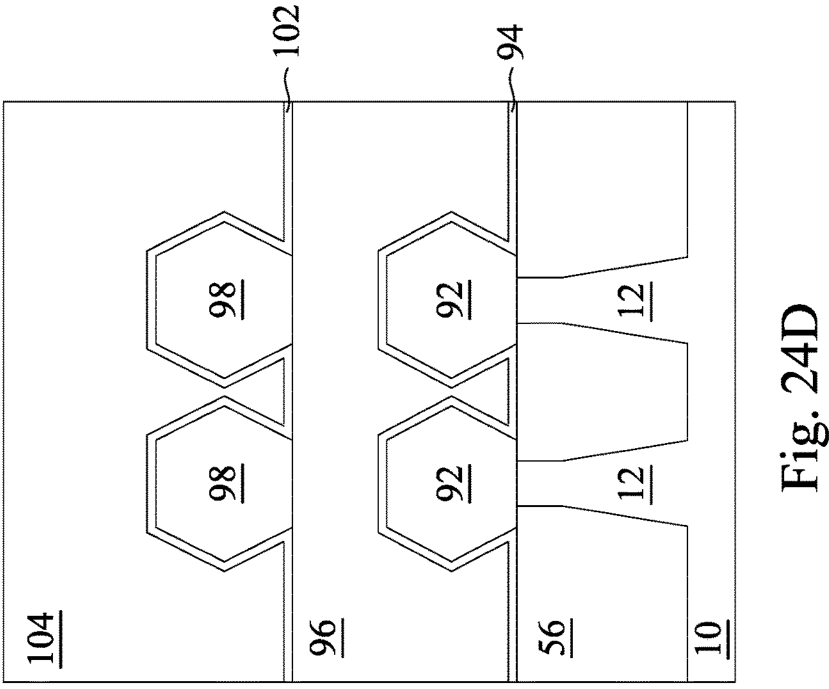
Figure 24C:
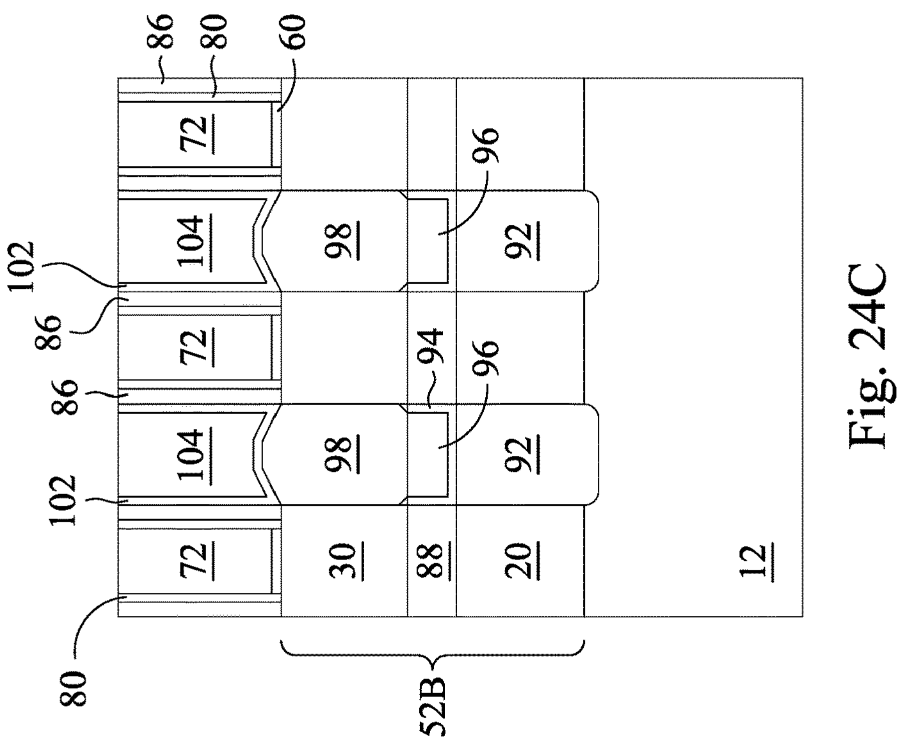

In FIGS. 23A, 23B, and 23C, an isolation structure 104 is deposited over the structure illustrated in FIGS. 22A and 22B. The isolation structure 104 may be formed using processes and materials similar to those used to form the isolation structure 96. In some embodiments, a liner layer or etch stop layer 102 is disposed between the isolation structure 104 and the epitaxial source/drain regions 98, the gate stacks, the gate spacers 86, and the isolation structure 96. The liner layer 102 may comprise a dielectric material, such as, silicon nitride, silicon oxide, silicon oxynitride, or the like, having a lower etch rate than the material of the overlying isolation structure 104.

In FIGS. 24A, 24B, 24C, and 24D, a planarization process, such as a CMP, may be performed to level the top surface of the isolation structure 104 with the top surfaces of the dummy gates 72, the pad layer 74, or the masks 76. The planarization process may also remove the pad layer 74 and/or the masks 76 on the dummy gates 72, and portions of the gate seal spacers 80 and the gate spacers 86 along sidewalls of the pad layer 74 and masks 76. After the planarization process, top surfaces of the dummy gates 72, the gate seal spacers 80, the gate spacers 86, and the isolation structure 104 are level. Accordingly, the top surfaces of the dummy gates 72 are exposed through the isolation structure 104. In some embodiments, the masks 76 and/or pad layer 74 may remain, in which case the planarization process levels the top surface of the isolation structure 104 with the top surfaces of the masks 76 or pad layer 74.

As noted above, FIGS. 25A, 25B, 26A, 26B, 26C, 26D, 27A, 27B, 28A, 28B, 29A, 29B, 30A, 30B, 30C, and 30D illustrate continuing processes on the structure of FIGS. 14A and 14B for embodiments consistent with those originating from FIGS. 4D and 5B. The elements of FIGS. 25A, 25B, 26A, 26B, 26C, 26D, 27A, 27B, 28A, 28B, 29A, 29B, 30A, 30B, 30C, and 30D use like references to refer to like structures as those previously discussed. Details for forming such structures may be obtained from the description of such items above. Exceptions or differences are noted in the discussion that follows.

Figure 25B:
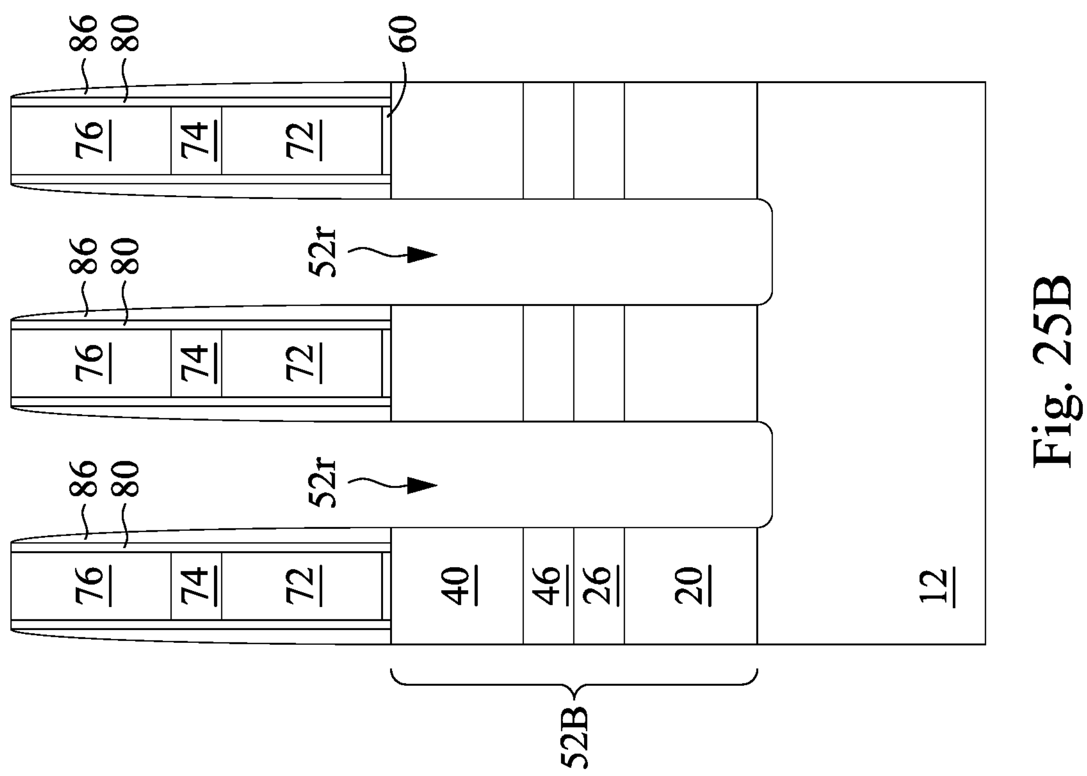
FIGS. 25A, 25B, 26A, 26B, 26C, 26D, 27A, 27B, 28A, 28B, 29A, 29B, 30A, 30B, 30C, and 30D illustrate various cross-sectional views of intermediate steps in the formation of source/drain regions in accordance with some embodiments.
Figure 25A:
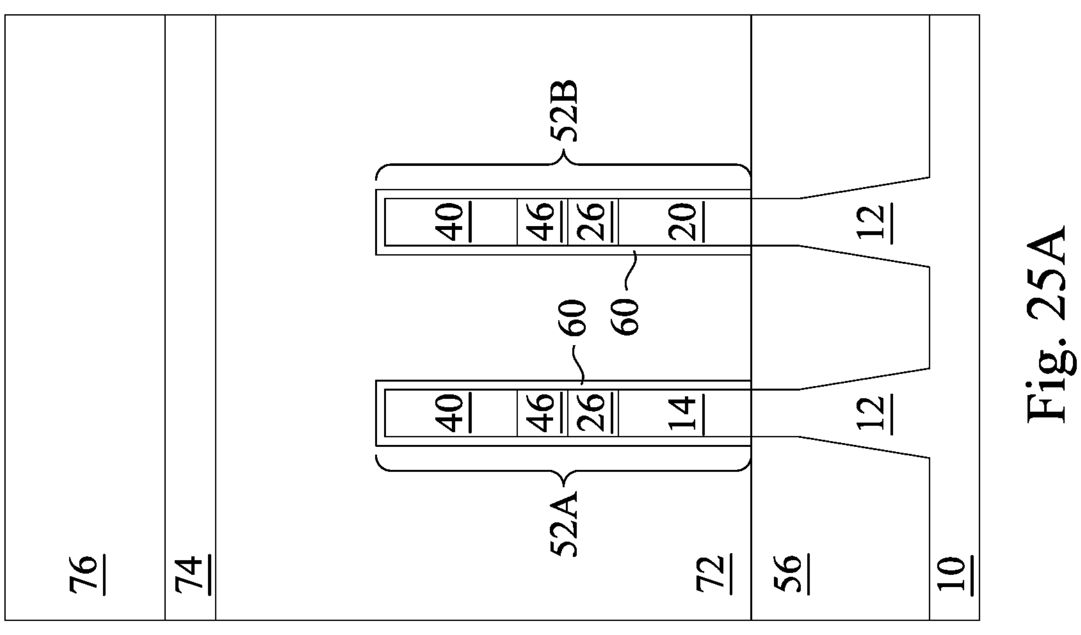
Figure 26B:
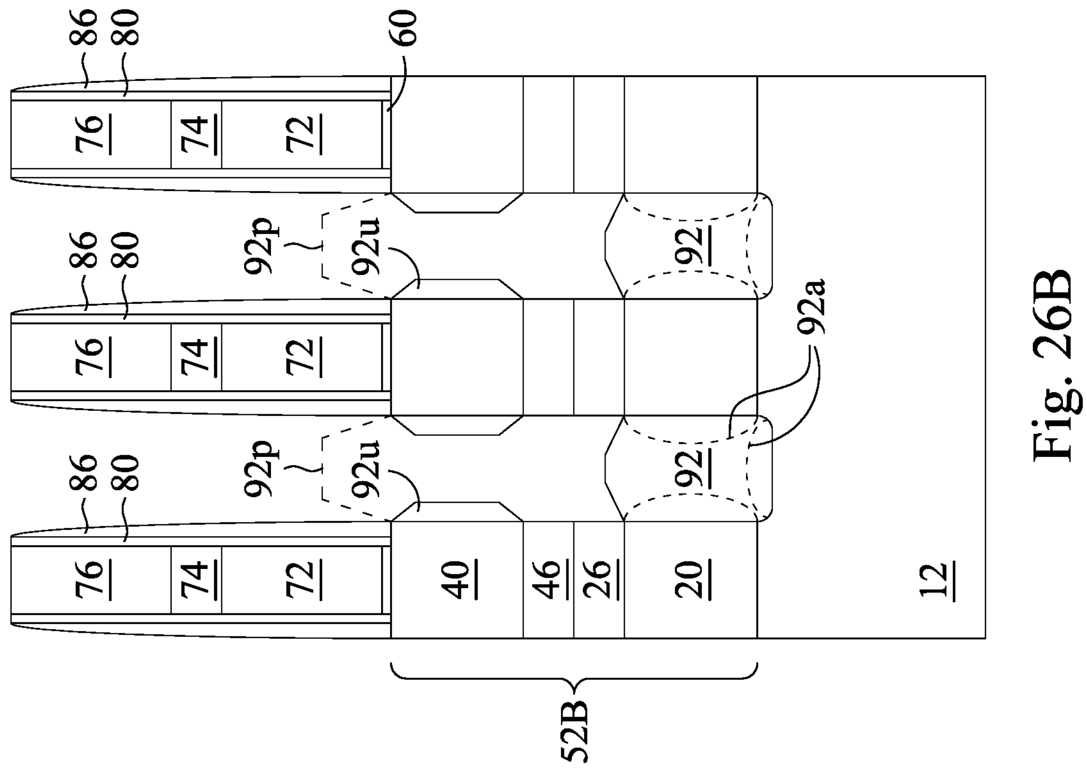
Figure 26A:
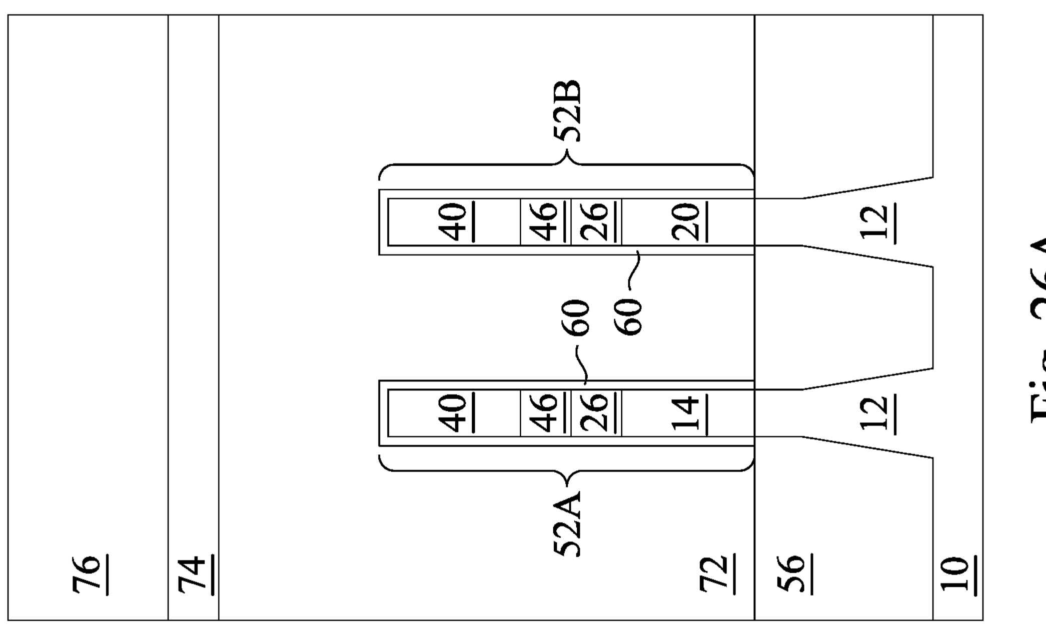
Figure 26D:
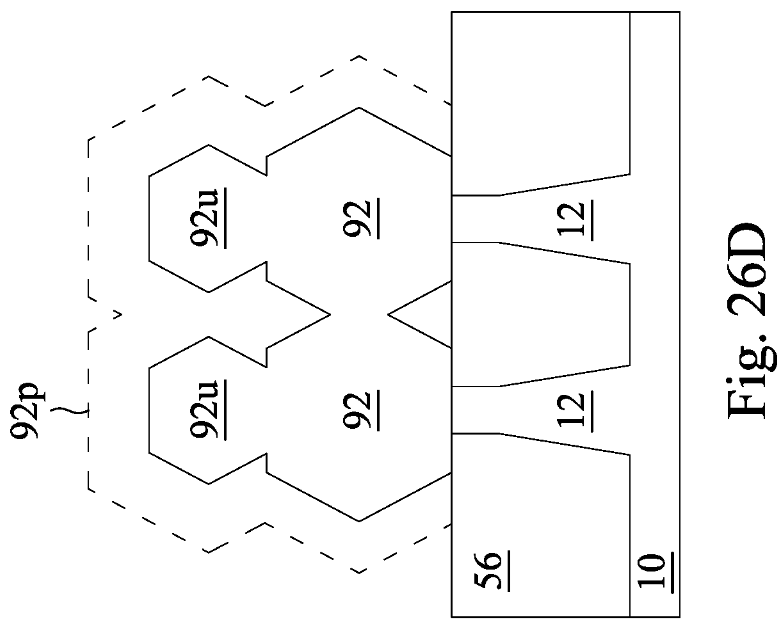
Figure 26C:
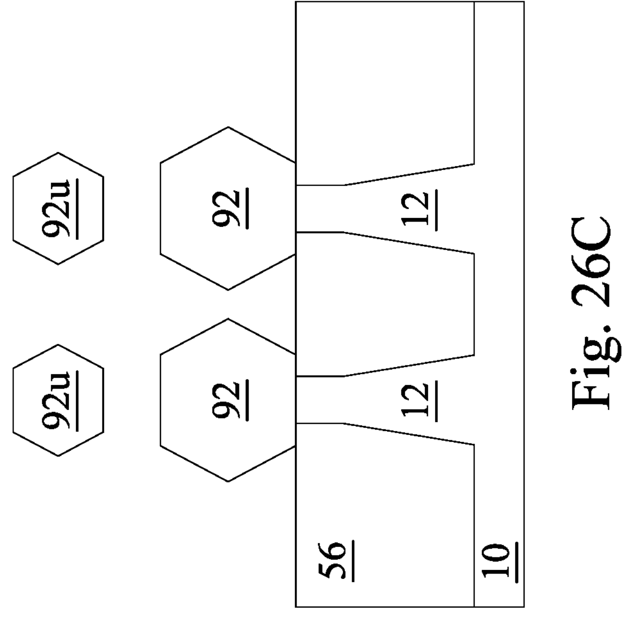

In FIGS. 25A and 25B, recesses 52*r* are formed in the fins 52 by an etching process. The etching to form the recesses 52*r* may be similar to that described with respect to FIGS. 15A and 15B. Instead of the semiconductor layer 30, however, the semiconductor layer 40 is etched. Also, rather than etching the semiconductor layer 24, because the insulating layer 26 is bonded to the insulating layer 46, both the insulating layer 46 and insulating layer 26 are etched. The semiconductor layer 20 or the semiconductor layer 14 may be etched, depending on which semiconductor layers are used for the lower semiconductor layer.

In FIGS. 26A, 26B, 26C, and 26D, epitaxial source/drain regions 92 are formed in the recesses 52*r* in the fins 52. The epitaxial source/drain regions 92 are formed in the fins 52 such that each dummy gate 72 is disposed between respective neighboring pairs of the epitaxial source/drain regions 92. Materials and processes used to form the epitaxial source/drain regions 92 are similar to those discussed above with respect to FIGS. 19A, 19B, 19C, and 19D. Rather than epitaxially growing the upper portion 92*u* from the semiconductor layer 30, the upper portion 92*u* is grown from the semiconductor layer 40.

Figure 27B:
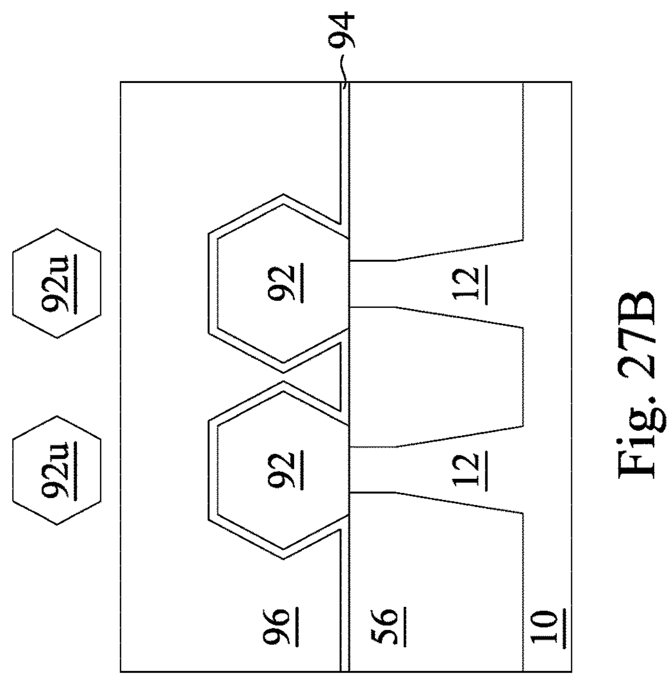
Figure 27A:
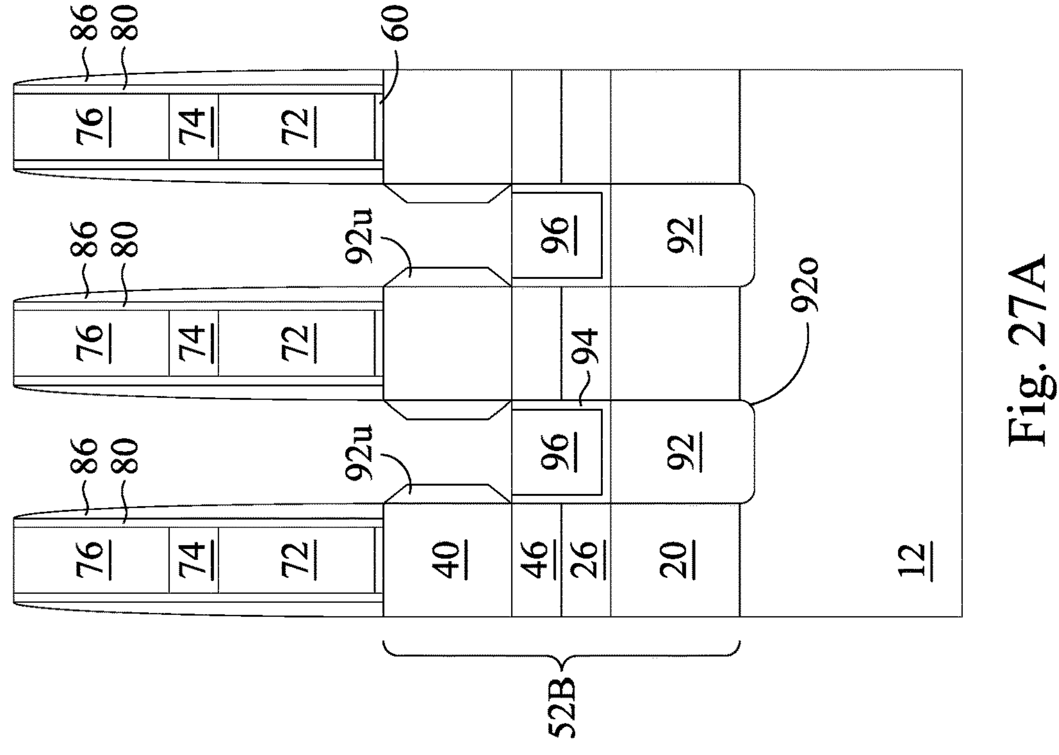

In FIGS. 27A and 27B, the isolation structure 96 is deposited over the structure illustrated in FIG. 26A, 26B, and 26C or 26D. In some embodiments, the liner layer or etch stop layer 94 is disposed between the isolation structure 96 and the gate stacks, the gate spacers 86, and the insulating layer 46 and/or insulating layer 26. The isolation structure 96 and liner layer 94 are recessed so that the sides of the semiconductor layer 40 are exposed. The lower epitaxial source/drain regions 92 remain covered by the isolation structure 96, while the upper portion 92*u* of the epitaxial source/drain regions 92 are exposed. The upper surfaces of the isolation structure 96 and liner layer 94 is illustrated as being in line with the upper surface of the insulating layer 46, however, the upper surfaces of the isolation structure 96 and liner layer 94 may be above or below the upper surface of the insulating layer 46 and/or insulating layer 26.

Figure 28B:
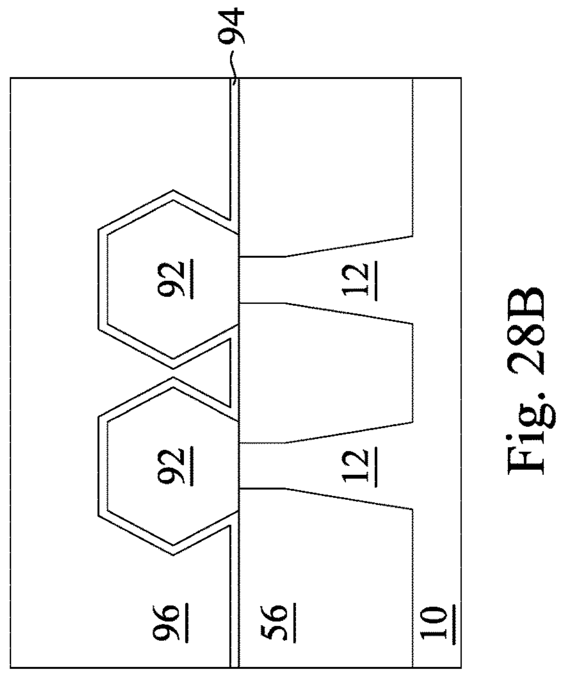
Figure 28A:
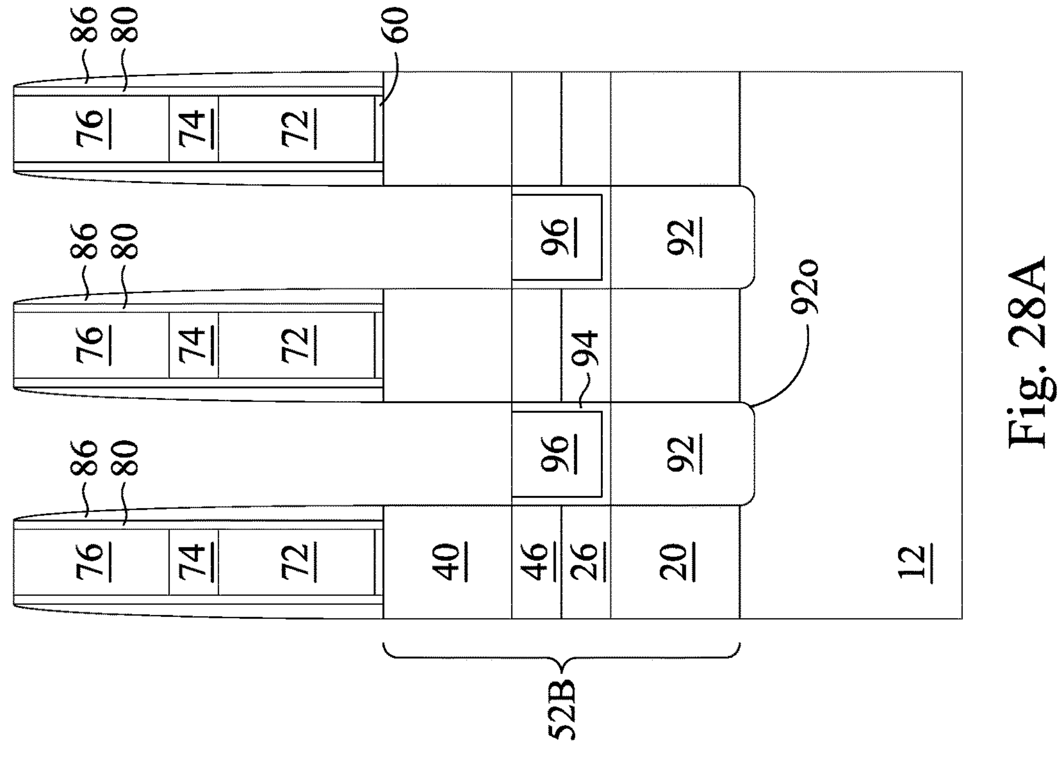

In FIGS. 28A and 28B, the upper portion 92*u* of the epitaxial source/drain regions 92 are removed, for example, by a suitable etching process, such as a wet etch, dry etch, or RIE process. The isolation structure 96 may protect the lower epitaxial source/drain regions 92 while removing the upper portion 92*u*.

In some embodiments, rather than utilize the isolation structure 96 to assist in removing the upper portion 92*u*, the upper portion 92*u* can be prevented from being grown, for example, by using a sacrificial dielectric layer and dummy spacers. This process may be performed in a manner similar to that described above with respect to FIGS. 21A-21H, mutatis mutandis, after which the isolation structure 96 is formed.

Figure 29B:
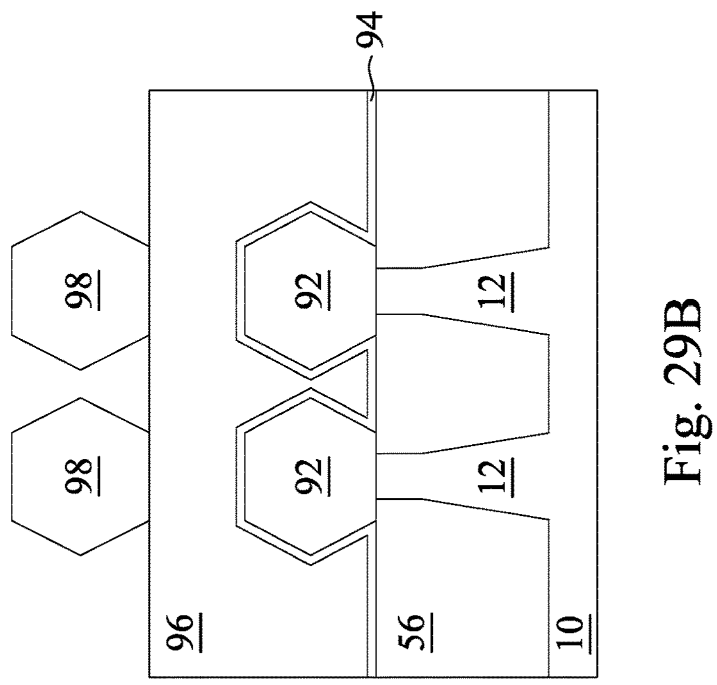
Figure 29A:
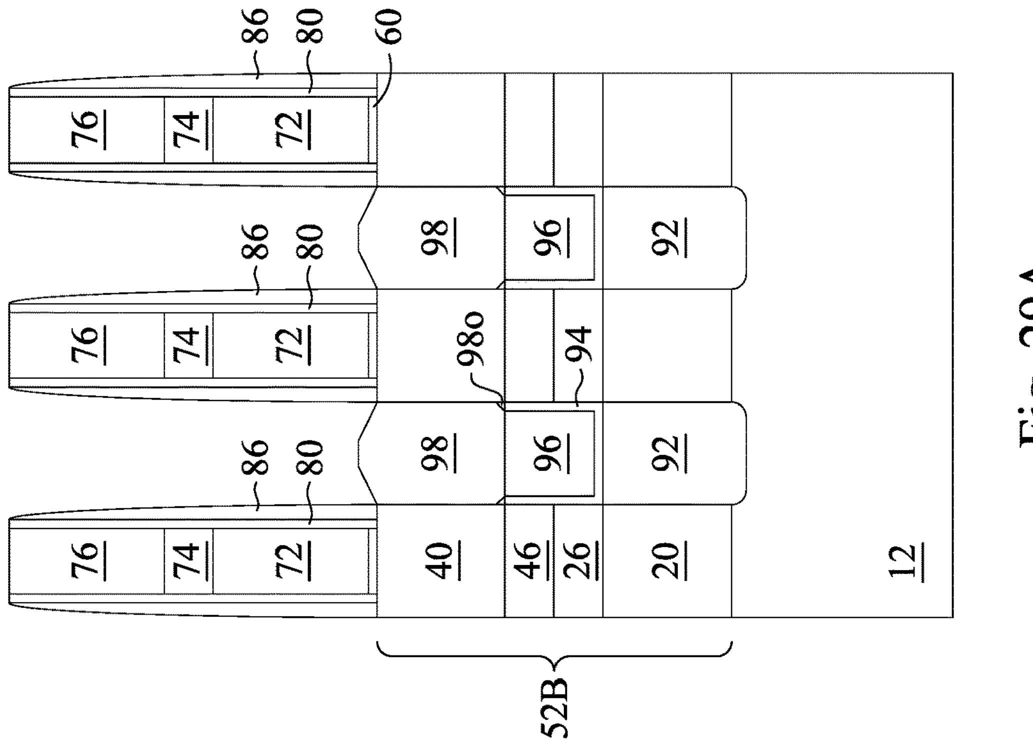
Figure 30B:
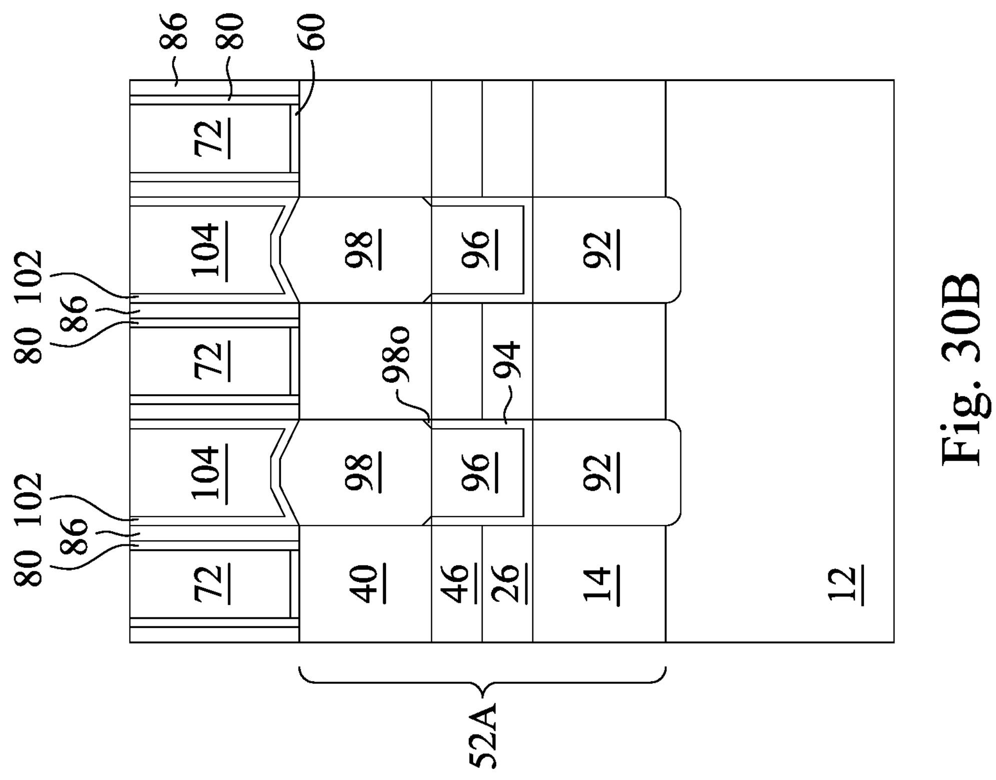
Figure 30A:
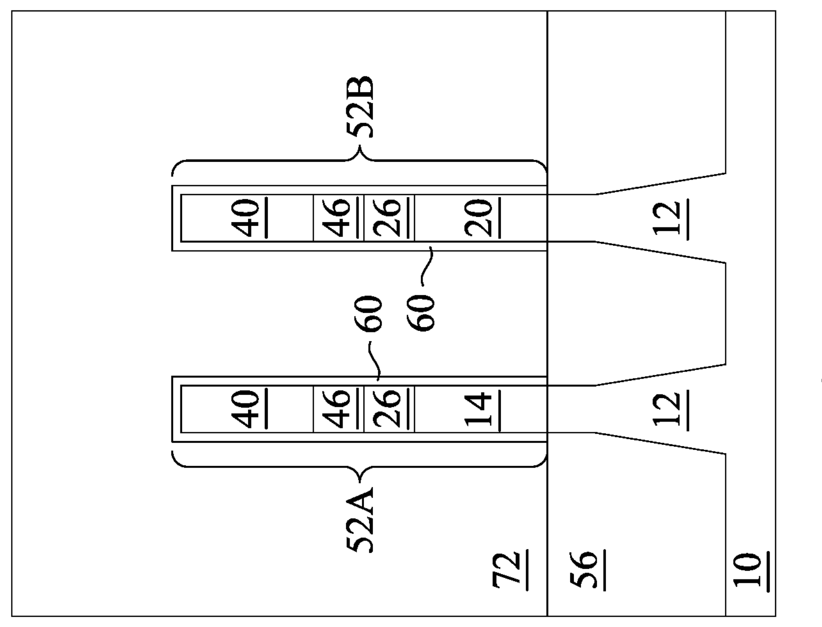
Figure 30D:
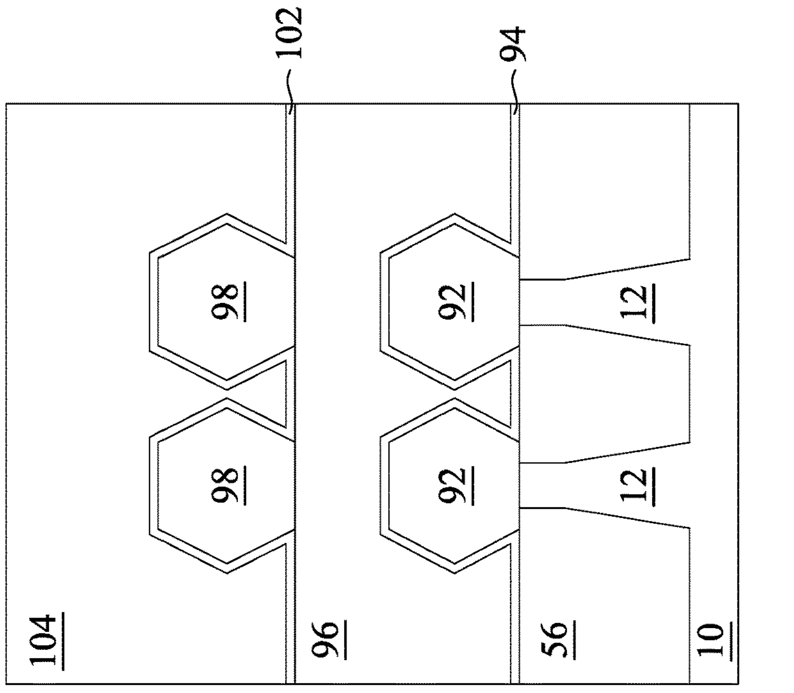
Figure 30C:
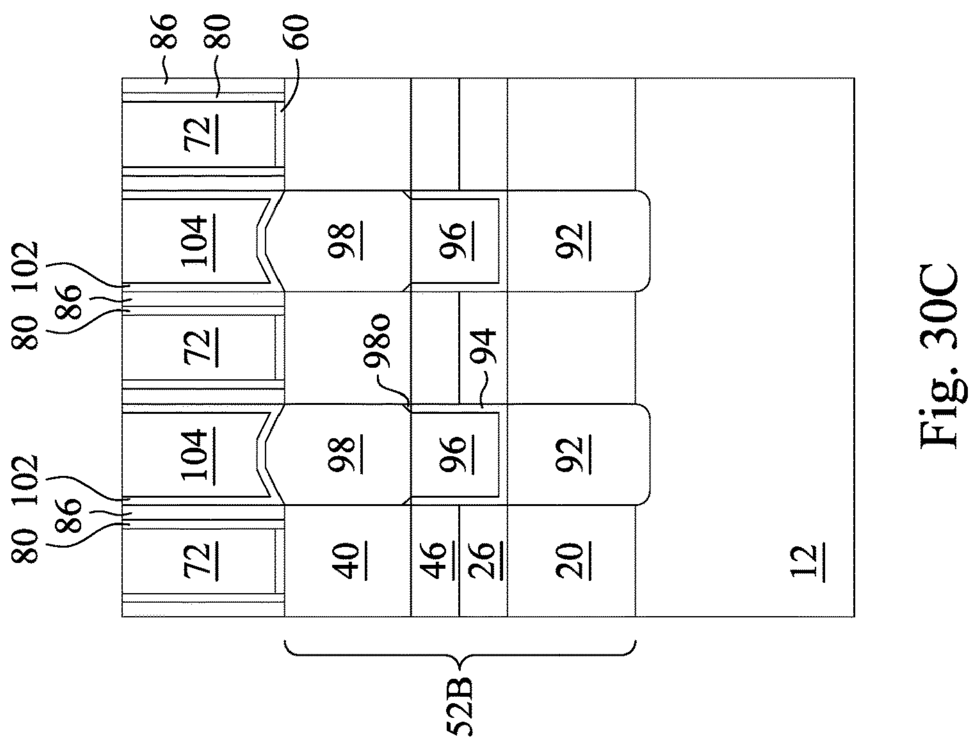

In FIGS. 29A and 29B, after removing the upper portion 92*u* of the epitaxial source/drain regions 92, the epitaxial source/drain regions 98 are grown from the channel regions (sidewalls) of the semiconductor layer 40. The epitaxial source/drain regions 98 are formed in the fins 52 such that each dummy gate 72 is disposed between respective neighboring pairs of the epitaxial source/drain regions 98.

In FIGS. 30A, 30B, 30C, and 30D, the isolation structure 104 and liner layer 102 are deposited over the structure illustrated in FIGS. 29A and 29B. Following deposition of the liner layer 102 and isolation structure 104, a planarization process, such as a CMP, may be performed to level the top surface of the isolation structure 104 with the top surfaces of the dummy gates 72, the pad layer 74, or the masks 76, similar to that illustrated and discussed above with respect to FIGS. 24A, 24B, 24C, and 24D.

As noted above, FIGS. 31A, 31B, 32A, 32B, 33A, 33B, 34A, 34B, 35A, 35B, 35C, and 35D illustrate continuing processes on the structure of FIGS. 14A and 14B for embodiments consistent with those originating from FIGS. 6B and 7B. The elements of FIGS. 31A, 31B, 32A, 32B, 33A, 33B, 34A, 34B, 35A, 35B, 35C, and 35D use like references to refer to like structures as those previously discussed. Details for forming such structures may be obtained from the description of such items above. Exceptions or differences are noted in the discussion that follows.

Figure 31B:
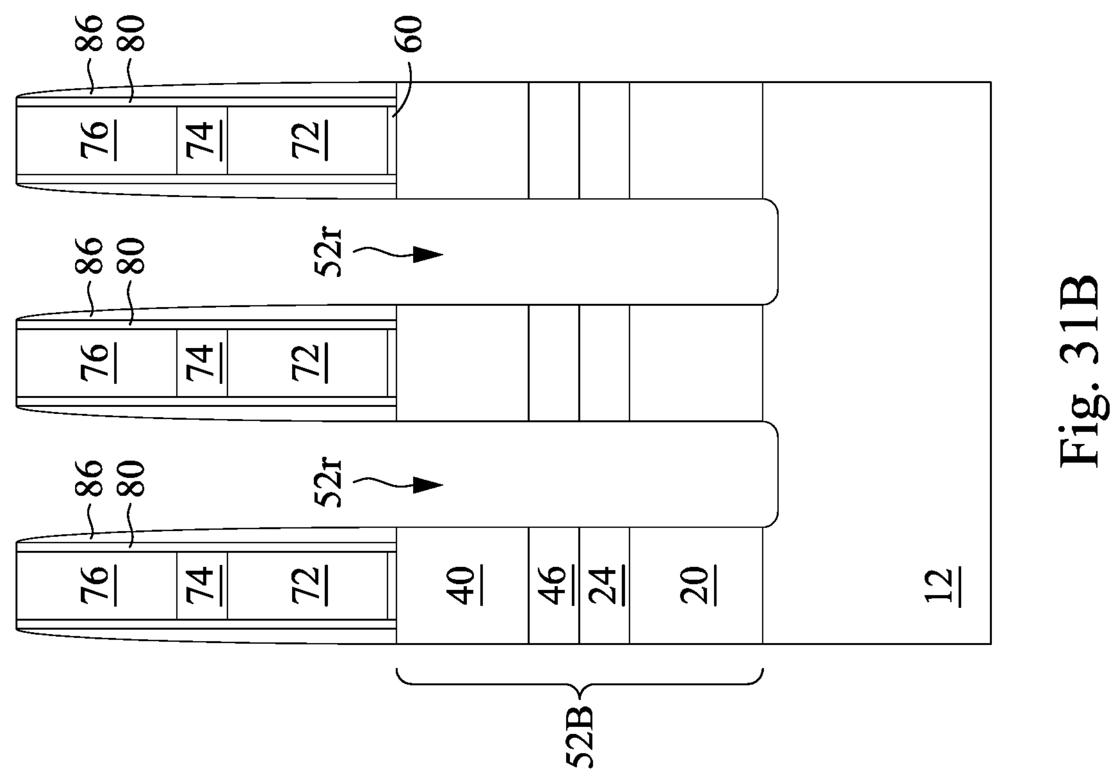
FIGS. 31A, 31B, 32A, 32B, 33A, 33B, 34A, 34B, 35A, 35B, 35C, and 35D illustrate various cross-sectional views of intermediate steps in the formation of source/drain regions in accordance with some embodiments.
Figure 31A:
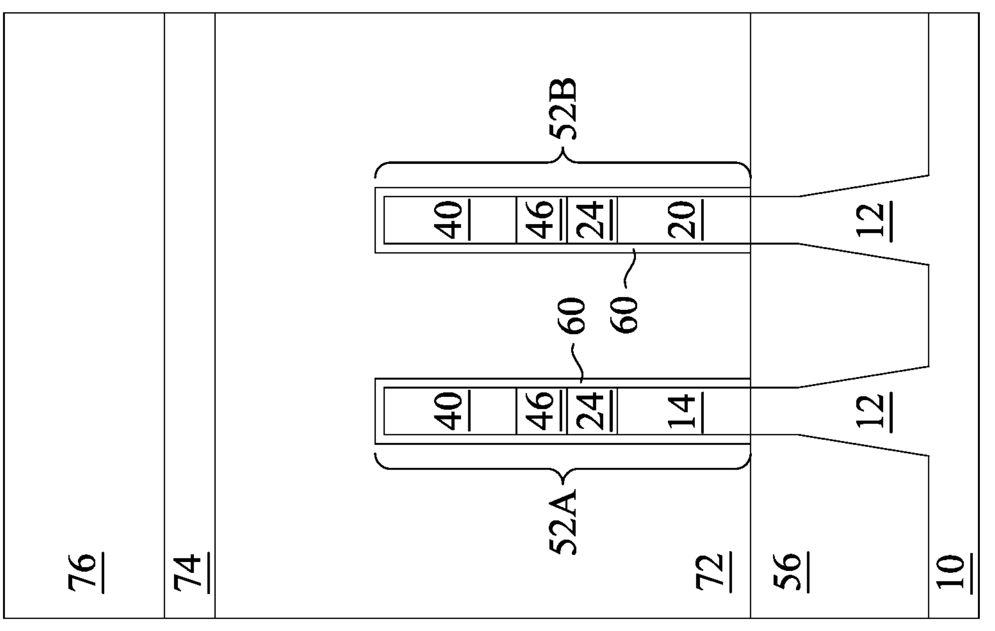

In FIGS. 31A and 31B, recesses 52*r* are formed in the fins 52 by an etching process. The etching to form the recesses 52*r* may be similar to that described with respect to FIGS. 15A and 15B. Instead of the semiconductor layer 30, however, the semiconductor layer 40 is etched. Also, rather than etching the semiconductor layer 24, alone, because the insulating layer 46 is bonded to the semiconductor layer 24, both the insulating layer 46 and semiconductor layer 24 are etched. The semiconductor layer 20 or the semiconductor layer 14 may be etched, depending on which semiconductor layers are used for the lower semiconductor layer.

Figure 32B:
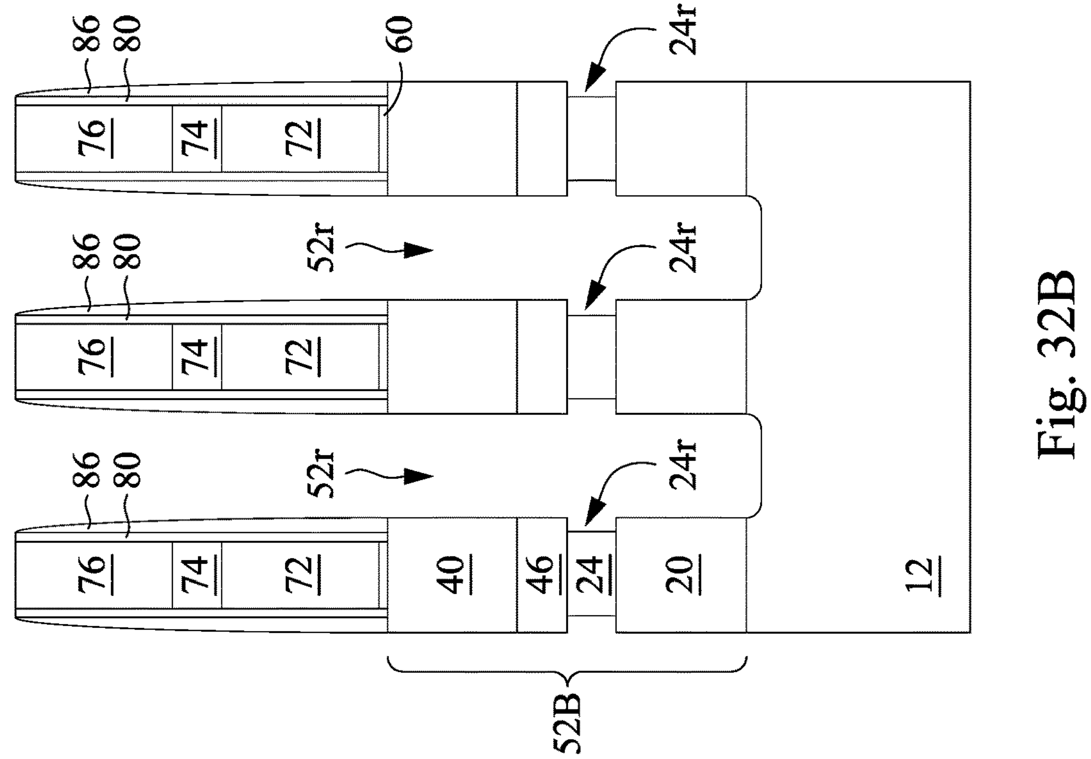
Figure 32A:
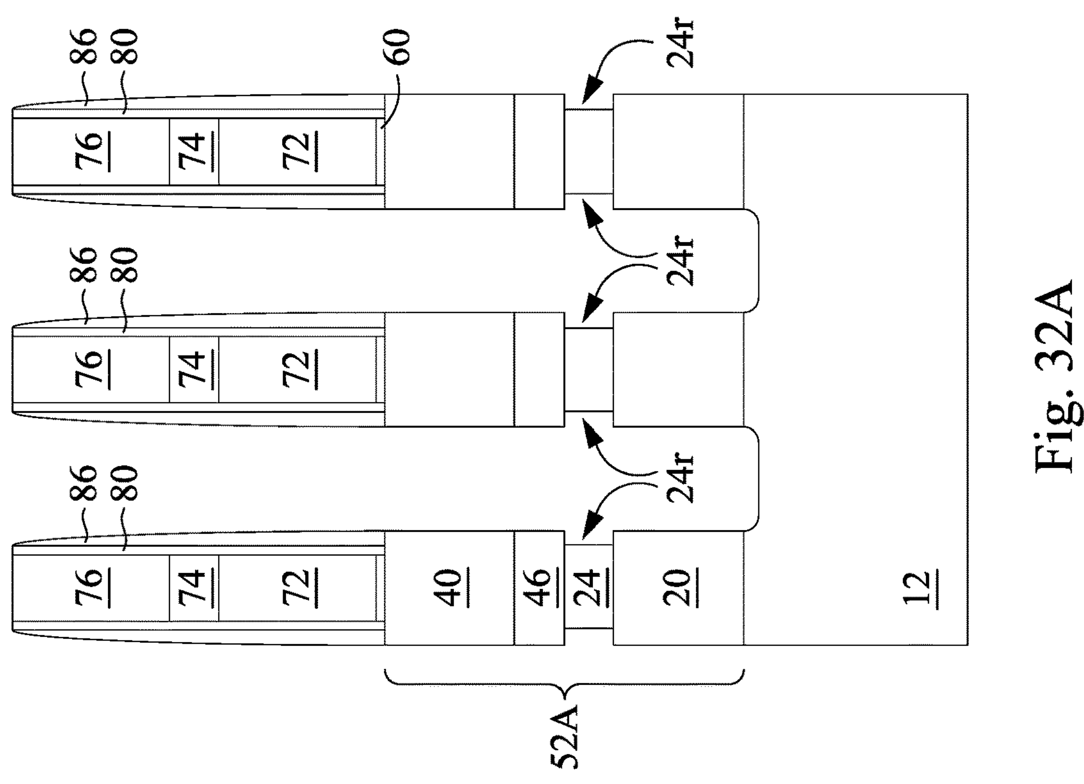

In FIGS. 32A and 32B, portions of sidewalls of the semiconductor layer 24 exposed by the recesses 52*r* are etched to form sidewall recesses 24*r*. Although sidewalls of the semiconductor layer 24 in sidewall recesses 24*r* are illustrated as being straight in FIGS. 32A and 32B, the sidewalls may be concave or convex. The sidewalls may be etched using isotropic etching processes, such as wet etching or the like. Etchants selective to the high germanium content of the semiconductor layer 24 are used to etch semiconductor layer 24 such that the semiconductor layers 14, 20, and 40 remain relatively unetched as compared to the semiconductor layer 24. For example, a dry etch process with tetramethylammonium hydroxide (TMAH), ammonium hydroxide ($NH_4OH$), or the like may be used to etch sidewalls of the semiconductor layer 24.

Figure 33B:
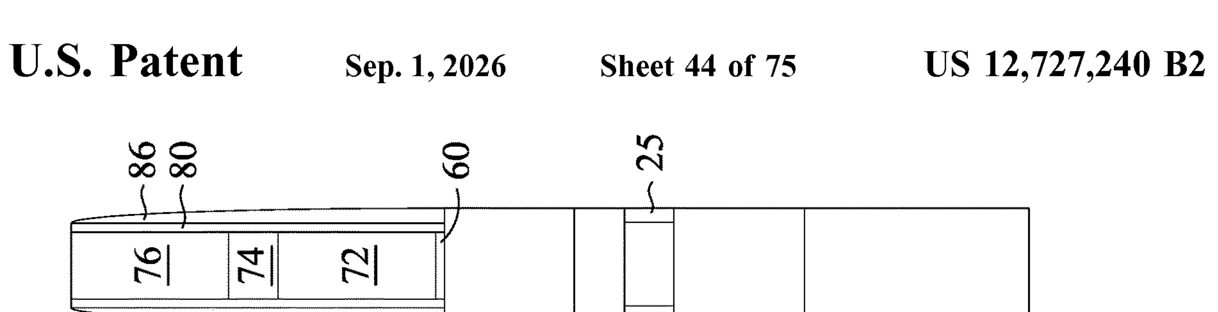
Figure 33B:
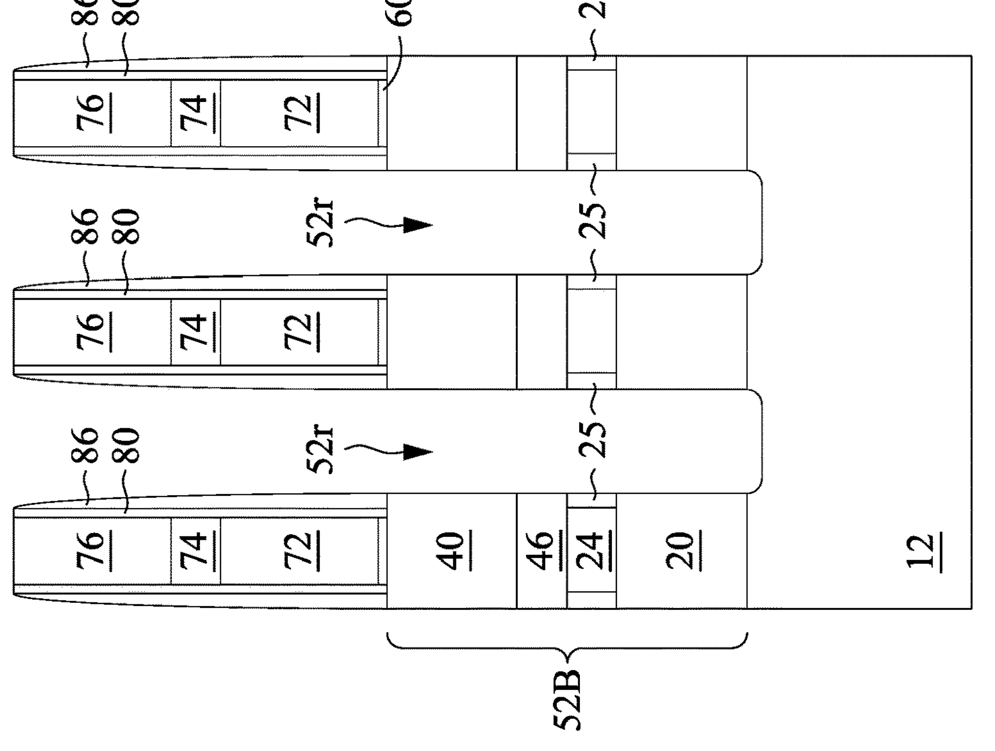
Figure 33A:
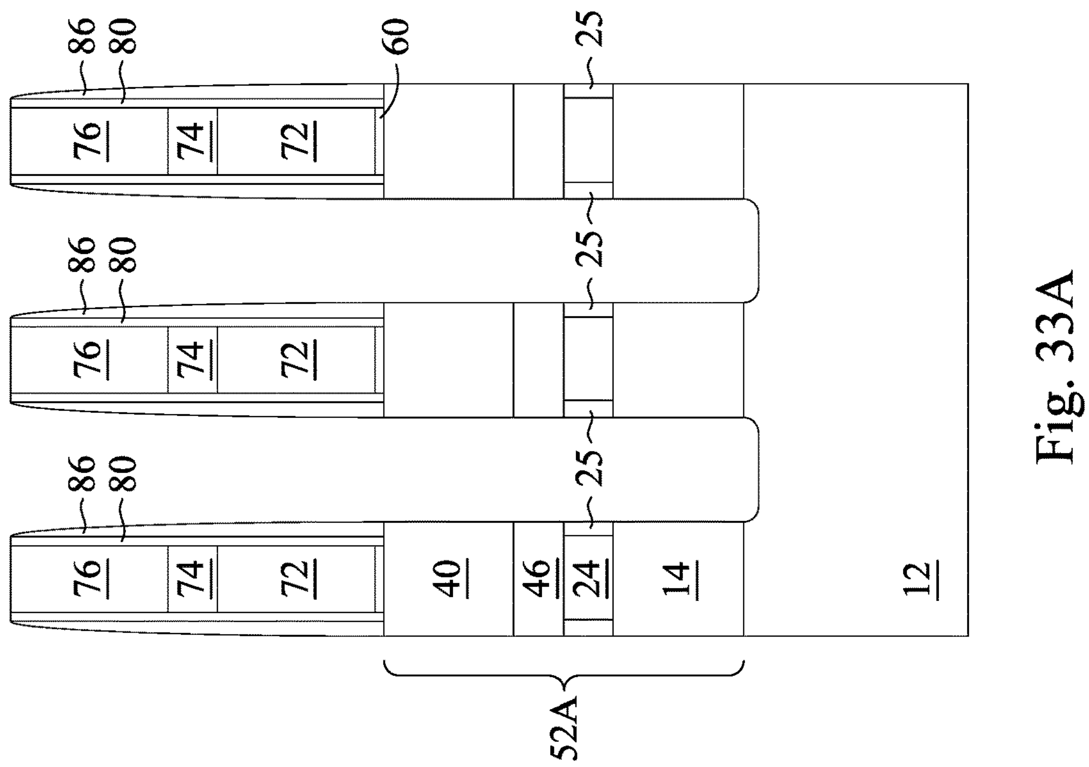

In FIGS. 33A and 33B, first inner spacers 25 (or sidewall spacers) are formed in the sidewall recess 24*r*. The first inner spacers 25 may be formed by depositing an inner spacer layer (not separately illustrated) over the structures illustrated in FIGS. 32A and 32B. The first inner spacers 25 act as isolation features between subsequently formed source/drain regions and a gate structure. As will be discussed in greater detail below, source/drain regions will be formed in the recesses 52*r*.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 25. Although outer sidewalls of the first inner spacers 25 are illustrated as being flush with sidewalls of the semiconductor layer 40 and semiconductor layers 14 and/or 20, the outer sidewalls of the first inner spacers 25 may extend beyond or be recessed from sidewalls of the semiconductor layer 40 and semiconductor layers 14 and/or 20.

Moreover, although the outer sidewalls of the first inner spacers 25 are illustrated as being straight in FIGS. 33A and 33B, the outer sidewalls of the first inner spacers 25 may be concave or convex. The inner spacer layer may be etched by an anisotropic etching process, such as RIE, NBE, or the like. The first inner spacers 25 may be used to prevent damage to subsequently formed source/drain regions by subsequent etching processes, such as etching processes used to form gate structures.

Figures 34A, 34B:
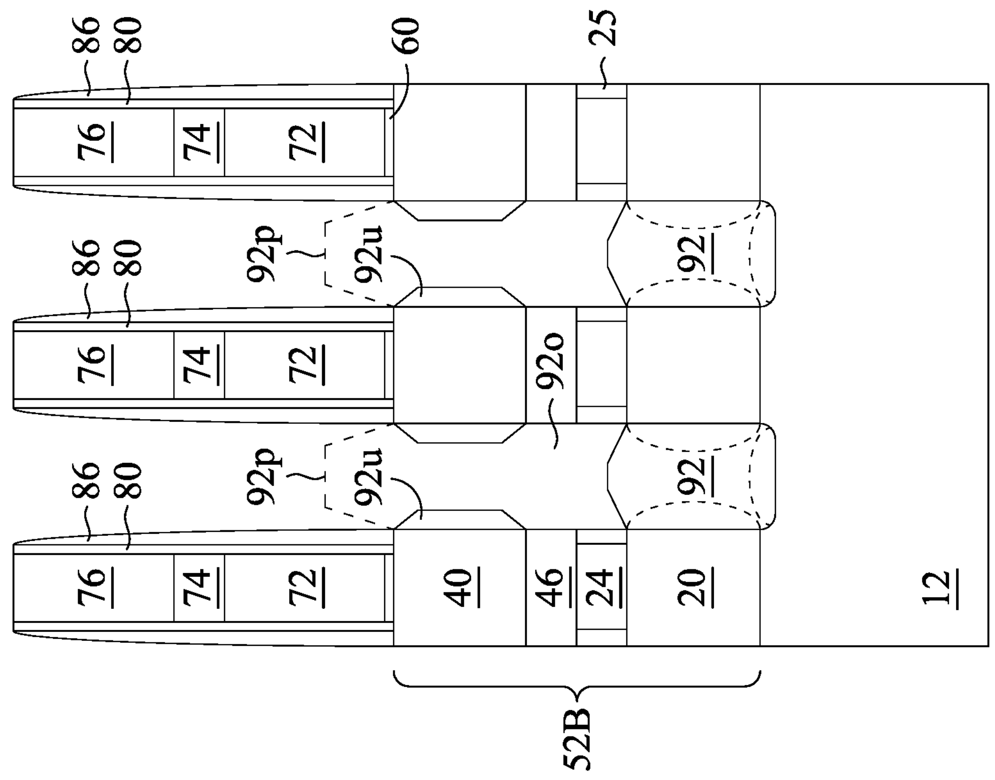
Figure 35B:
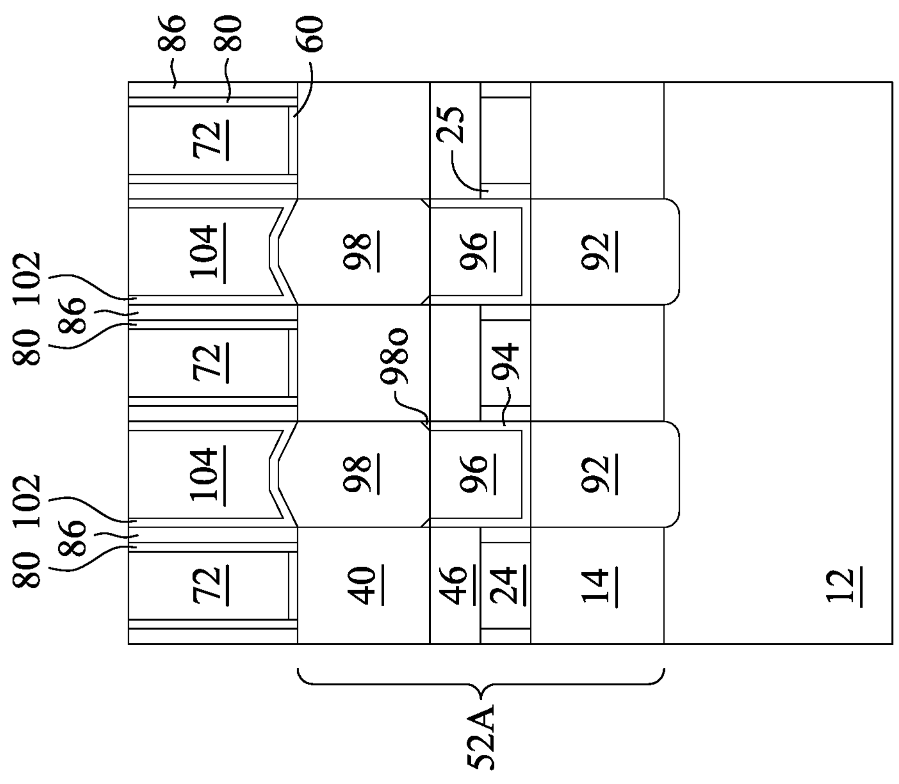
Figure 35A:
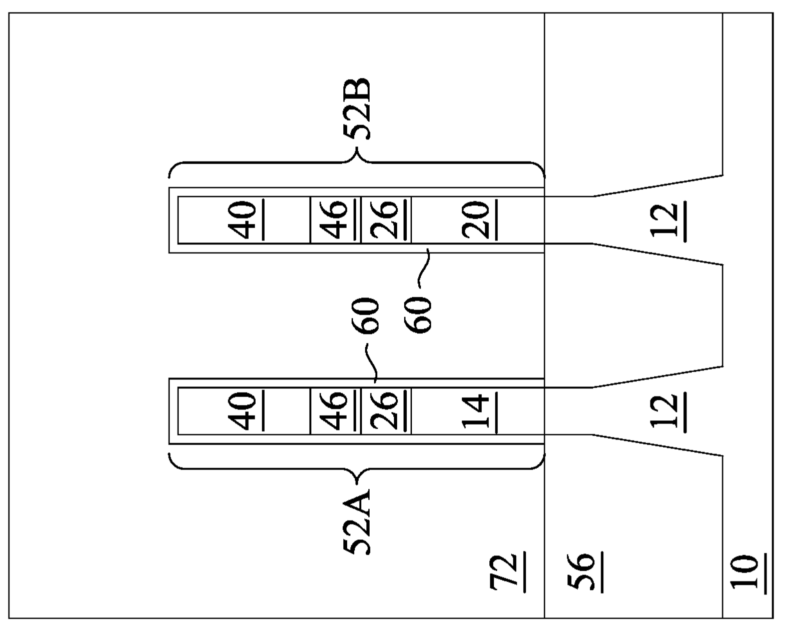
Figures 35C, 35D:
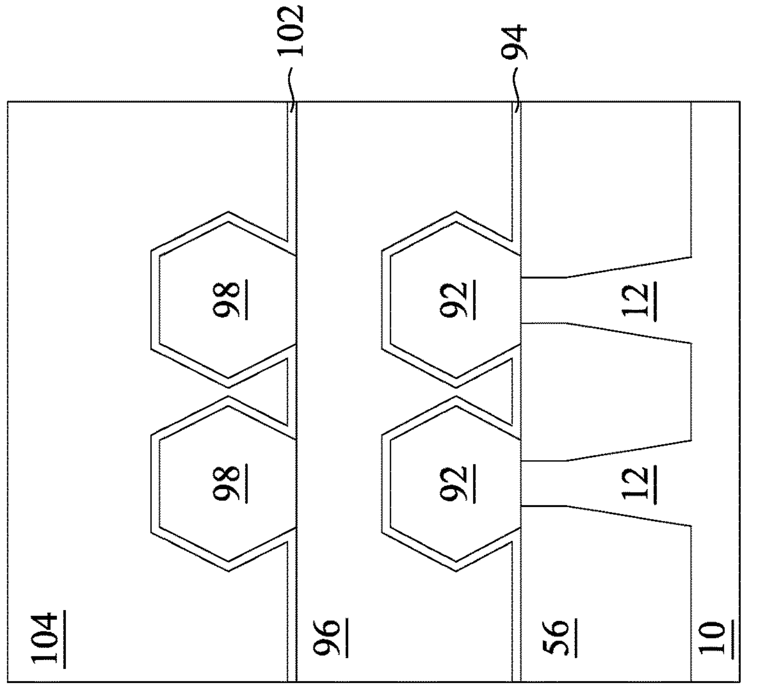

In FIGS. 34A and 34B (the views of FIGS. 26C and 26D may also be applied here), epitaxial source/drain regions 92 are formed in the recesses 52*r* in the fins 52. The epitaxial source/drain regions 92 are formed in the fins 52 such that each dummy gate 72 is disposed between respective neighboring pairs of the epitaxial source/drain regions 92. Materials and processes used to form the epitaxial source/drain regions 92 are similar to those discussed above with respect to FIGS. 19A, 19B, 19C, and 19D. Rather than epitaxially growing the upper portion 92*u* from the semiconductor layer 30, the upper portion is 92*u* is grown from the semiconductor layer 40.

Also in FIGS. 34A and 34B, the isolation structure 96 is deposited and then recessed to cover the lower epitaxial source/drain regions 92, while exposing the upper portion 92*u* of the epitaxial source/drain regions 92. In some embodiments, the liner layer or etch stop layer 94 is disposed between the isolation structure 96 and the gate stacks, the gate spacers 86, and the insulating layer 46 and/or first inner spacers 25. The isolation structure 96 and liner layer 94 may be recessed using the processes described above so that the sides of the semiconductor layer 40 are exposed.

In FIGS. 35A, 35B, 35C, and 35D, the upper portion 92*u* of the epitaxial source/drain regions 92 are removed, for example, by a suitable etching process, such as a wet etch, dry etch, or RIE process. The isolation structure 96 protects the epitaxial source/drain regions 92 during the removal of the upper portion 92*u*.

In some embodiments, rather than utilize the isolation structure 96 to assist in removing the upper portion 92*u*, the upper portion 92*u* can be prevented from being grown, for example, by using a sacrificial dielectric layer and dummy spacers. This process may be performed in a manner similar to that described above with respect to FIGS. 21A-21H, mutatis mutandis, after which the isolation structure 96 is formed and recessed.

After recessing the isolation structure 96 and the liner layer 94 (and removing the epitaxial source/drain regions 92, if they were not prevented from being grown), the epitaxial source/drain regions 98 are grown from the channel regions (sidewalls) of the semiconductor layer 40. The epitaxial source/drain regions 98 are formed in the fins 52 such that each dummy gate 72 is disposed between respective neighboring pairs of the epitaxial source/drain regions 98. For details, this process is similar to those described and illustrated with respect to FIGS. 29A and 29B.

Finally, the isolation structure 104 and liner layer 102 are deposited over the structure. Following deposition of the liner layer 102 and isolation structure 104, a planarization process, such as a CMP, may be performed to level the top surface of the isolation structure 104 with the top surfaces of the dummy gates 72, the pad layer 74, or the masks 76, similar to that illustrated and discussed above with respect to FIGS. 24A, 24B, 24C, and 24D.

FIGS. 36A through 60D illustrate the fourth stage referenced above, i.e., a gate replacement process, for each of the embodiments. FIGS. 36A, 36B, 37A, 37B, 38, 39A, 39B, 40A, 40B, 41A, 41B, 42A, 42B, 43, 44A, 44B, 45A, 45B, 46A, 46B, 46C, and 46D illustrate a dummy gate replacement process and contact formation resulting from the structures illustrated in FIGS. 24A, 24B, 24C, and 24D. FIGS. 47A, 47B, 48A, 48B, 49A, 49B, 50A, 50B, 51A, 51B, 52A, 52B, 53A, 53B, 53C, and 53D illustrate a dummy gate replacement process and contact formation resulting from the structures illustrated in FIGS. 30A, 30B, 30C, and 30D. FIGS. 54A, 54B, 55A, 55B, 56A, 56B, 57A, 57B, 58A, 58B, 59A, 59B, 60A, 60B, 60C, and 60D illustrate a dummy gate replacement process and contact formation resulting from the structures illustrated in FIGS. 35A, 35B, 35C, and 35D.

Figure 36B:
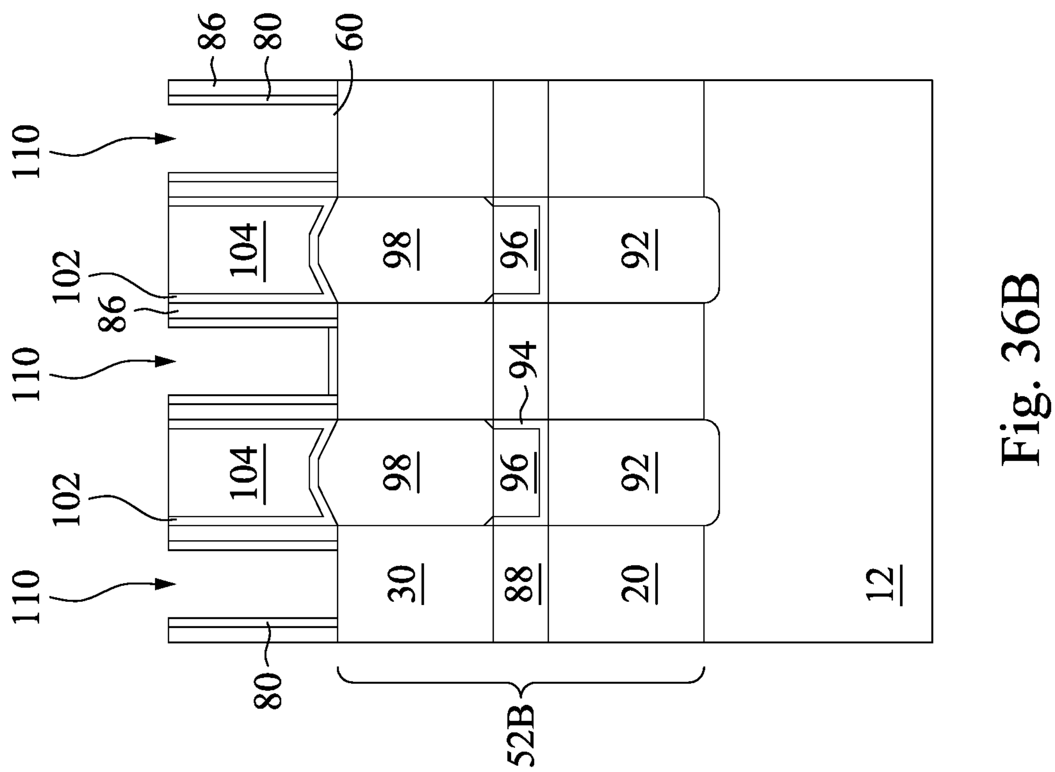
FIGS. 36A, 36B, 37A, 37B, 38, 39A, 39B, 40A, 40B, 41A, 41B, 42A, 42B, 43, 44A, 44B, 45A, 45B, 46A, 46B, 46C, and 46D illustrate various cross-sectional views of intermediate steps of a dummy gate replacement process and contact formation in accordance with various embodiments.
Figure 36A:
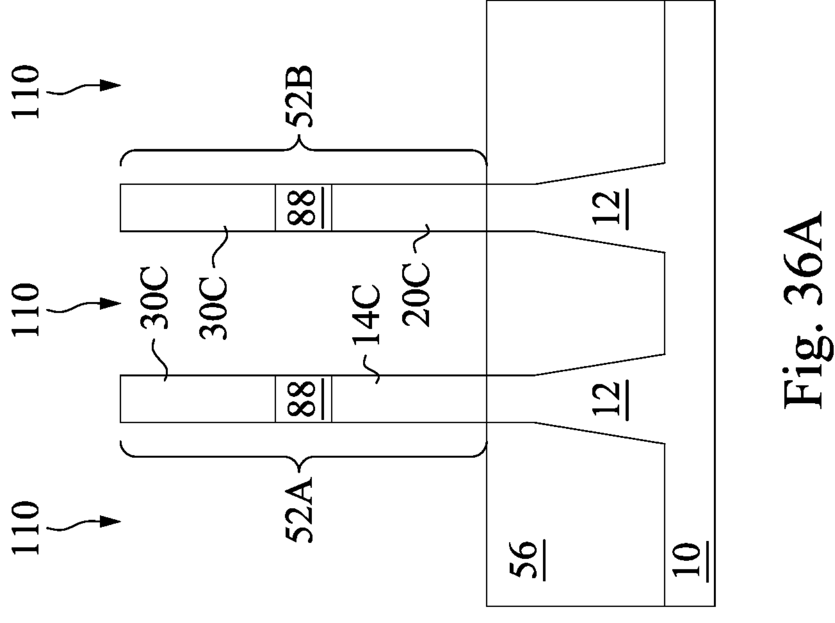

In FIGS. 36A and 36B, the dummy gates 72, the pad layer 74 if present, and the masks 76 if present, are removed in an etching step(s), so that recesses 110 are formed. Portions of the dummy dielectric layer 60 in the recesses 110 may also be removed. In some embodiments, only the dummy gates 72 are removed and the dummy dielectric layer 60 remains and is exposed by the recesses 110. In some embodiments, the dummy dielectric layer 60 is removed from recesses 110 in a first region of a die (e.g., a core logic region) and remains in recesses 110 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the isolation structure 104 or the gate spacers 86. Each recess 110 exposes and/or overlies complementary stacked channel regions of a respective fin 52. For example, in the fin 52A, the recess 110 exposes the PFET channel region from the semiconductor layer 14 (for simplicity, this will be referred to as the channel region 14*c*) and the NFET channel region from the semiconductor layer 30 (for simplicity, this will be referred to as the channel region 30*c*). Similarly, in the fin 52B, the recess 110 exposes the PFET channel region from the semiconductor layer 20 (for simplicity, this will be referred to as the channel region 20*c*) and the NFET channel region 30*c*. The channel region 14*c* and/or channel region 20*c* are disposed between neighboring pairs of the epitaxial source/drain regions 92. The channel regions 30*c* are disposed between neighboring pairs of the epitaxial source/drain regions 98. During the removal, the dummy dielectric layer 60 may be used as an etch stop layer when the dummy gates 72 are etched. The dummy dielectric layer 60 may then be optionally removed after the removal of the dummy gates 72.

Figure 37B:
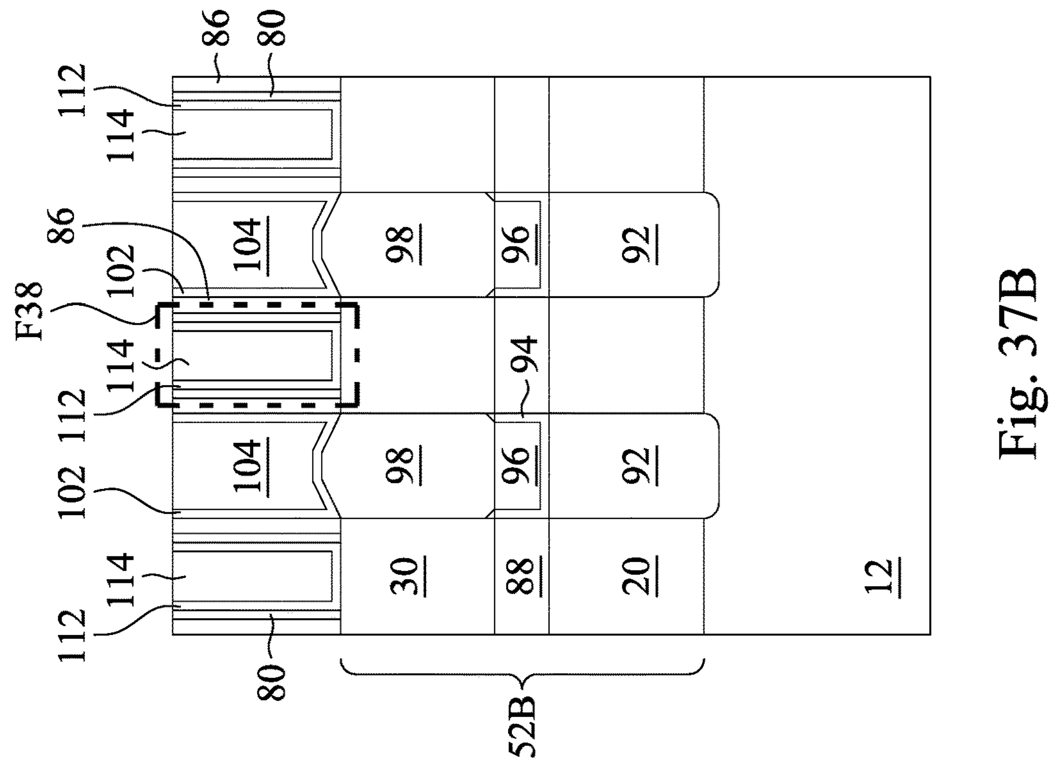
Figure 37A:
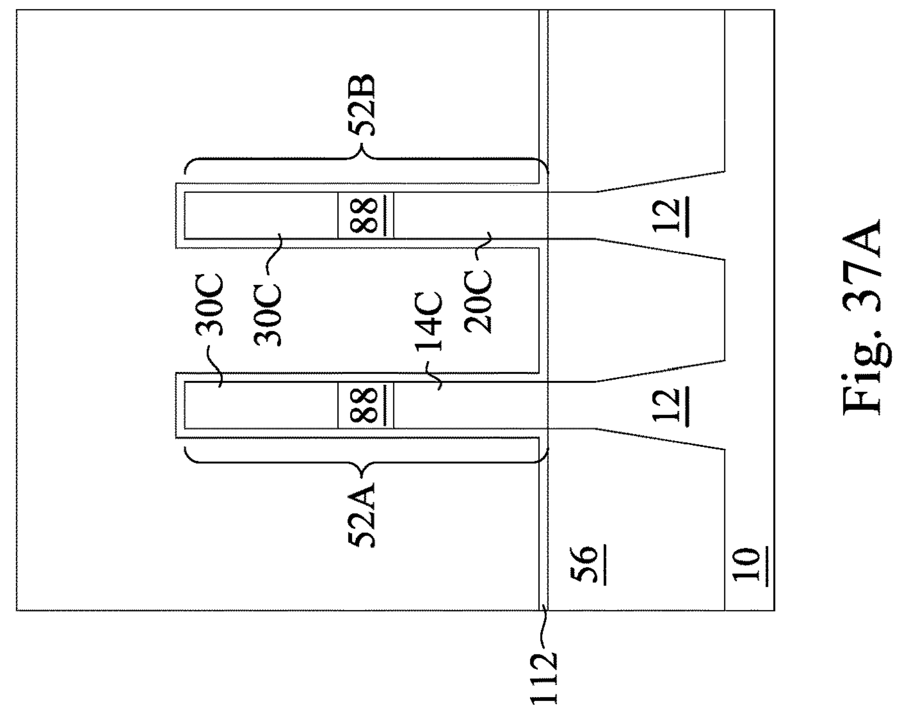
Figure 38:
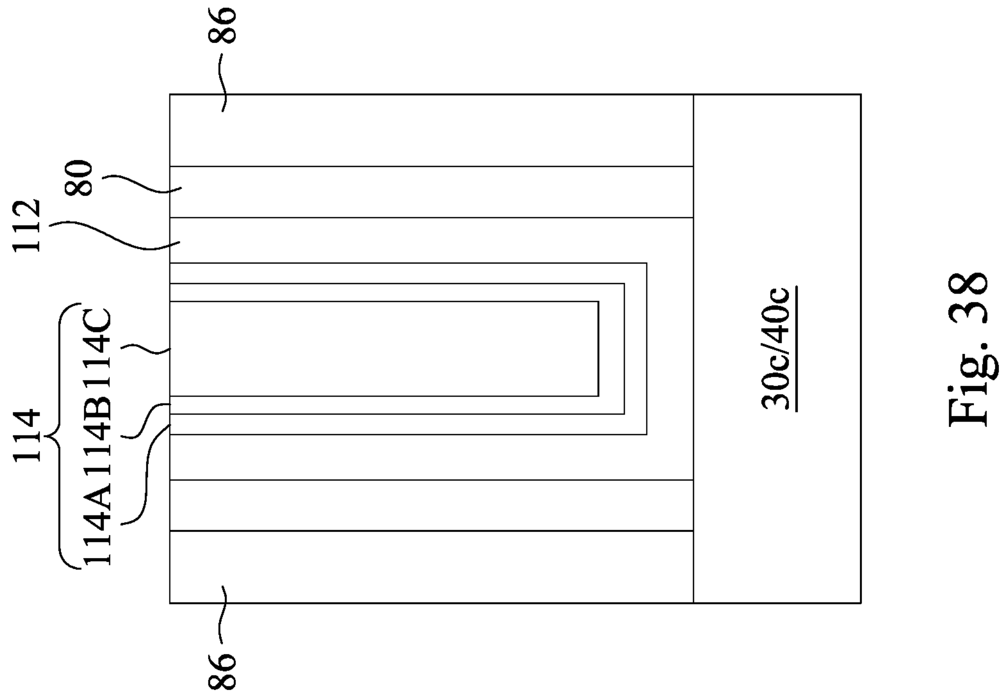

In FIGS. 37A and 37B, gate dielectric layers 112 and gate electrodes 114 are formed for replacement gates. FIG. 38 illustrates a detailed view of region F38 of FIG. 37B. Gate dielectric layers 112 include one or more layers deposited in the recesses 110, such as on the top surfaces and the sidewalls of the fins 52 and on sidewalls of the gate seal spacers 80/gate spacers 86. The gate dielectric layers 112 may also be formed on the top surface of the isolation structure 104. In some embodiments, the gate dielectric layers 112 comprise one or more dielectric layers, such as one or more layers of silicon oxide, silicon nitride, metal oxide, metal silicate, or the like. For example, in some embodiments, the gate dielectric layers 112 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 112 may include a dielectric layer having a k value greater than about 7.0. The formation methods of the gate dielectric layers 112 may include Molecular-Beam Deposition (MBD), ALD, PECVD, and the like. In embodiments where portions of the dummy dielectric layer 60 remains in the recesses 110, the gate dielectric layers 112 include a material of the dummy dielectric layer 60 (e.g., $SiO_2$).

The gate electrodes 114 are deposited over the gate dielectric layers 112, respectively, and fill the remaining portions of the recesses 110. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 114 is illustrated in FIG. 37B, the gate electrode 114 may comprise any number of liner layers 114A, any number of work function tuning layers 114B, and a fill material 114C as illustrated by FIG. 38. The liner layers 114A, work function tuning layers 114B, and/or fill material 114C may be suited for a PFET device. After the filling of the recesses 110, a planarization process, such as a CMP, may be performed to remove the excess portions of the gate dielectric layers 112 and the material of the gate electrodes 114, which excess portions are over the top surface of the isolation structure 104. The remaining portions of material of the gate electrodes 114 and the gate dielectric layers 112 thus form first replacement gates of the resulting FinFETs. The gate electrodes 114 and the gate dielectric layers 112 may be collectively referred to as a "gate stack." The gate stacks may extend along sidewalls of the channel region 14*c* and/or channel region 20*c* of the fins 52. The gate stacks may also extend along sidewalls of the channel region 30*c* of the fins 52, which may be removed in a subsequent step.

Figure 39B:
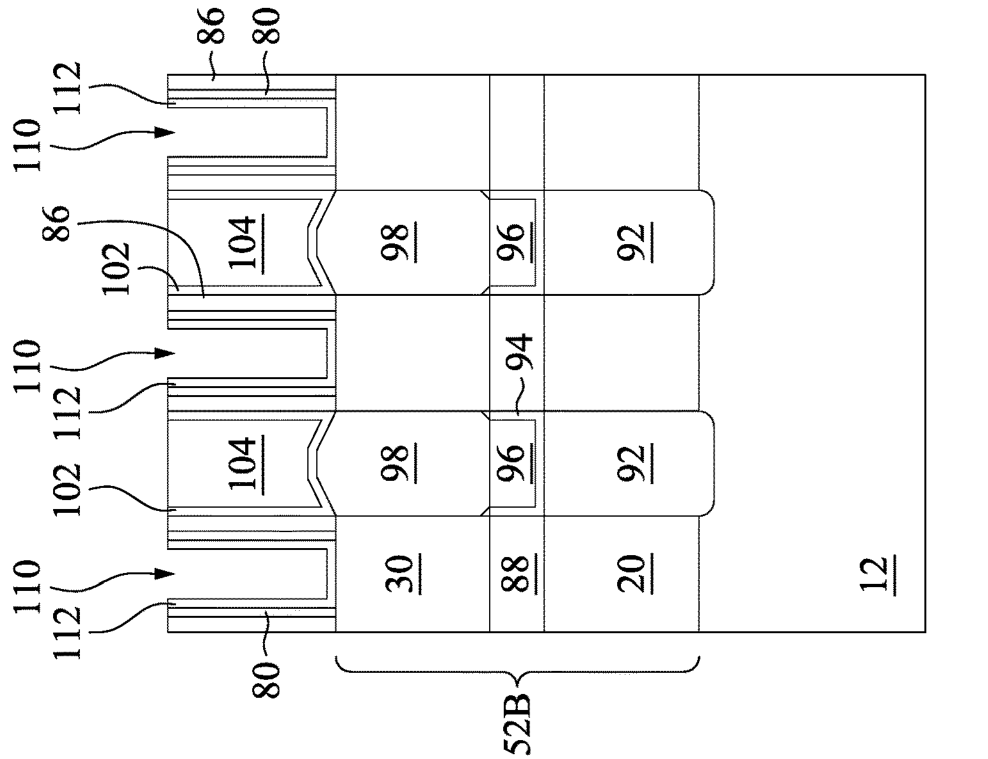
Figure 39A:
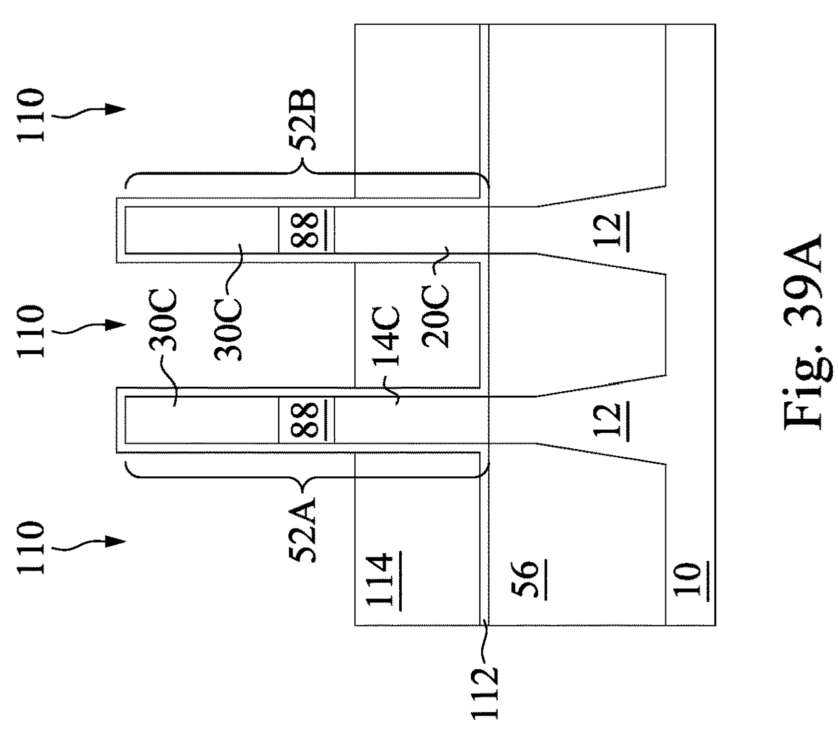

In FIGS. 39A and 39B, the gate electrodes 114 are recessed to form the recesses 110 again so that an upper surface is lower than the lower surface of the channel region 30*c*. In other words, the gate dielectric layers 112 surrounding the channel region 30*c* are made free from the gate electrodes 114. As noted above, the gate electrodes 114 may include materials suitable for a PFET device, however the channel region 30*c* is configured for an NFET device. Thus, the gate electrodes 114 are recessed to remove them from around the channel region 30*c*. As illustrated in FIGS. 39A and 39B, in some embodiments, the recessing causes the upper surface of the gate electrodes 114 to be lower than the upper surface of the channel region 14*c* and/or channel region 20*c*. In other embodiments, the upper surface of the gate electrodes 114 abuts a sidewall of the insulating material 88. In other words, the upper surface of the gate electrodes 114 is disposed between the upper surface of the insulating material 88 and the lower surface of the insulating material 88. A dry or wet etch may be used to recess the gate electrodes 114. In some embodiments a timed etch is used. In some embodiments, the gate electrodes 114 are not formed to completely fill the recesses 110 (FIGS. 36A and 36B) and the etch time can be reduced or eliminated.

Figure 40B:
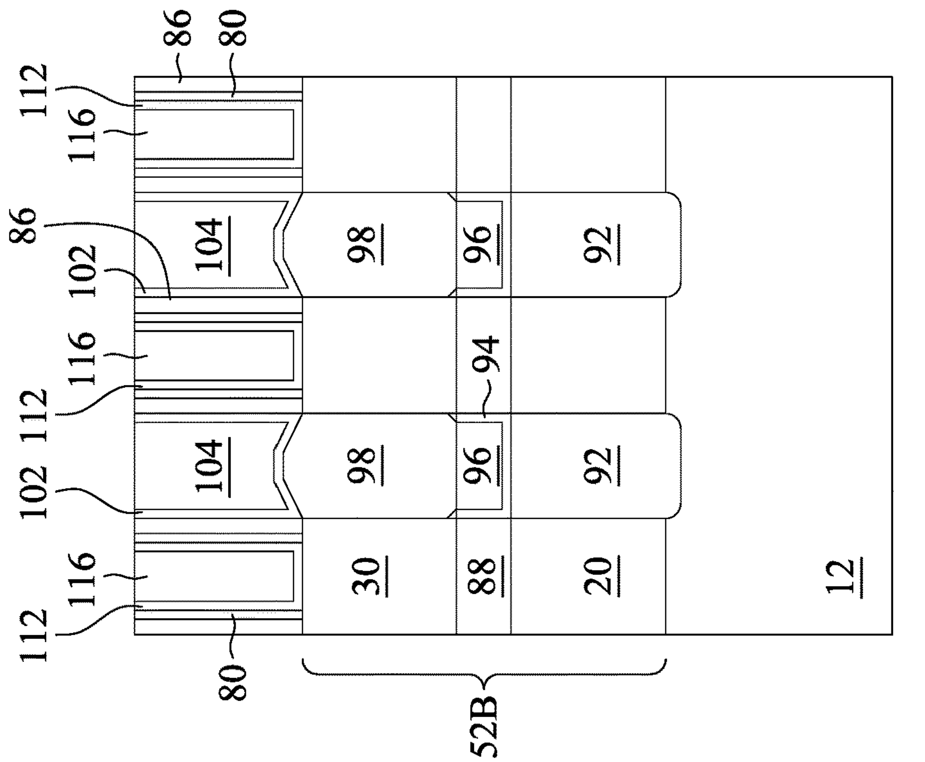
Figure 40A:
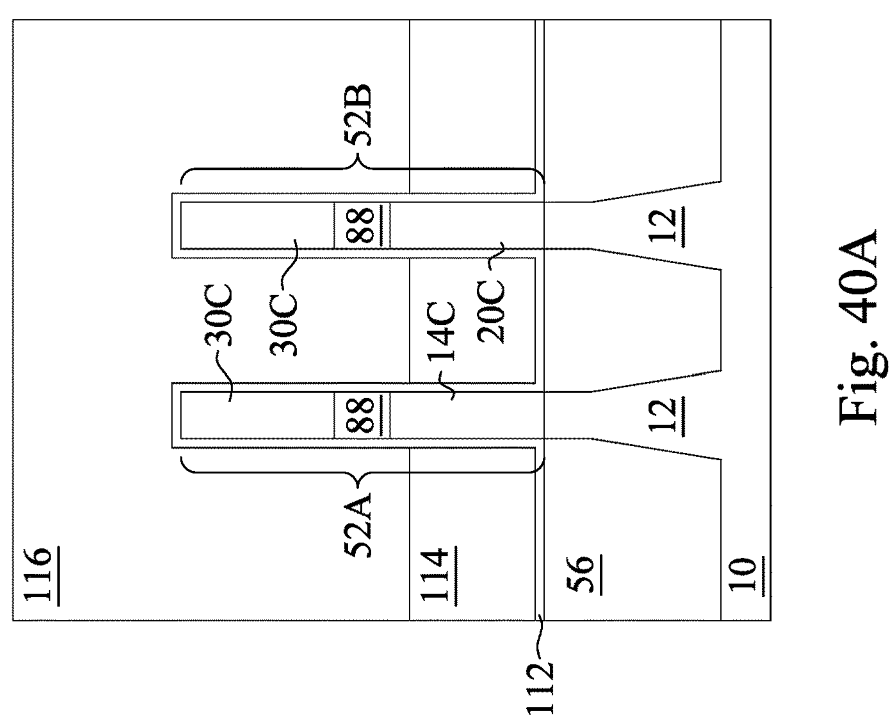

In FIGS. 40A and 40B, an isolation structure 116 is formed in the recesses 110 on the gate electrodes 114. The isolation structure 116 may fill or partially fill the recesses over the gate electrodes 114. The isolation structure 116 may be deposited using materials and by any suitable process, such as by CVD, ALD, flowable CVD, spin-on, PVD, sputtering, combinations thereof, or the like. The material used for the isolation structure 116 may be any suitable insulating material such as those used for the isolation structure 96 and/or isolation structure 104.

Figure 41B:
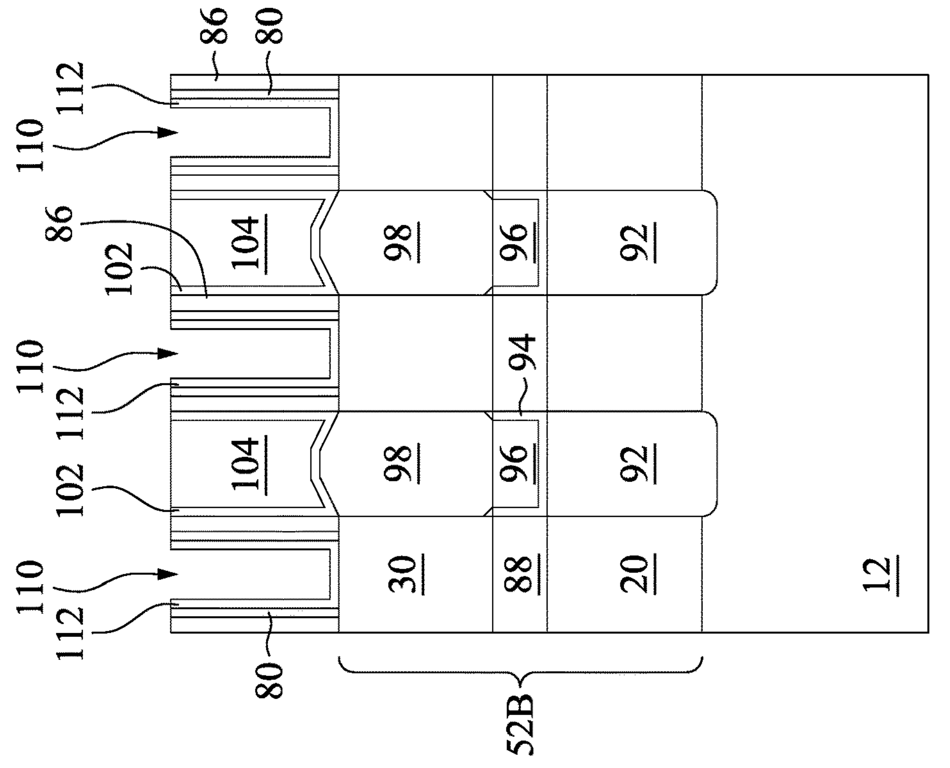
Figure 41A:
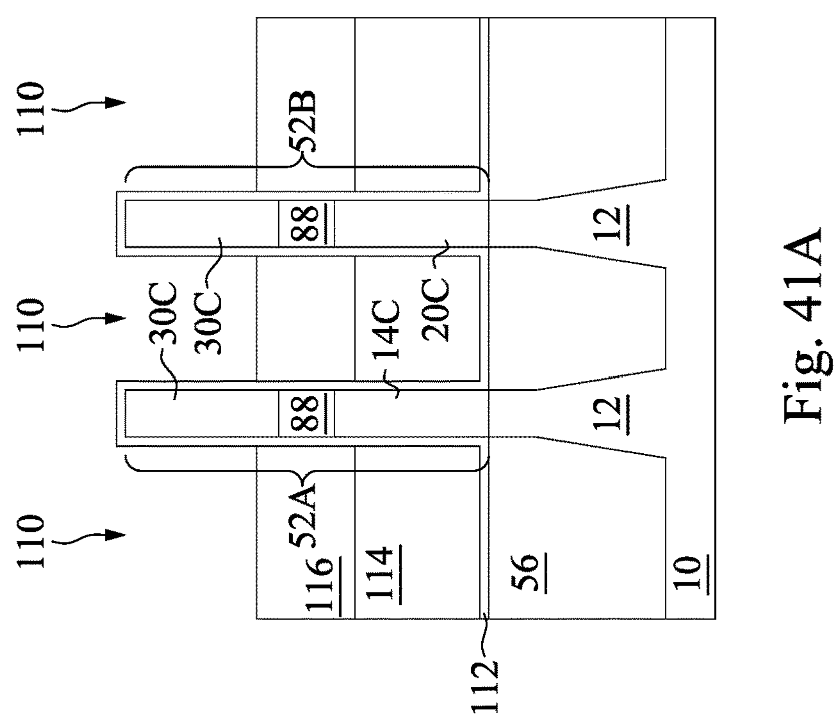

In FIGS. 41A and 41B, the isolation structure 116 may be recessed to form the recesses 110 again so that the upper surface of the isolation structure 116 is higher than the lower surface of the insulating material 88. As illustrated in FIG. 41A, the upper surface of the isolation structure 116 may be higher than the upper surface of the insulating material and slightly overlap the portion of the gate dielectric layer 112 surrounding the channel region 30*c*. The isolation structure 116 may not need to be recessed in some embodiments, such as when forming the isolation structure 116 to have an acceptable thickness. The isolation structure 116 may be recessed by an etching technique, such as by a dry or wet etch. In some embodiments, the isolation structure 104 and other areas not etched may be masked to protect them from being etched while recessing the isolation structure 116.

Figure 42B:
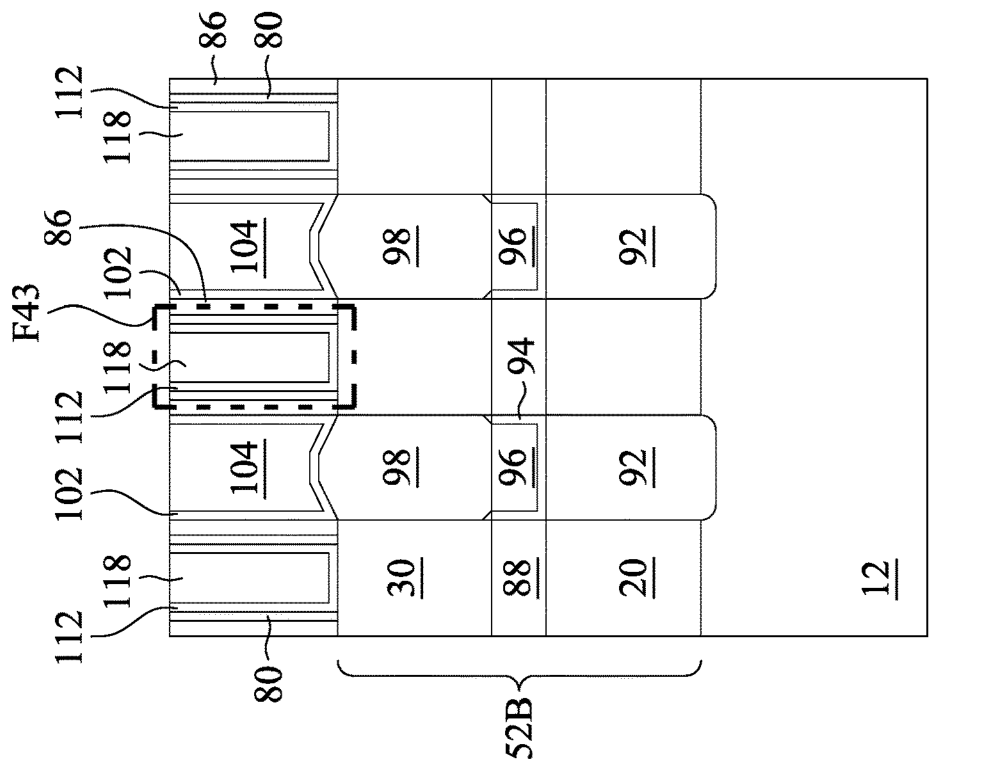
Figure 42A:
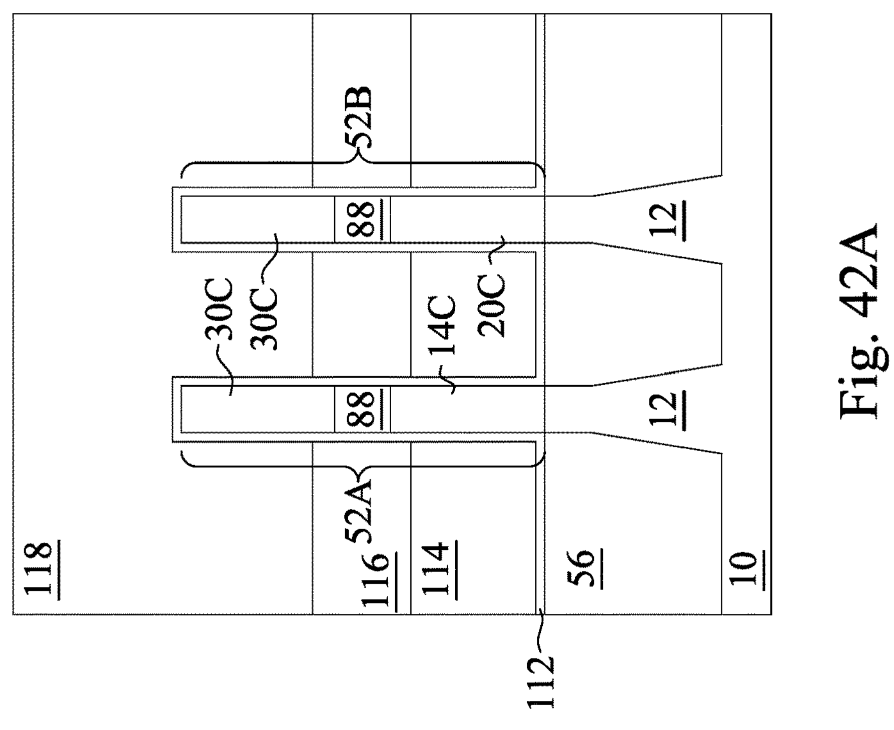
Figure 43:
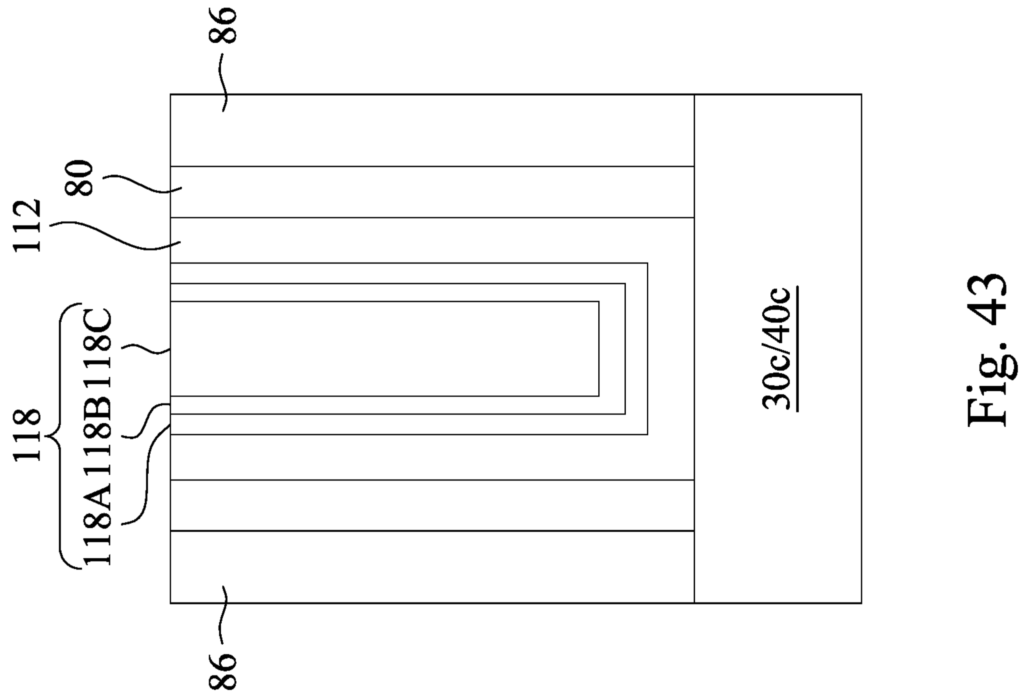

In FIGS. 42A and 42B, gate electrodes 118 are formed for replacement gates for the NFET. FIG. 43 illustrates a detailed view of region F43 of FIG. 42B. The gate electrodes 118 are deposited over the isolation structure 116 and on a portion of the gate dielectric layers 112 which abut the channel region 30*c* and fill the remaining portions of the recesses 110. The gate electrodes 118 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 118 is illustrated in FIG. 37B, the gate electrode 118 may comprise any number of liner layers 118A, any number of work function tuning layers 118B, and a fill material 118C as illustrated by FIG. 43. The liner layers 118A, work function tuning layers 118B, and/or fill material 118C may be suited for an NFET device. After the filling of the recesses 110, a planarization process, such as a CMP, may be performed to remove the excess portions of the gate dielectric layers 112 (if any) and the material of the gate electrodes 118, which excess portions are over the top surface of the isolation structure 104. The remaining portions of material of the gate electrodes 118 and the portion of the gate dielectric layers 112 surrounding the channel region 30*c* thus form second replacement gates of the resulting FinFETs. The gate electrodes 118 and the gate dielectric layers 112 may be collectively referred to as a "gate stack." The gate stacks may extend along sidewalls of the channel region 30*c* of the fins 52.

Figure 44B:
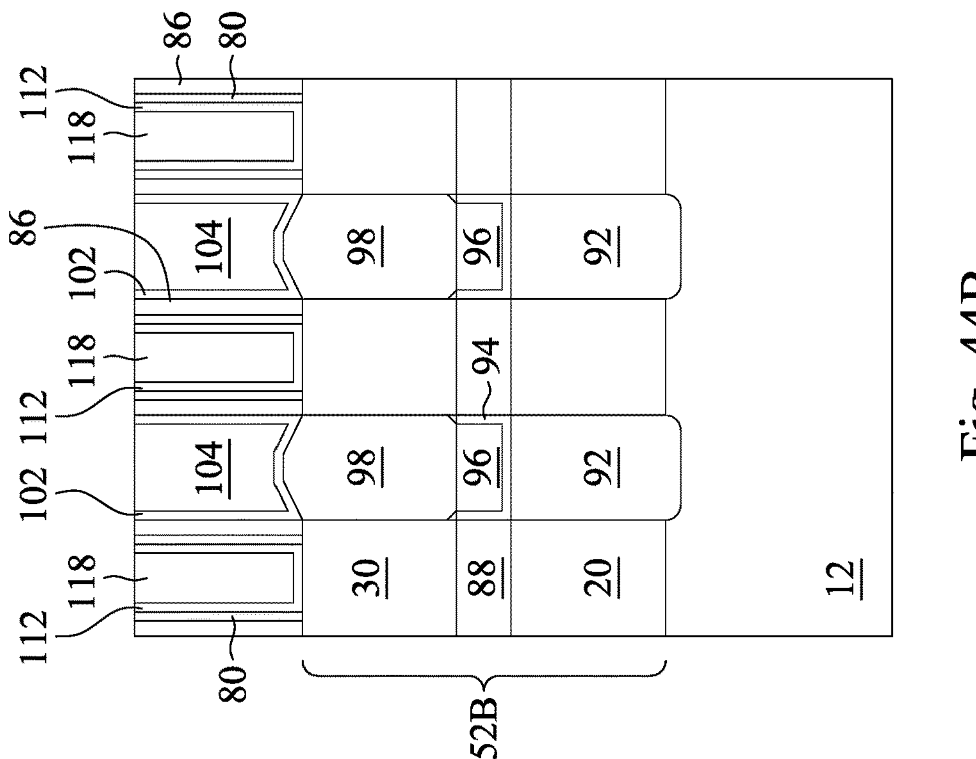
Figure 44A:
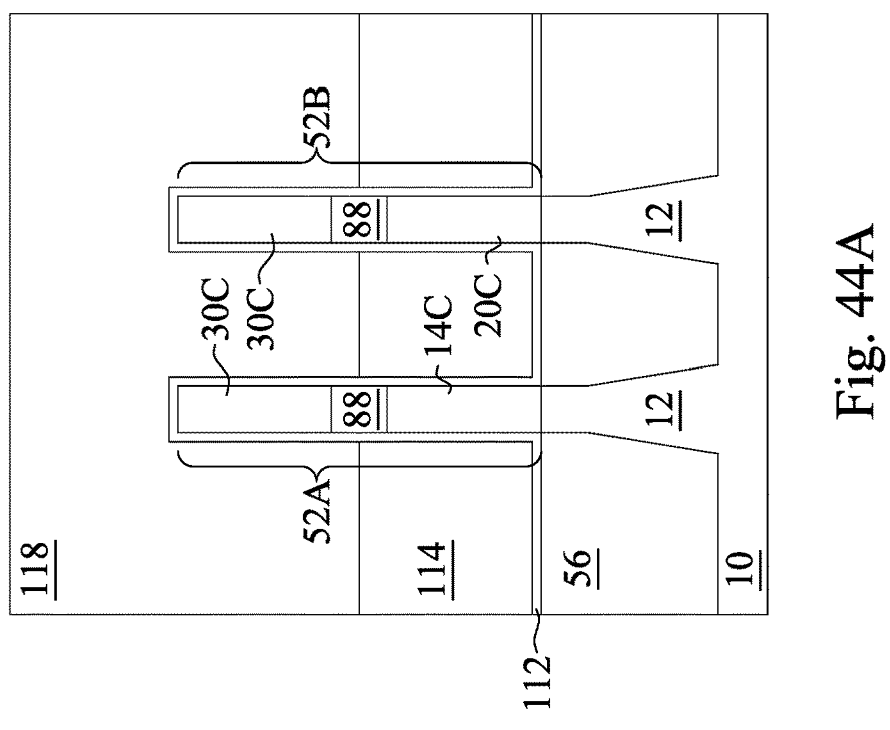

In FIGS. 44A and 44B, rather than include the isolation structure 116 to isolate the gate electrodes 114 from the gate electrodes 118, the isolation structure 116 is omitted. That is, after recessing the gate electrodes 114, the gate electrodes 118 are formed directly on the gate electrodes 114. This provides a common gate connection scheme, where a single gate contact may be used to switch on both the NFET and PFET at the same time. Since the gate electrodes 114 are suited for a PFET and the gate electrodes 118 are suited for an NFET, the resulting transistors will function better if the gate electrodes 114 abutting the gate dielectric layer 112 do not abut the portion of the gate dielectric layer 112 which surrounds the channel region 30*c* and the gate electrodes 118 abutting the gate dielectric layer does not abut the portion of the gate dielectric layer 112 which surrounds the channel region 14*c* and/or channel region 20*c*. As such, when recessing the gate electrodes 114 to make room to deposit the gate electrodes 118, the upper surface of the gate electrodes 114 should abut the sidewalls of the portion of the gate dielectric layer which surrounds the insulating material 88. In other words, the upper surface of the gate electrodes 114 should be disposed between the upper surface and lower surface of the insulating material 88.

Figure 45B:
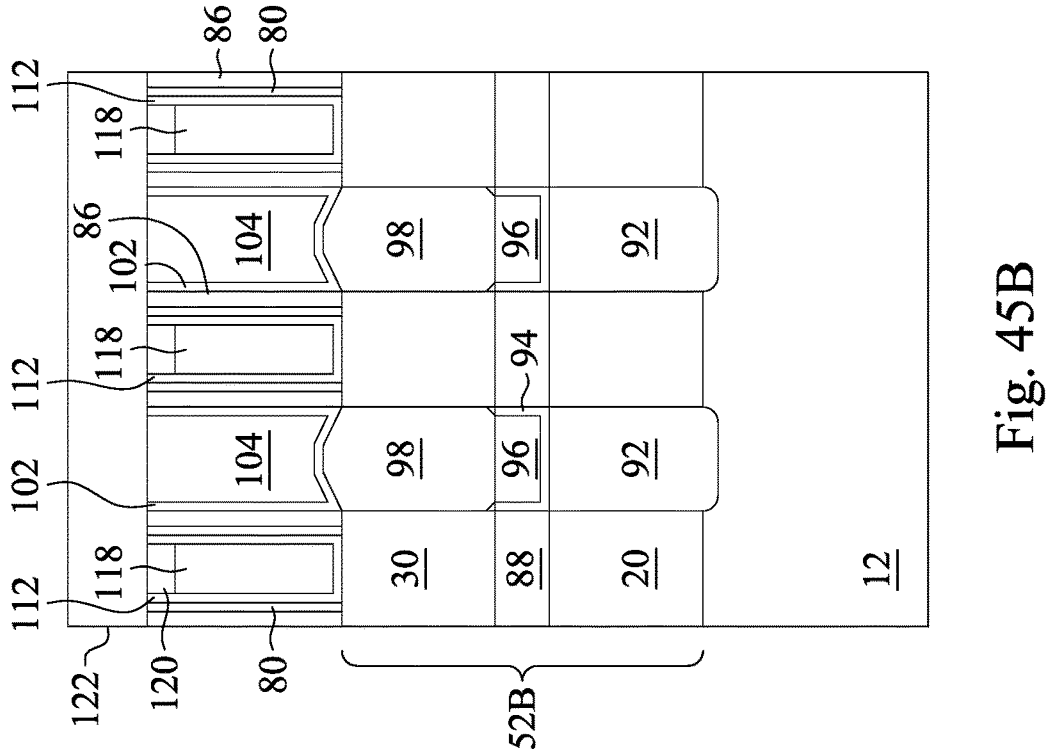
Figure 45A:
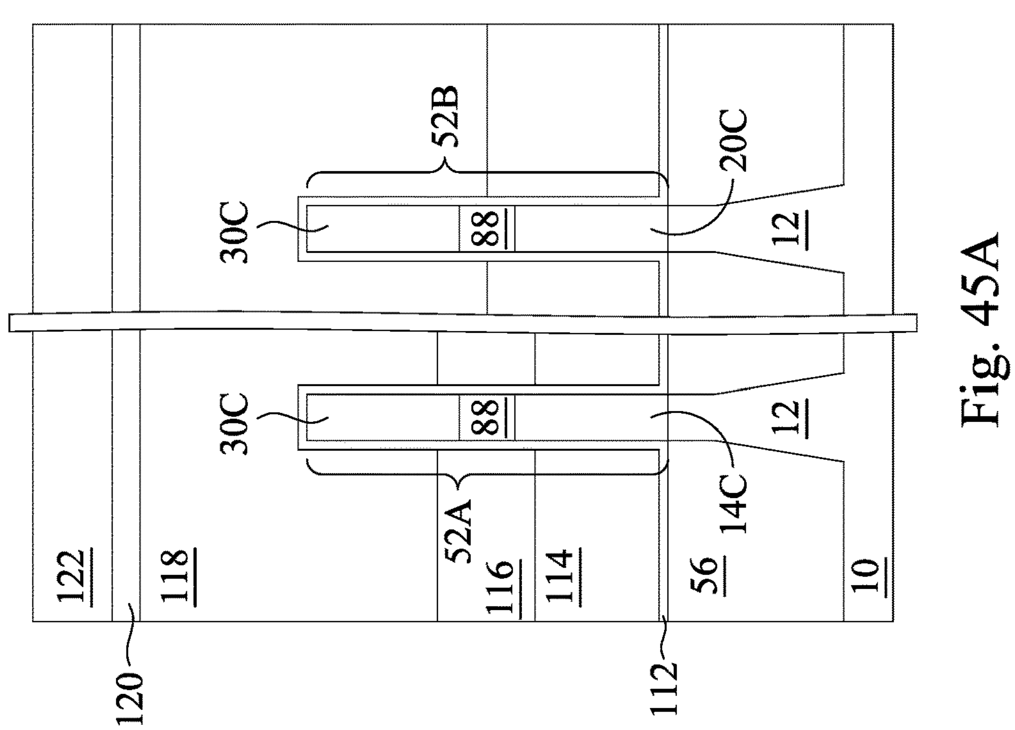
Figure 46B:
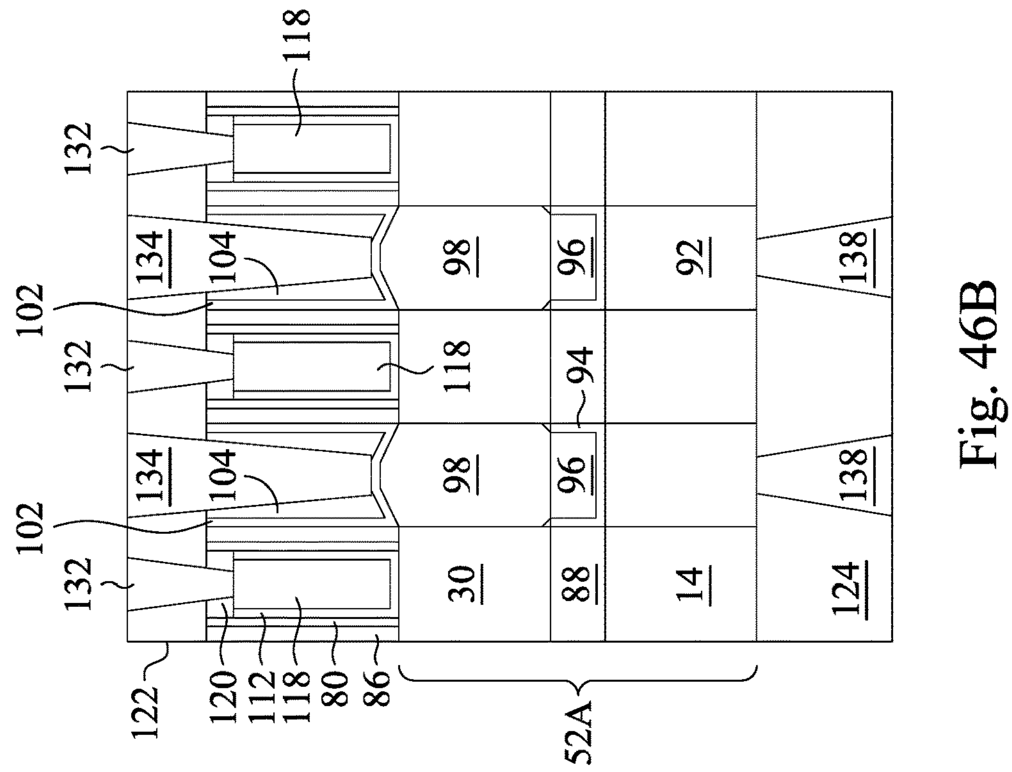
Figure 46A:
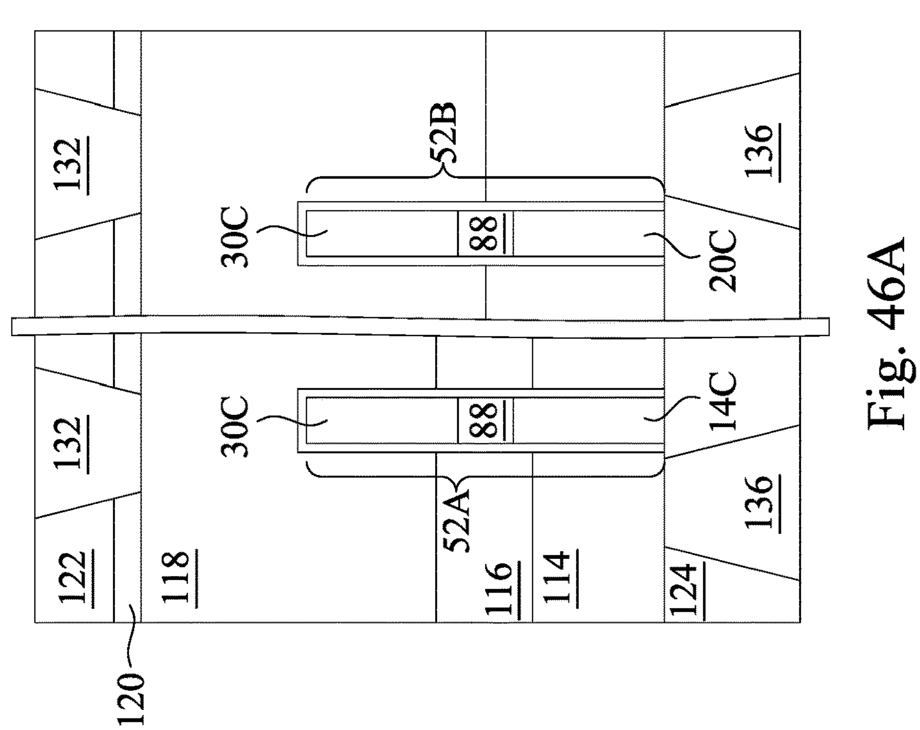
Figure 46D:
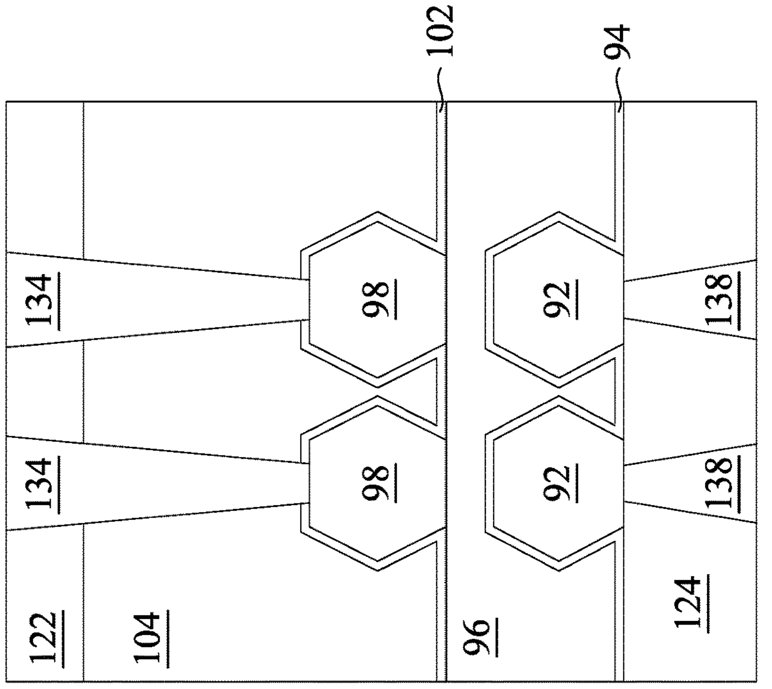
Figure 46C:
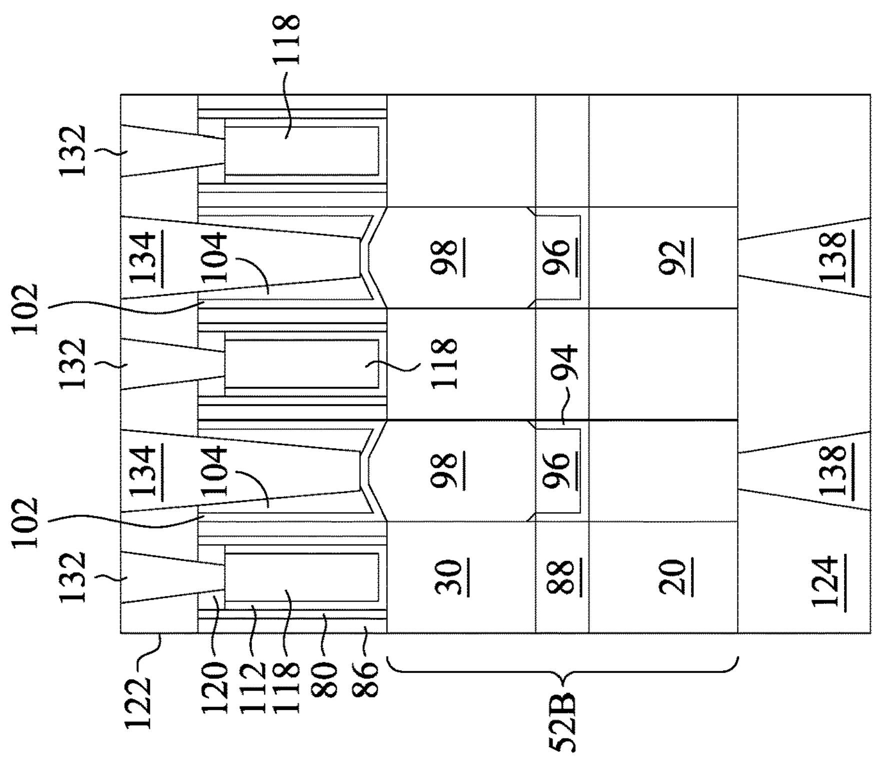

FIGS. 45A and 45B illustrates the formation of a gate mask 120 and isolation region 122. It should be noted that FIGS. 45A and 46A present combined views based on the structures of FIG. 42A and FIG. 44A which are provided for the sake of simplicity. The gate mask 120 is formed over the gate stack (including the gate dielectric layer 112 and the corresponding gate electrode 118), and the gate mask may be disposed between opposing portions of the gate spacers 86. In some embodiments, forming the gate mask 120 includes recessing the gate stack so that a recess is formed directly over the gate stack and between opposing portions of gate spacers 86. The gate mask 120 may include one or more layers of dielectric material, such as silicon nitride, silicon oxynitride, or the like, deposited in the recess, followed by a planarization process to remove excess portions of the dielectric material extending over the isolation structure 104. The gate mask 120 is optional and may be omitted in some embodiments. In such embodiments, the gate stack may remain level with top surfaces of the isolation structure 104.

As also illustrated in FIGS. 45A and 45B, a second isolation structure 122 is deposited over the first isolation structure 104. In some embodiments, the second isolation structure 122 is a flowable film formed by a flowable CVD method. In some embodiments, the second isolation structure 122 is formed of a dielectric material such as PSG, BSG, BPSG, USG, or the like, and may be deposited by any suitable method, such as CVD and PECVD. The subsequently formed gate contacts 132 (FIGS. 46A, 46B, 46C, and 46D) penetrate through the second isolation structure 122 and the gate mask 120 (if present) to contact the top surface of the recessed gate electrode 118.

In FIGS. 46A, 46B, 46C, and 46D, gate contacts 132 (and/or 136), source/drain contacts 134, and source/drain contacts 138 are formed. The gate contacts 132 and the source/drain contacts 134 are formed on the upper side (e.g., to the NFET gate electrode 118 and NFET epitaxial source/drain regions 98, respectively). The gate contacts 136 and the source/drain contacts 138 are formed on the lower side (e.g., to the PFET gate electrode 114 and PFET epitaxial source/drain regions 92, respectively). Openings for the source/drain contacts 134 are formed through the first isolation structure 104 and through the second isolation structure 122, and openings for the gate contacts 132 are formed through the second isolation structure 122 and the gate mask 120 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second isolation structure 122. The remaining liner and conductive material form the source/drain contacts 134 and gate contacts 132 in the openings. An anneal process may be performed to form a silicide at the interface between the epitaxial source/drain regions 98 and the source/drain contacts 134. The source/drain contacts 134 are physically and electrically coupled to the epitaxial source/drain regions 98, and the gate contacts 132 are physically and electrically coupled to the gate electrodes 118. The source/drain contacts 134 and gate contacts 132 may be formed in different processes, or may be formed in the same process. Although shown as being formed in the same cross-sections (e.g., in FIGS. 46B and 46C), it should be appreciated that each of the source/drain contacts 134 and gate contacts 132 may be formed in different cross-sections, which may avoid shorting of the contacts.

Before or after forming the source/drain contacts 134 and gate contacts 132, the source/drain contacts 138 and gate contacts 136 may be formed. To form the source/drain contacts 138 and gate contacts 136, the substrate 10 (see FIGS. 45A and 45B) may be removed by any suitable process, such as a grinding process and/or CMP process. After removing the substrate 10, the STI regions 56 and lower fins 12 may be recessed and/or removed by any suitable process, such as by continuing to grind the STI regions and lower fins 12 until they are removed. Alternatively, the lower fins 12 may be selectively removed by an etching technique and the openings left refilled with insulating material such as used in the STI region 56. In such embodiments, the STI region 56 may be left intact or may be partially removed, e.g., thinned.

After recessing and/or removing the STI region 56 and the lower fins 12, a third isolation structure 124 may be deposited to cover the gate dielectric layer 112 and/or gate electrode 114, as well as the epitaxial source/drain regions 92. In embodiments where the STI region 56 is left at least in part and the lower fins 12 removed and refilled, then the STI region 56 and refilled portions thereof become the third isolation structure 124. Openings for the source/drain contacts 138 and separated openings for the gate contacts 136 are formed through the third isolation structure 124. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the third isolation structure 124. The remaining liner and conductive material form the source/drain contacts 138 and gate contacts 136 in the openings. An anneal process may be performed to form a silicide at the interface between the epitaxial source/drain regions 92 and the source/drain contacts 138. The source/drain contacts 138 are physically and electrically coupled to the epitaxial source/drain regions 92, and the gate contacts 136 are physically and electrically coupled to the gate electrodes 114. The source/drain contacts 138 and gate contacts 136 may be formed in different processes, or may be formed in the same process. In embodiments with a common gate electrode, the gate contacts 136 or gate contacts 132 may optionally be omitted, however, even in such embodiments, both gate contacts 132 and gate contacts 136 may be formed. Additional processes may be used to form redistribution structures and metallization patterns both over and under the various contacts to route couple the contacts to other features.

As noted above, FIGS. 47A, 47B, 48A, 48B, 49A, 49B, 50A, 50B, 51A, 51B, 52A, 52B, 53A, 53B, 53C, and 53D illustrate a dummy gate replacement process and contact formation resulting from the structures illustrated in FIGS. 30A, 30B, 30C, and 30D. Like references are used to refer to like elements as those discussed above. As such, many of the details for the processes described below may be taken from the details provided above with respect to FIGS. 36A through 46D, except as noted. For example, the references to the semiconductor layer 30 above are understood as being replaced with the semiconductor layer 40 in the discussion below. Further, the insulating material 88 discussed above is not used, but instead the insulating layer 26 and insulating layer 46 are used, and are understood as being substituted in the details noted above with respect to the insulating material 88.

Figure 47B:
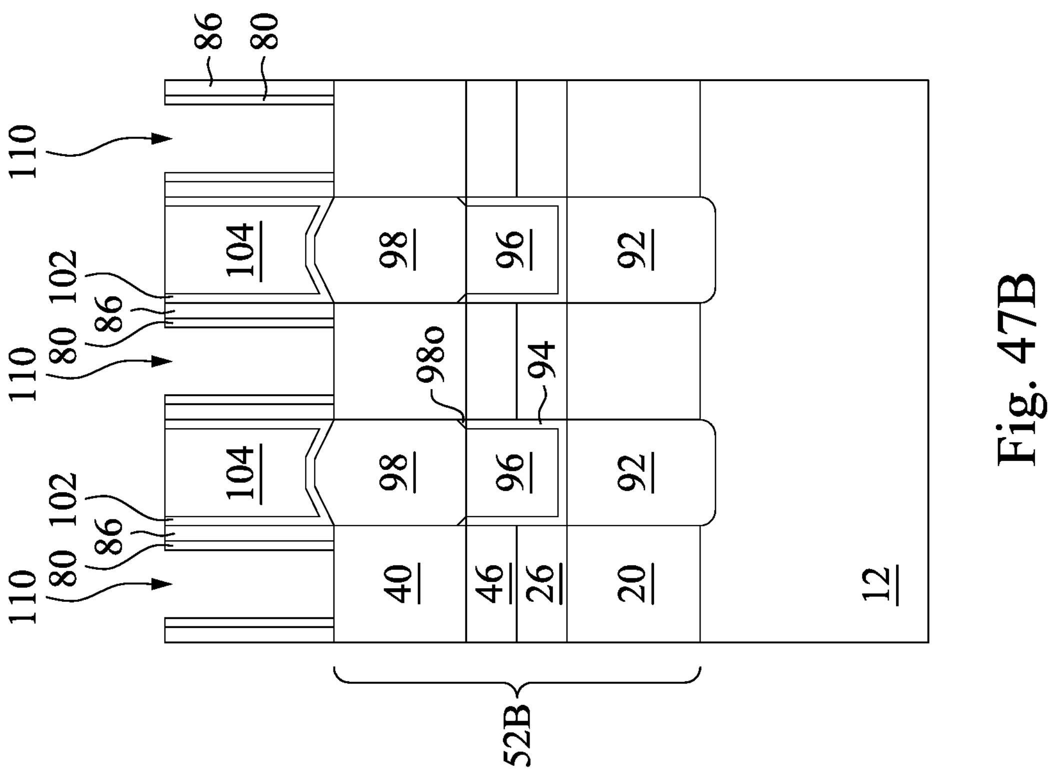
FIGS. 47A, 47B, 48A, 48B, 49A, 49B, 50A, 50B, 51A, 51B, 52A, 52B, 53A, 53B, 53C, and 53D illustrate various cross-sectional views of intermediate steps of a dummy gate replacement process and contact formation in accordance with various embodiments.
Figure 47A:
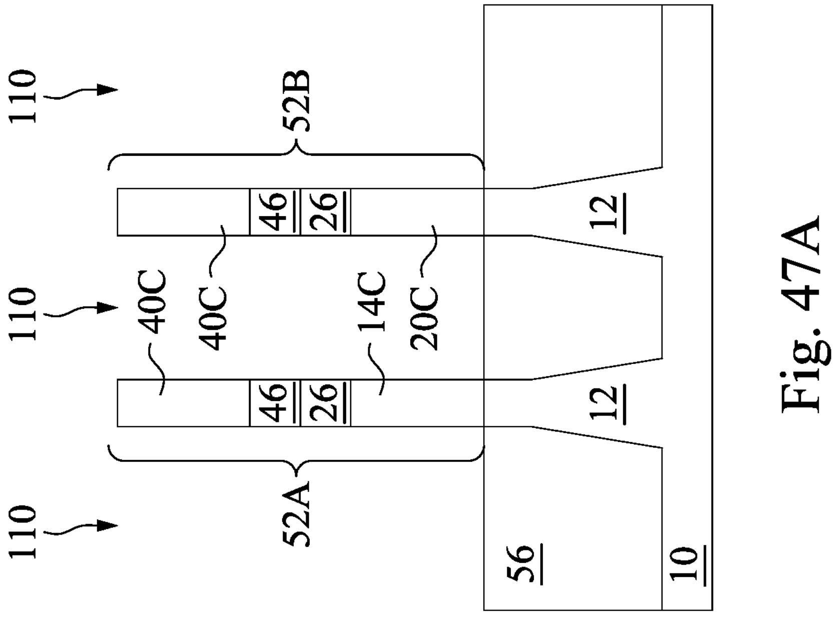

In FIGS. 47A and 47B, the dummy gates 72, the pad layer 74 if present, and the masks 76 if present, are removed in an etching step(s), so that recesses 110 are formed. This process may be completed in a manner similar to that described above with the formation of the recesses 110 with respect to FIGS. 36A and 36B, and therefore not repeated.

Figure 48B:
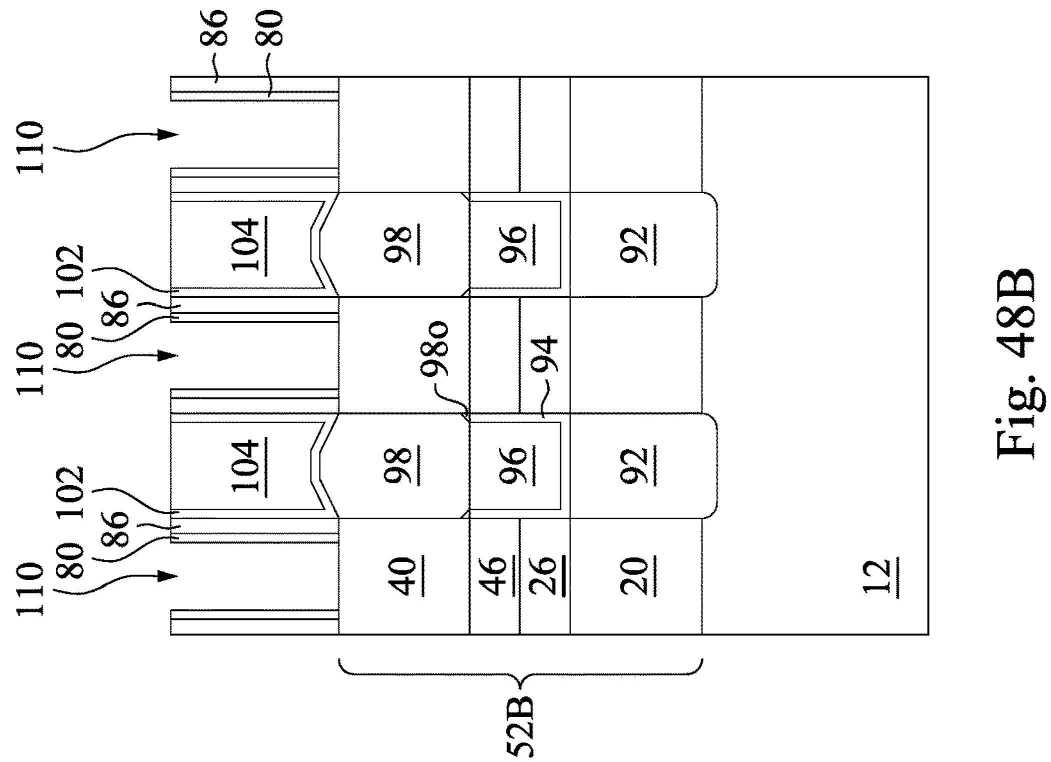
Figure 48A:
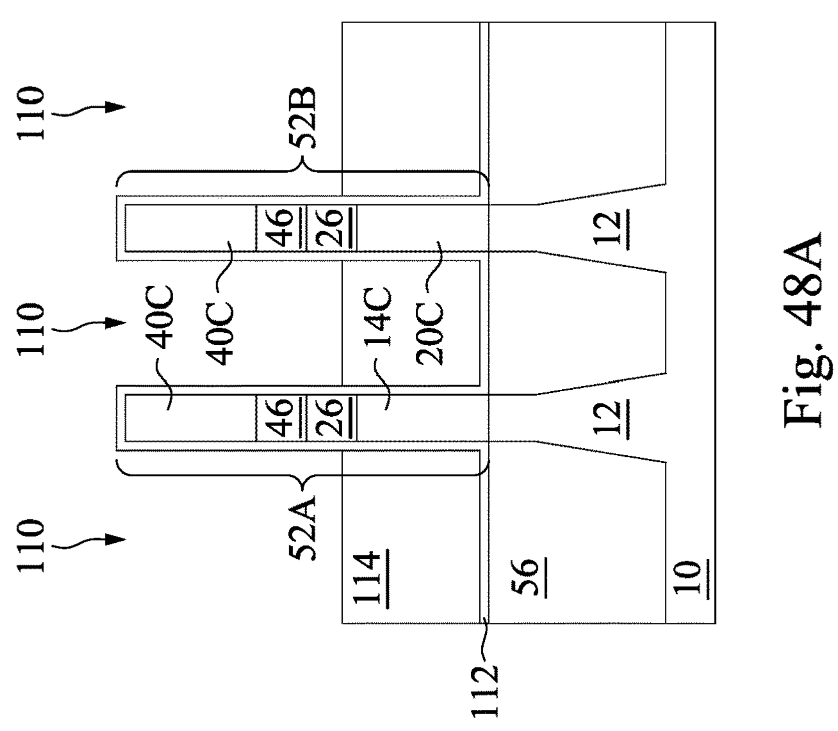

In FIGS. 48A and 48B, the gate dielectric layers 112 and gate electrodes 114 are formed for replacement gates using processes and materials such as those described above with respect to FIGS. 37A and 37B. The discussion and view of FIG. 38 also applies to the gate electrodes 114. Next, the gate electrodes 114 are recessed in a manner similar to that discussed above with respect to FIGS. 39A and 39B to form the recesses 110 again so that an upper surface of the gate electrodes is lower than the lower surface of the channel region 40*c*. The upper surface of the gate electrodes 114 may fall anywhere between the upper surface of the insulating layer 46 and the bottom surface of the insulating layer 26, in some embodiments. In some embodiments, the upper surface of the gate electrodes 114 may be slightly below the upper surface of the channel region 14*c* and/or the channel region 20*c*.

Figure 49B:
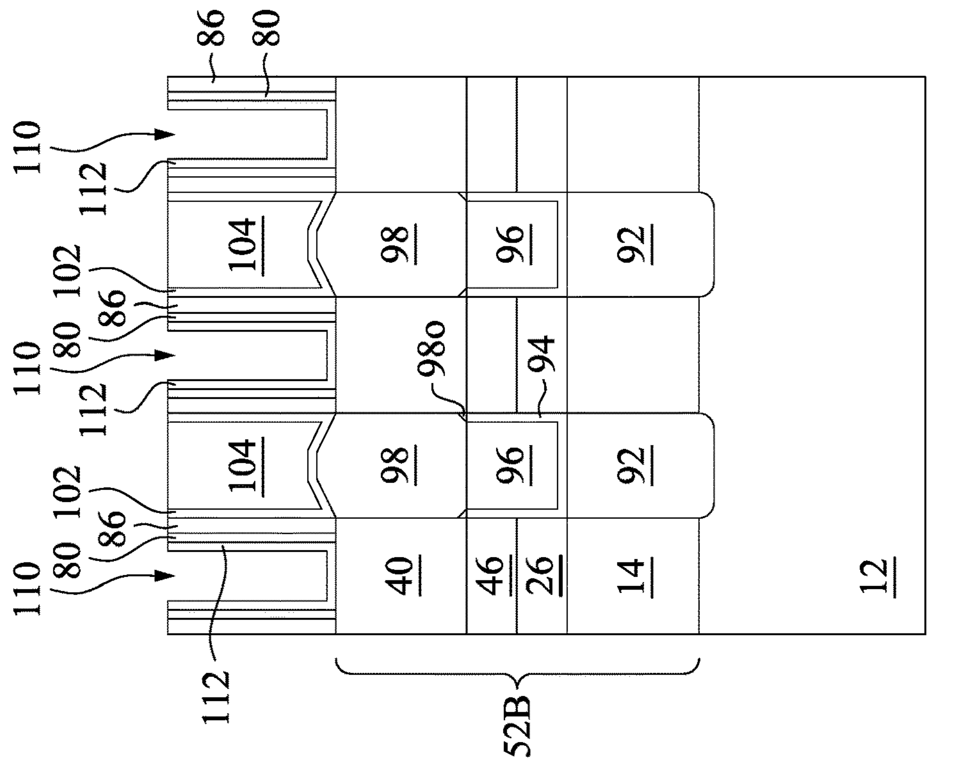
Figure 49A:
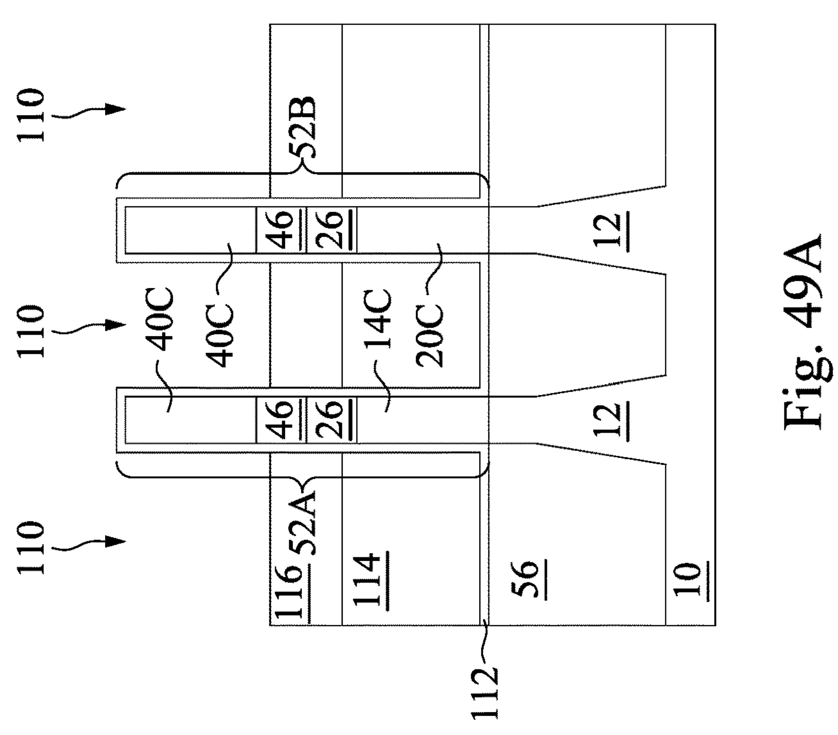

In FIGS. 49A and 49B, an isolation structure 116 is formed in the recesses 110 on the gate electrodes 114. The isolation structure 116 may be formed using processes and materials similar to those discussed with respect to FIGS. 40A and 40B. The isolation structure 116 may fill or partially fill the recesses over the gate electrodes 114. Following the formation of the isolation structure 116, the isolation structure 116 may be recessed in a manner similar to that discussed above with respect to FIGS. 41A and 41B to form the recesses 110 again so that the upper surface of the isolation structure 116 is higher than the lower surface of the insulating layer 26. This provides separation so that the gate electrode 114 of the PFET can be isolated from the gate electrode 118 of the NFET. Also, the isolation structure 116 may have an upper surface which is lower than the upper surface of the insulating layer 46 or lower than the upper surface of the insulating layer 26, in some embodiments. In other embodiments, the isolation structure 116 may have an upper surface which is slightly above the upper surface of the insulating layer 46, such as analogously illustrated in FIG. 41A, with respect to the insulating material 88.

Figures 50A, 50B:
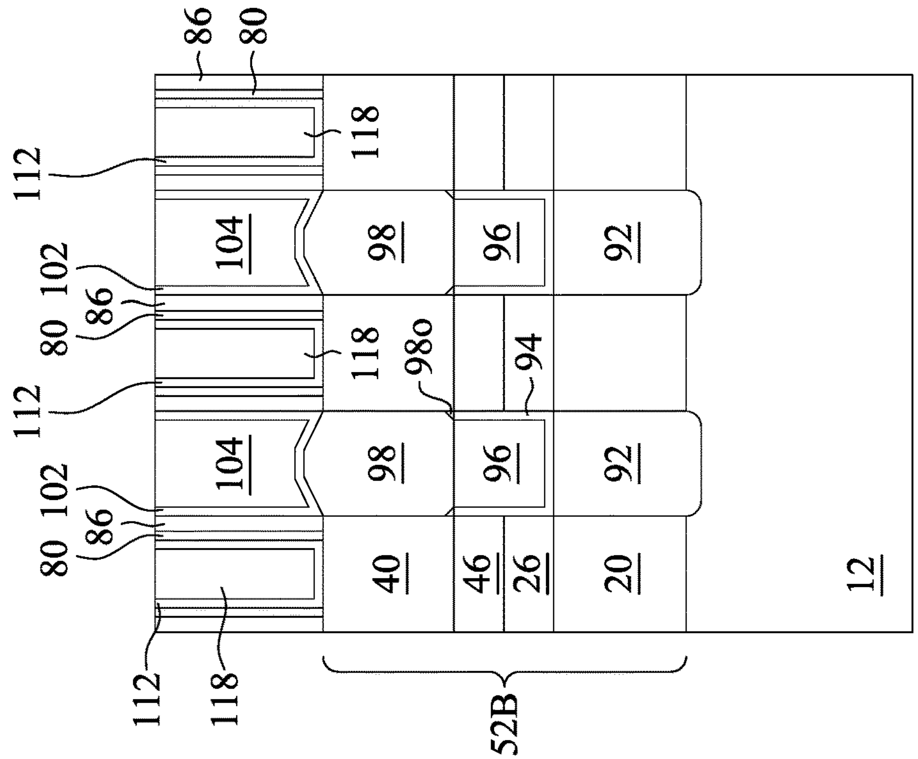

In FIGS. 50A and 50B, the gate electrodes 118 are formed for replacement gates using processes and materials such as those described above with respect to FIGS. 42A and 42B. The discussion and view of FIG. 43 also applies to the gate electrodes 118.

Figure 51B:
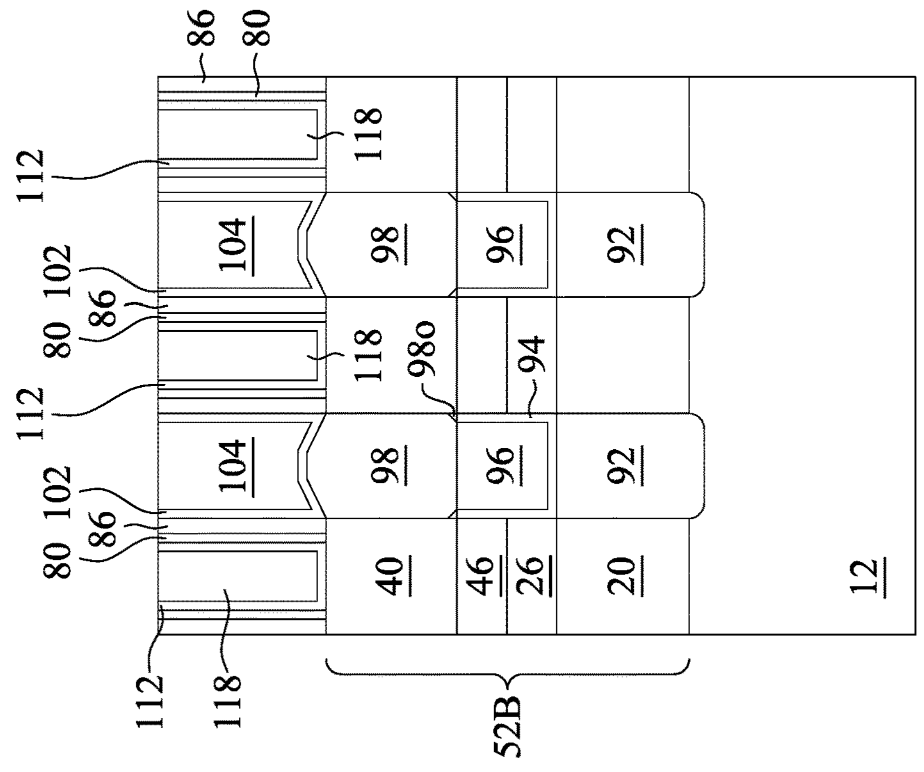
Figure 51A:
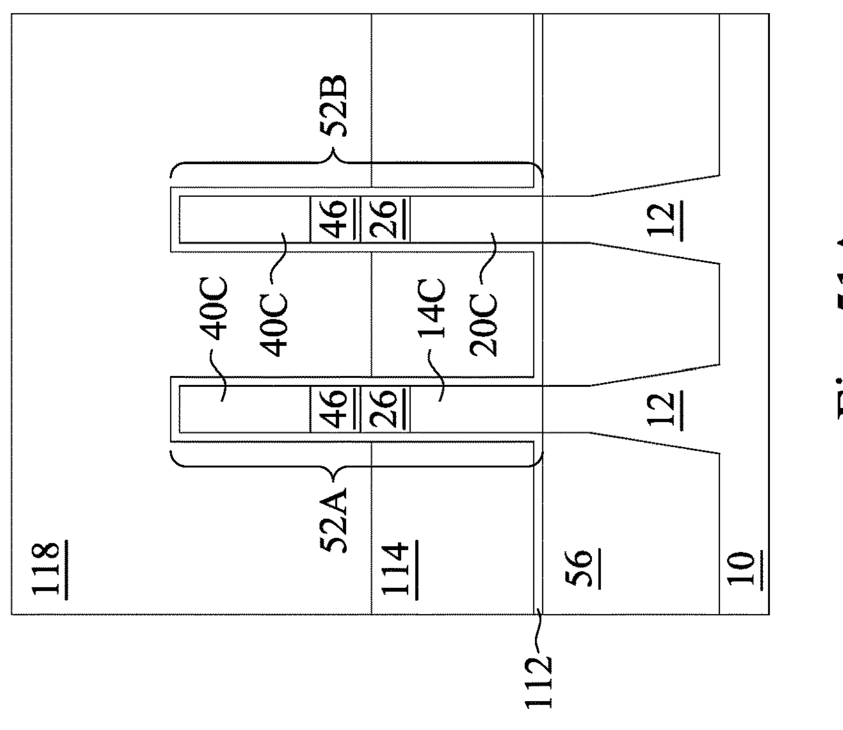

In FIGS. 51A and 51B, rather than include the isolation structure 116 to isolate the gate electrodes 114 from the gate electrodes 118, the isolation structure 116 is omitted, such as illustrated and discussed above with respect to FIGS. 44A and 44B. That is, after recessing the gate electrodes 114, the gate electrodes 118 are formed directly on the gate electrodes 114. This provides a common gate connection scheme, where a single gate contact may be used to switch on both the NFET and PFET at the same time. Similar to that discussed above with respect to FIGS. 44A and 44B, in such embodiments, the interface between the gate electrode 118 and gate electrode 114 may be between the upper surface of the insulating layer 46 and the lower surface of the insulating layer 26.

Figure 52B:
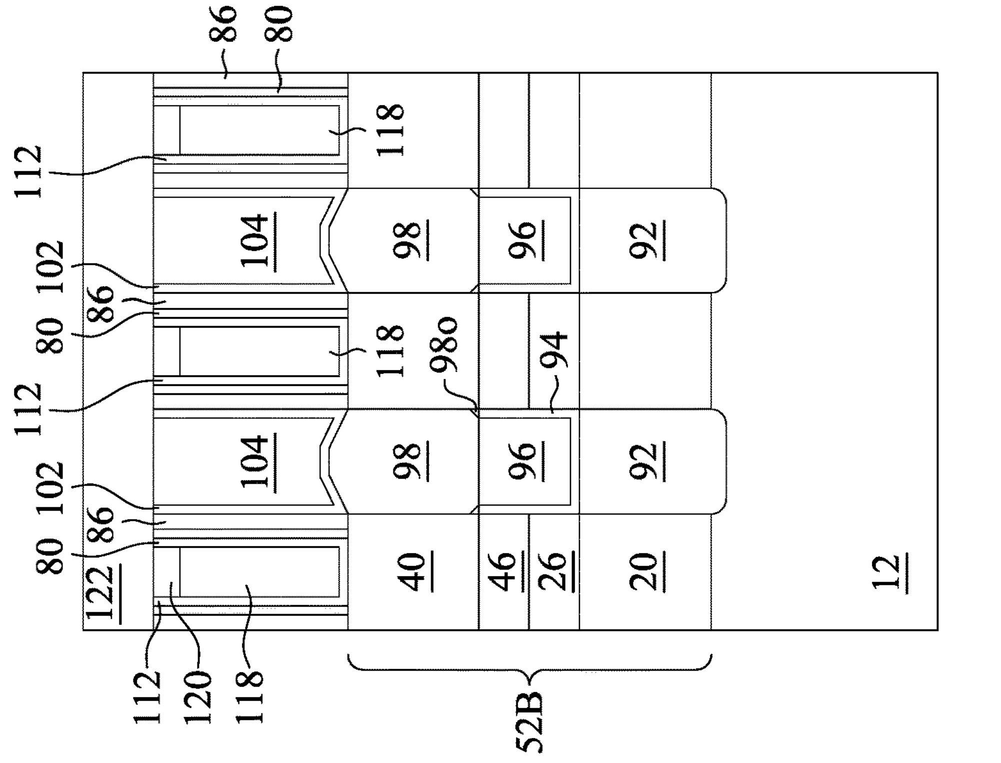
Figure 52A:
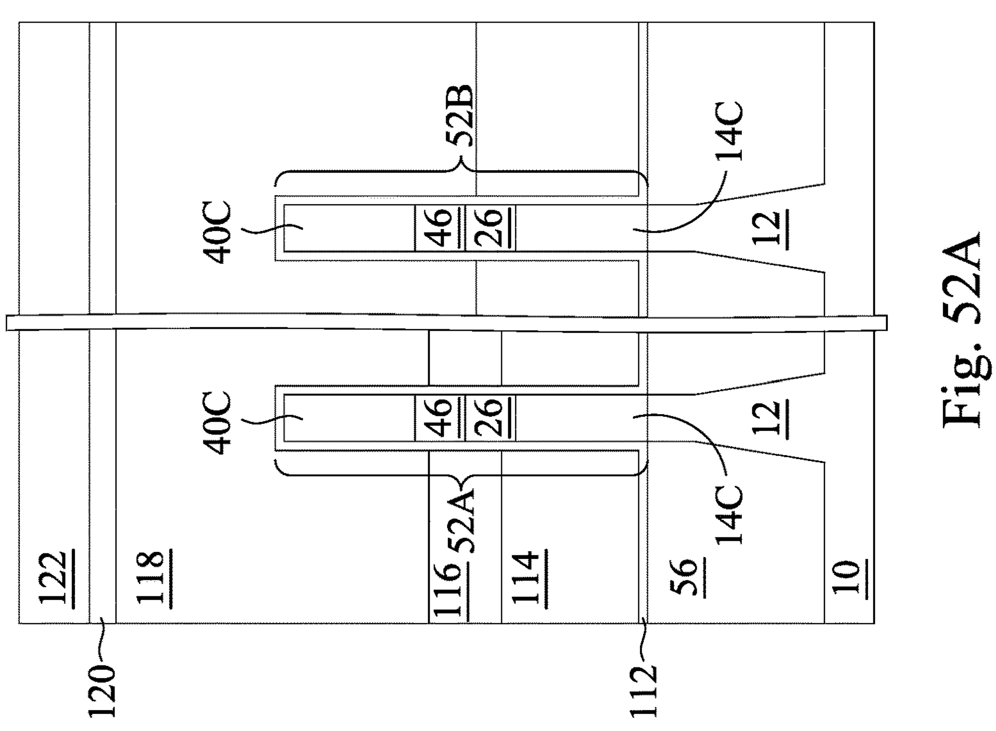
Figures 53A, 53B:
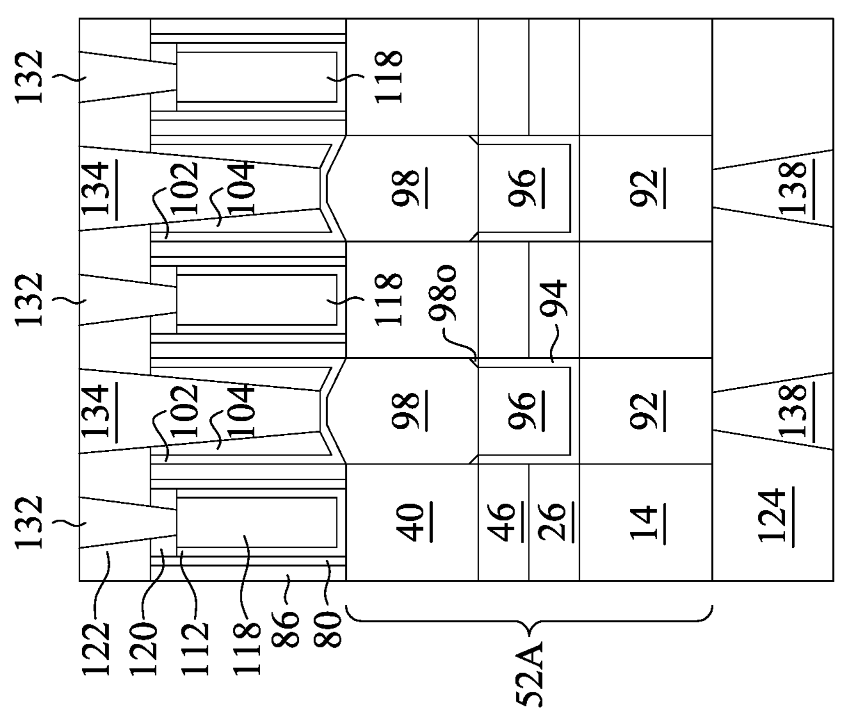
Figure 53D:
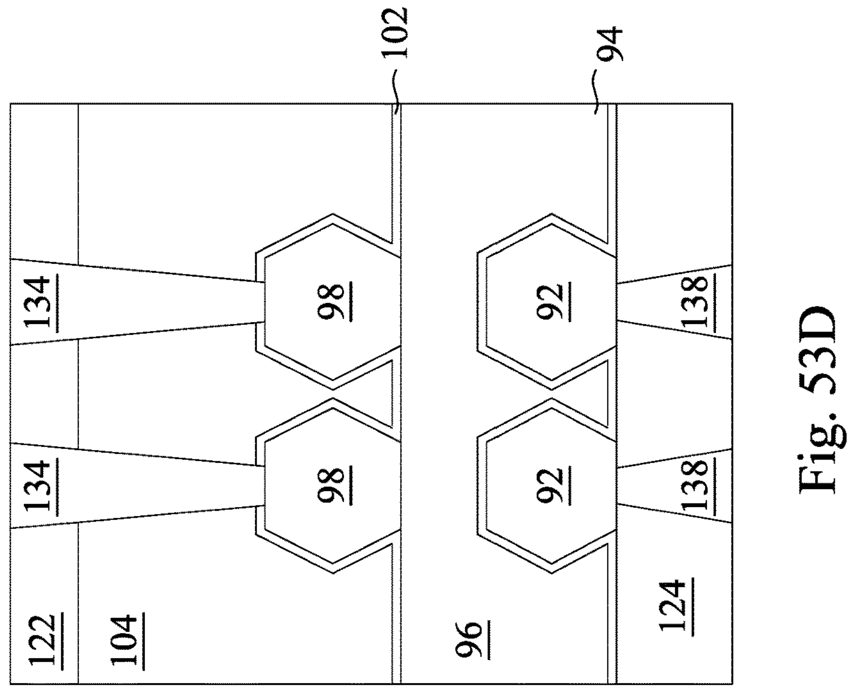
Figure 53C:
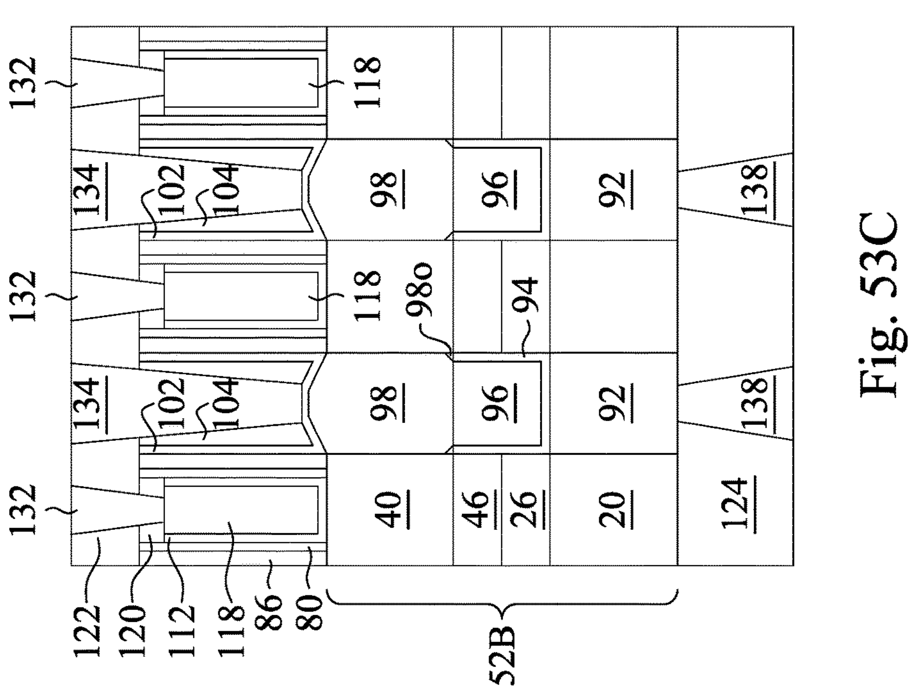

In FIGS. 52A and 52B, a gate mask 120 and isolation region 122 are formed in a manner similar to that discussed above with respect to FIGS. 45A and 45B. It should be noted that FIGS. 52A and 53A present combined views based on the structures of FIG. 50A and FIG. 51A which are provided for the sake of simplicity.

In FIGS. 53A, 53B, 53C, and 53D, gate contacts 132 (and/or 136), source/drain contacts 134, and source/drain contacts 138 are formed. The gate contacts 132 and the source/drain contacts 134 are formed on the upper side (e.g., to the NFET gate electrode 118 and NFET epitaxial source/drain regions 98, respectively). The gate contacts 136 and the source/drain contacts 138 are formed on the lower side (e.g., to the PFET gate electrode 114 and PFET epitaxial source/drain regions 92, respectively). The gate contacts 132 and 136 and the source/drain contacts 134 and 138 may be formed using processes and materials similar to those discussed above with respect to FIGS. 46A, 46B, 46C, and 46D. Additional processes may be used to form redistribution structures and metallization patterns both over and under the various contacts to route couple the contacts to other features.

As noted above, FIGS. 54A, 54B, 55A, 55B, 56A, 56B, 57A, 57B, 58A, 58B, 59A, 59B, 60A, 60B, 60C, and 60D illustrate a dummy gate replacement process and contact formation resulting from the structures illustrated in FIGS. 35A, 35B, 35C, and 35D. Like references are used to refer to like elements as those discussed above. As such, many of the details for the processes described below may be taken from the details provided above with respect to FIGS. 36A through 46D, except as noted. For example, the references to the semiconductor layer 30 above are understood as being replaced with the semiconductor layer 40 in the discussion below. Further, the insulating material 88 discussed above is not used, but instead the insulating layer 46 is used along with a semiconductor layer 24 (see, e.g., FIGS. 35A and 35C) which is removed as discussed below, and understood as being substituted in the details noted above with respect to the insulating material 88, except as noted.

Figure 54B:
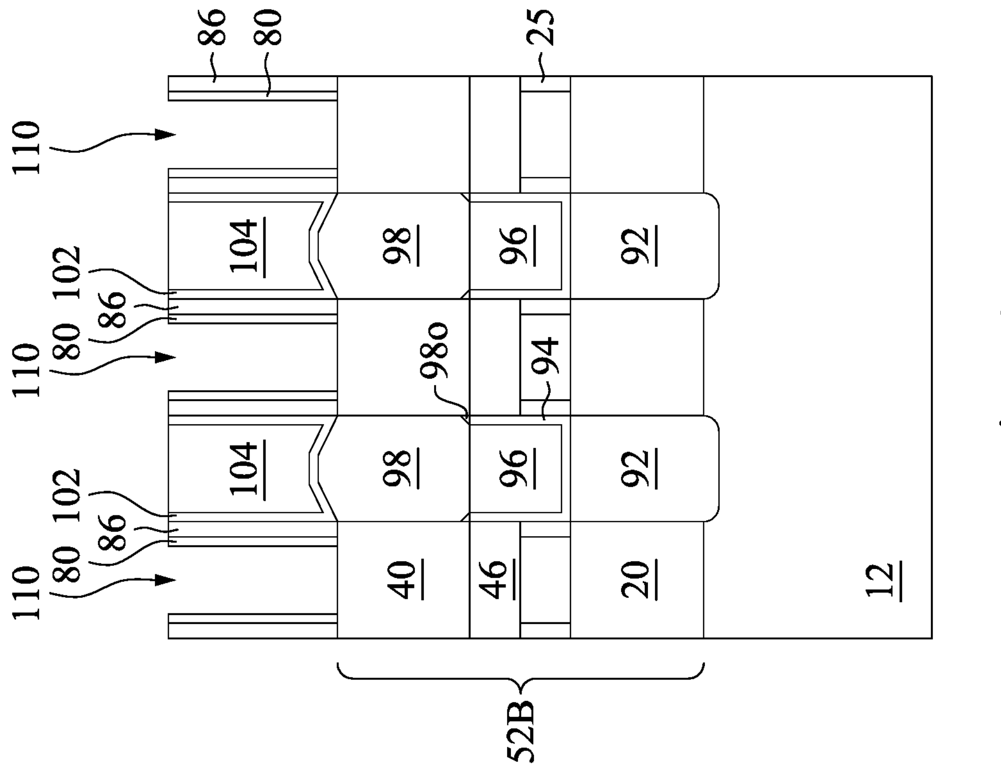
FIGS. 54A, 54B, 55A, 55B, 56A, 56B, 57A, 57B, 58A, 58B, 59A, 59B, 60A, 60B, 60C, and 60D illustrate various cross-sectional views of intermediate steps of a dummy gate replacement process and contact formation in accordance with various embodiments.
Figure 54A:
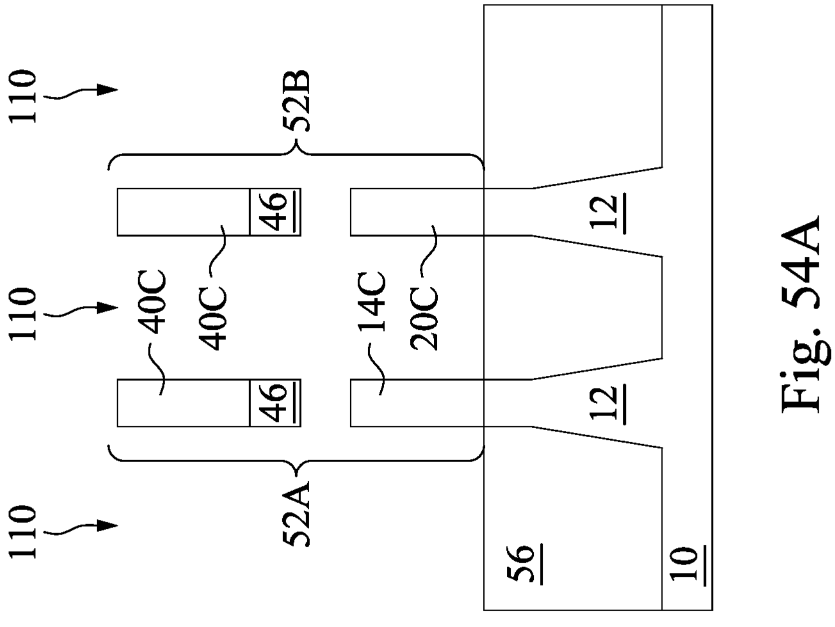

In FIGS. 54A and 54B, the dummy gates 72, the pad layer 74 if present, and the masks 76 if present, are removed in an etching step(s), so that recesses 110 are formed. This process may be completed in a manner similar to that described above with the formation of the recesses 110 with respect to FIGS. 36A and 36B, and therefore not repeated.

After forming the recesses 110, the semiconductor layer 24 may be removed to release the insulating layer 46 from the semiconductor layer 14 and/or semiconductor layer 20. The semiconductor layer 24 may be removed by performing an isotropic etching process such as wet etching or the like using etchants which are selective to the materials of the semiconductor layer 24. Due to the high germanium content of the semiconductor layer 24, etch selectivity can be achieved from the semiconductor layer 20 which may also be silicon germanium with a smaller germanium content. Thus the semiconductor layer 24 may be removed while the semiconductor layer 40, insulating layer 46, STI regions 56, first inner spacers 25, semiconductor layer 14 (if used), and semiconductor layer 20 (if used) remain relatively unetched as compared to the semiconductor layer 24. Tetramethylammonium hydroxide (TMAH), ammonium hydroxide ($NH_4OH$), or the like may be used to remove semiconductor layer 24.

Figure 55B:
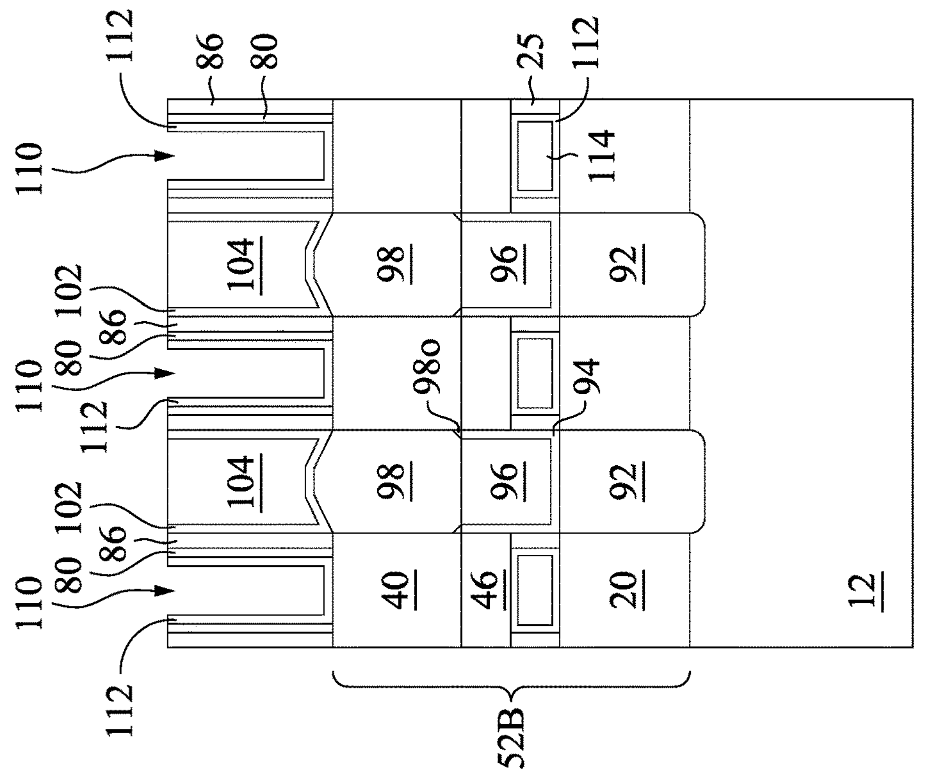
Figure 55A:
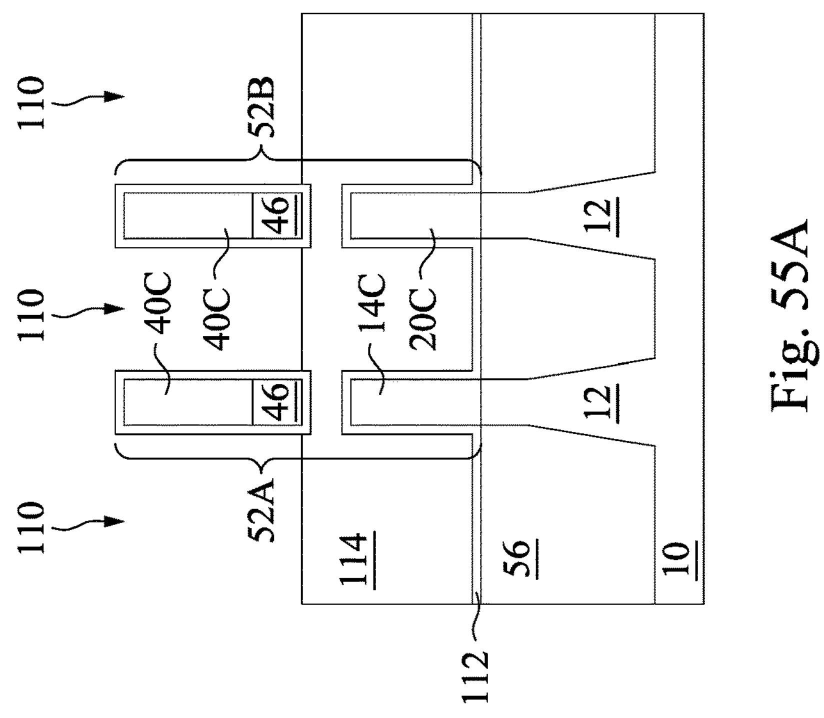

In FIGS. 55A and 55B, the gate dielectric layers 112 and gate electrodes 114 are formed for replacement gates using processes and materials such as those described above with respect to FIGS. 37A and 37B. The discussion and view of FIG. 38 also applies to the gate electrodes 114. Because of the gap left from removing the semiconductor layer 24, the gate dielectric layer 112 may wrap around the combination of the channel region 40*c* and insulating layer 46. Similarly, a lower portion of the gate dielectric layer 112 may wrap over upper surfaces of the channel region 14*c* and/or channel region 20*c*. Next, the gate electrodes 114 are recessed in a manner similar to that discussed above with respect to FIGS. 39A and 39B to form the recesses 110 again so that an upper surface of the gate electrodes is lower than the lower surface of the channel region 40*c*. The upper surface of the gate electrodes 114 may fall anywhere between the upper surface of the insulating layer 46 and a point in the gap between the insulating layer 46 and the channel region 14*c* and/or channel region 20*c*, in some embodiments. In the illustrated embodiment, the upper surface of the gate electrodes 114 after recessing is aligned to a portion of the insulating layer 46. In particular, the upper surface of the gate electrodes 114 falls between the midpoint of the insulating layer 46 and the bottom surface of the insulating layer 46. In other embodiments, the upper surface of the gate electrodes 114 may be slightly below the upper surface of the channel region 14*c* and/or the channel region 20*c*, such as analogously illustrated in FIG. 41A, with respect to the insulating material 88.

Figure 56B:
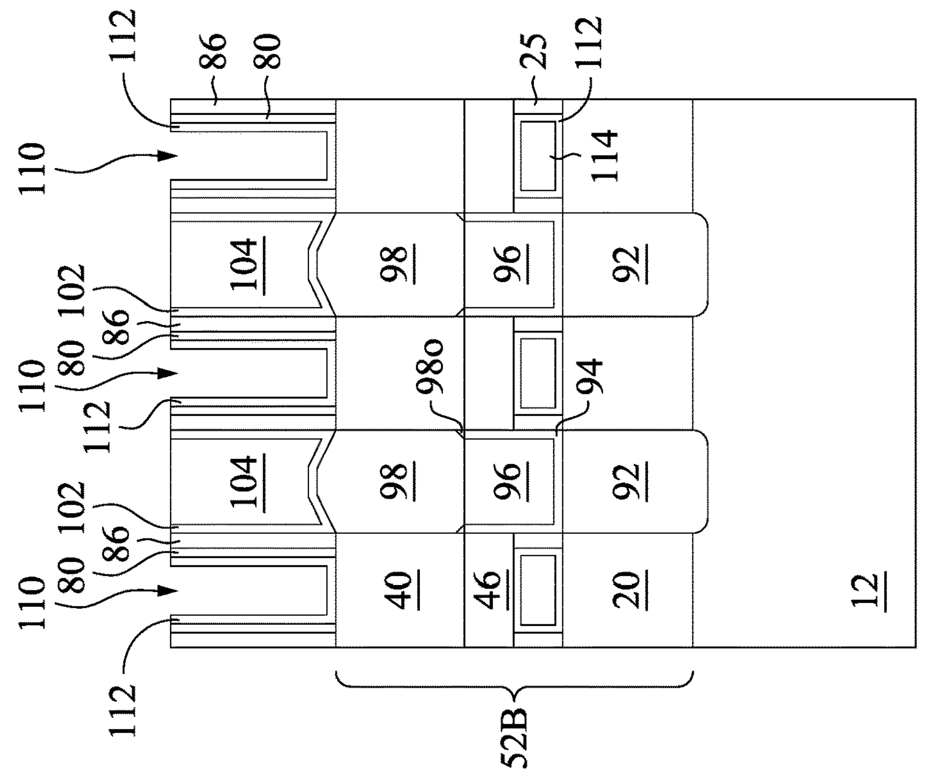
Figure 56A:
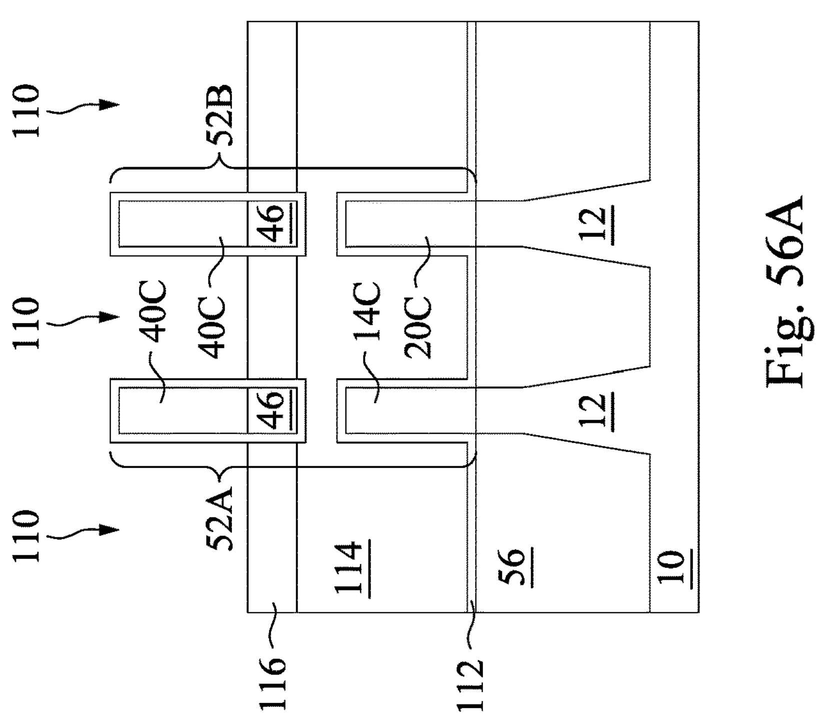

In FIGS. 56A and 56B, an isolation structure 116 is formed in the recesses 110 on the gate electrodes 114. The isolation structure 116 may be formed using processes and materials similar to those discussed with respect to FIGS. 40A and 40B. The isolation structure 116 may fill or partially fill the recesses over the gate electrodes 114. Following the formation of the isolation structure 116, the isolation structure 116 may be recessed in a manner similar to that discussed above with respect to FIGS. 41A and 41B to form the recesses 110 again so that the upper surface of the isolation structure 116 is higher than the upper surface of the channel region 14*c* and/or channel region 20*c*. This provides separation so that the gate electrode 114 of the PFET can be isolated from the gate electrode 118 of the NFET. Also, the isolation structure 116 may have an upper surface which is lower than the upper surface of the insulating layer 46 (and above the lower surface of the insulating layer 46), or may have an upper surface which is lower than the lower surface of the insulating layer 46 (e.g., falling in the gap between the insulating layer 46 and the channel region 14*c* and/or channel region 20*c*), in some embodiments. In other embodiments, such as illustrated in FIG. 56A, the isolation structure 116 may have an upper surface which is slightly above the upper surface of the insulating layer 46.

Figures 57A, 57B:
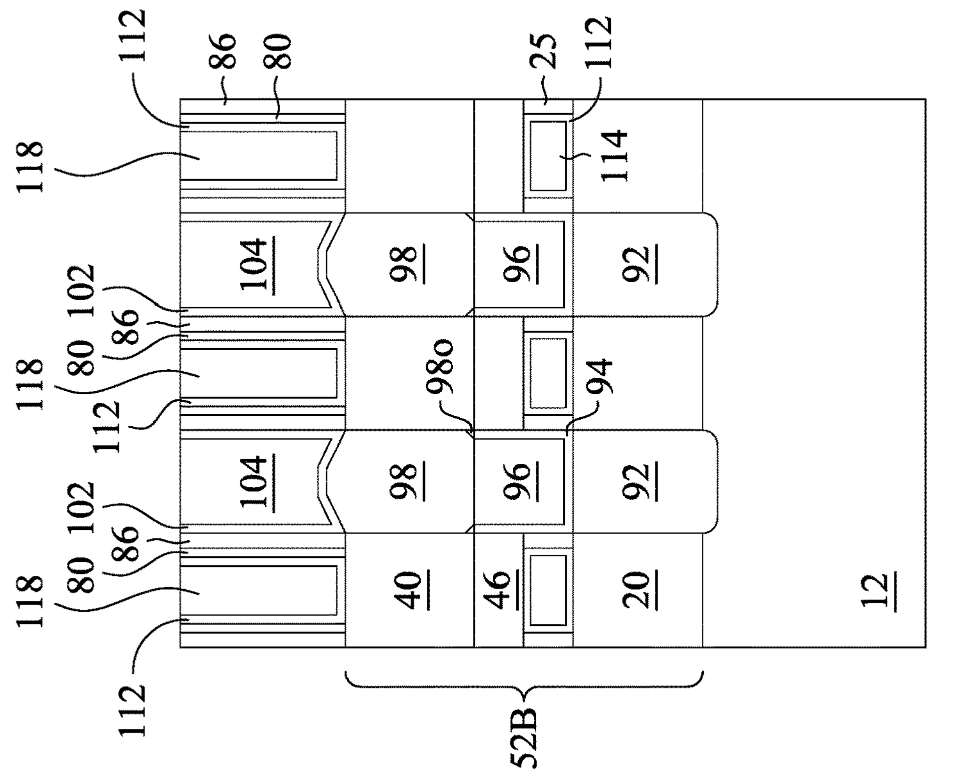

In FIGS. 57A and 57B, the gate electrodes 118 are formed for replacement gates using processes and materials such as those described above with respect to FIGS. 42A and 42B. The discussion and view of FIG. 43 also applies to the gate electrodes 118.

Figure 58B:
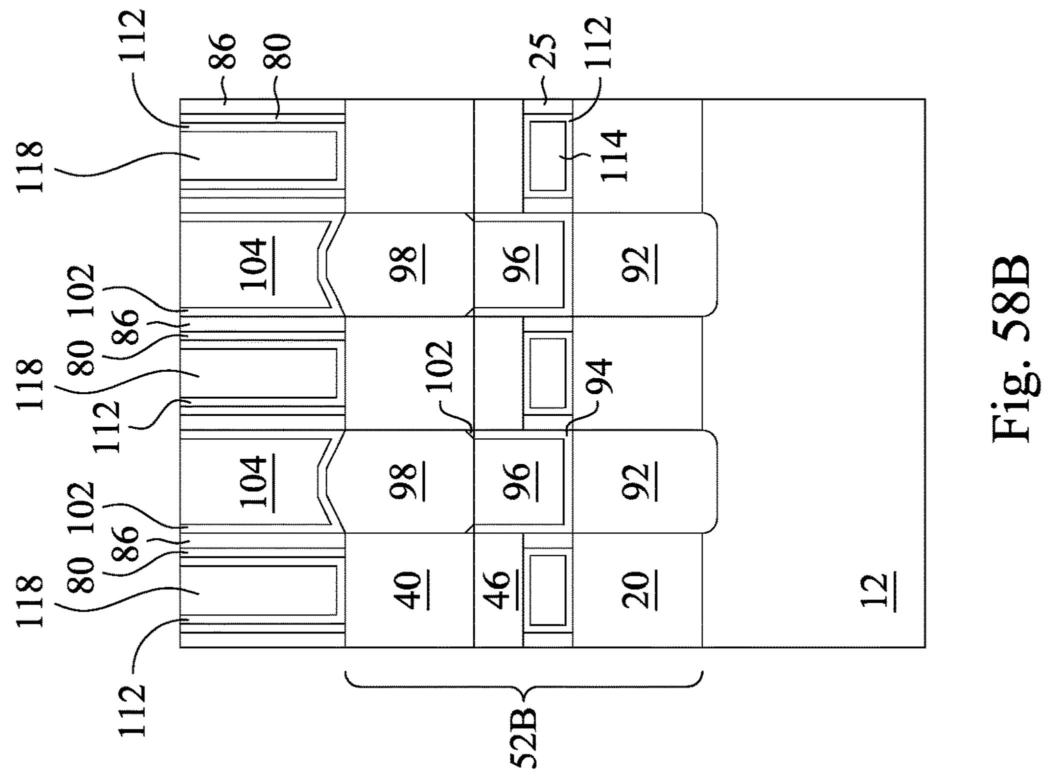
Figure 58A:
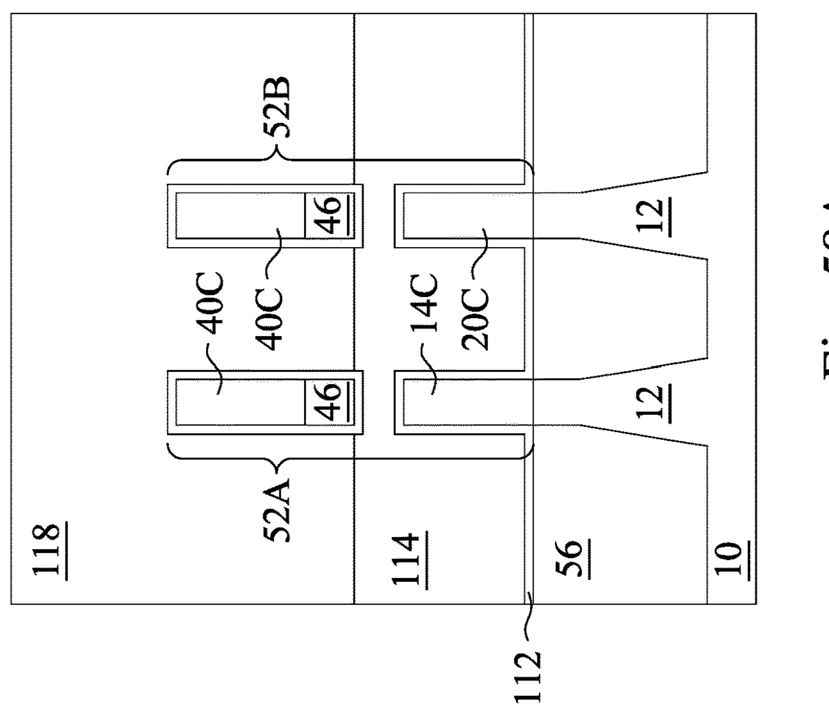

In FIGS. 58A and 58B, rather than include the isolation structure 116 to isolate the gate electrodes 114 from the gate electrodes 118, the isolation structure 116 is omitted, such as illustrated and discussed above with respect to FIGS. 44A and 44B. That is, after recessing the gate electrodes 114, the gate electrodes 118 are formed directly on the gate electrodes 114. This provides a common gate connection scheme, where a single gate contact may be used to switch on both the NFET and PFET at the same time. Similar to that discussed above with respect to FIGS. 44A and 44B, in such embodiments, the interface between the gate electrode 118 and gate electrode 114 may be between the upper surface of the insulating layer 46 and the upper surface of the channel region 14*c* and/or channel region 20*c*.

In FIGS. 59A and 59B, a gate mask 120 and isolation region 122 are formed in a manner similar to that discussed above with respect to FIGS. 45A and 45B. It should be noted that FIGS. 59A and 60A present combined views based on the structures of FIG. 57A and FIG. 58A which are provided for the sake of simplicity.

In FIGS. 60A, 60B, 60C, and 60D, gate contacts 132 (and/or 136), source/drain contacts 134, and source/drain contacts 138 are formed. The gate contacts 132 and the source/drain contacts 134 are formed on the upper side (e.g., to the NFET gate electrode 118 and NFET epitaxial source/drain regions 98, respectively). The gate contacts 136 and the source/drain contacts 138 are formed on the lower side (e.g., to the PFET gate electrode 114 and PFET epitaxial source/drain regions 92, respectively). The gate contacts 132 and 136 and the source/drain contacts 134 and 138 may be formed using processes and materials similar to those discussed above with respect to FIGS. 46A, 46B, 46C, and 46D. Additional processes may be used to form redistribution structures and metallization patterns both over and under the various contacts to route couple the contacts to other features.

Embodiments advantageously use FinFET processes to form a stacked or vertical CFET device which can be used, for example, in an SRAM device, logic device, or other architecture where complementary transistors are needed. Embodiments provide both monolithic and sequential process options for forming the semiconductor fins which are then used to form the FinFET CFET devices. Embodiments include the options of having hybrid fins, for example, for the PFET device, and options for having isolated or common gate schemes. Embodiments can utilize a FinFET CFET device with different material characteristics of the channel regions. For example, in the NFET the channel material (e.g., of the semiconductor layer 30 or 40) may be silicon while in the PFET the channel material (e.g., of the semiconductor layer 20) may be silicon germanium. These materials provide better mobility and improve logic performance for each respective device-type. Moreover, these varying channel materials are compatible in the same wafer and an SRAM device pull up can adopt a silicon channel to weaken drive current for write margin optimization. Also, the fin heights may be flexibly determined for each of the channels by determining the thicknesses of the semiconductor layers 14 or 20 and 30 or 40, thus providing the ability to achieve N-P balance and power, performance, and area optimization.

One embodiment is a method including forming a recess in a stacked fin, a lower portion of the stacked fin having a different conductivity type than an upper portion of the stacked fin, the upper portion of the stacked fin separated from the lower portion of the stacked fin by a separation structure, the recess exposing sidewalls of the lower portion and sidewalls of the upper portion. The method also includes growing a first epitaxial structure in the recess. The method also includes etching the first epitaxial structure to remove a portion of the first epitaxial structure contacting the upper portion. The method also includes forming a first isolation structure over the first epitaxial structure. The method also includes growing a second epitaxial structure over the first isolation structure. The method also includes forming a second isolation structure over the second epitaxial structure.

In an embodiment, the method may include etching a dummy gate electrode to expose a first channel region of the stacked fin and a second channel region of the stacked fin, the first channel region corresponding to the lower portion, the second channel region corresponding to the upper portion, the first channel region separated from the second channel region by the separation structure; depositing a first gate electrode adjacent the first channel region and the second channel region; etching the first gate electrode to remove a portion of the first gate electrode adjacent the second channel region; and depositing a second gate electrode over the first gate electrode and adjacent the second channel region. In an embodiment, the method may include: forming a third isolation structure after etching the first gate electrode, and depositing the second gate electrode on the third isolation structure. In an embodiment, the method may include: etching a portion of the separation structure to form an air gap between the first channel region and the second channel region. In an embodiment, the separation structure includes an insulating material layer. In an embodiment, the insulating material layer extends continuously from the upper portion of the stacked fin to the lower portion of the stacked fin. In an embodiment, the method may include: after forming the recess, modifying the separation structure by removing a silicon germanium layer having high germanium content, thereby forming a void between the upper portion and the lower portion; depositing an insulating material in the recess, the insulating material filling the void; and etching the insulating material to remove a portion of the insulating material from the recess while another portion of the insulating material remains in the void. In an embodiment, the method may include: forming a multi-layered structure including a first semiconductor layer, a separation layer, and a second semiconductor layer, the separation layer interposed between the first semiconductor layer and the second semiconductor layer; and patterning the multi-layered structure to form the stacked fin, the lower portion of the stacked fin corresponding to the first semiconductor layer, the upper portion of the stacked fin corresponding to the second semiconductor layer, and the separation structure of the stacked fin corresponding to the separation layer. In an embodiment, the method may include: providing the first semiconductor layer; etching a portion of the first semiconductor layer to form a recess in the first semiconductor layer; depositing a third semiconductor layer in the recess; levelling an upper surface of the third semiconductor layer with an upper surface of the first semiconductor layer; and patterning a second stacked fin from the multi-layered structure, the second stacked fin including a lower portion corresponding to the third semiconductor layer, an upper portion corresponding to the second semiconductor layer, and a separation structure corresponding to the separation layer. In an embodiment, the method may include: providing a second bonding dielectric layer over a second semiconductor substrate, the second semiconductor substrate corresponding to the second semiconductor layer; and attaching the second bonding dielectric layer to a first semiconductor substrate, the first semiconductor substrate including the first semiconductor layer and either a first bonding dielectric layer or a fourth semiconductor layer disposed on the first semiconductor substrate, the first semiconductor substrate corresponding to the first semiconductor layer, the separation structure including the second bonding layer and either the first bonding layer or the fourth semiconductor layer, the fourth semiconductor layer having an etch selectivity different from the first semiconductor layer and the second semiconductor layer.

Another embodiment is a method including exposing a dummy gate electrode, the dummy gate electrode disposed over and along sidewalls of a first structure, the first structure being a multi-layered structure may include a first semiconductor layer, a separation structure over the first semiconductor layer, and a second semiconductor layer over the separation structure, the separation structure electrically separating the first semiconductor layer from the second semiconductor layer. The method also includes etching the dummy gate electrode to remove the dummy gate electrode from over the first structure and from sidewalls of the first structure, thereby forming a first opening. The method also includes forming a gate dielectric layer on a top of the first structure and on the sidewalls of the first structure. The method also includes forming a first gate electrode on the gate dielectric layer. The method also includes etching an upper portion of the first gate electrode to remove the upper portion of the first gate electrode. The method also includes forming a second gate electrode over the first gate electrode.

In an embodiment, after etching the upper portion of the first gate electrode, an upper surface of the first gate electrode is disposed between the first semiconductor layer and the second semiconductor layer, adjacent the separation structure. In an embodiment, the method may include prior to forming the second gate electrode, forming an isolation structure over the first gate electrode, the isolation structure electrically separating the first gate electrode from the second gate electrode. In an embodiment, the method may include: forming a first gate contact to the first gate electrode through a first interlayer dielectric (ILD); and forming a second gate contact to the second gate electrode through a second ILD, the first gate contact and the second gate contact disposed on opposing sides of the first gate electrode and second gate electrode. In an embodiment, a material of the first semiconductor layer is different than a material of the second semiconductor layer.

Another embodiment is a device including a first channel region of a first transistor and a second channel region of a second transistor, the second channel region stacked over the first channel region. The device also includes a separation structure disposed between the first channel region and the second channel region. The device also includes a first epitaxial pair of the first transistor disposed on opposing sides of the first channel region. The device also includes a second epitaxial pair of the second transistor disposed on opposing sides of the second channel region and stacked over the first epitaxial pair. The device also includes a first isolation structure disposed between the first epitaxial pair and the second epitaxial pair. The device also includes a first gate structure disposed adjacent the first channel region in a direction perpendicular to the first epitaxial pair. The device also includes a second gate structure disposed adjacent the second channel region and over the first gate structure.

In an embodiment, the first channel region has an opposite conductivity than the second channel region. In an embodiment, the device may include a second isolation structure disposed between the first gate structure and the second gate structure. In an embodiment, the separation structure includes a first insulating layer disposed over a second insulating layer. In an embodiment, the second insulating layer may include a pair of spacers extending from the first insulating layer to an upper surface of the first channel region.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a recess in a stacked fin, a lower portion of the stacked fin having a different conductivity type than an upper portion of the stacked fin, the upper portion of the stacked fin separated from the lower portion of the stacked fin by a separation structure, the recess exposing sidewalls of the lower portion and sidewalls of the upper portion;

after forming the recess, modifying the separation structure by:

removing a silicon germanium layer having high germanium content, thereby forming a void between the upper portion and the lower portion;

depositing an insulating material in the recess, the insulating material filling the void; and etching the insulating material to remove a portion of the insulating material from the recess while another portion of the insulating material remains in the void;

growing a first epitaxial structure in the recess;

etching the first epitaxial structure to remove a portion of the first epitaxial structure contacting the upper portion;

forming a first isolation structure over the first epitaxial structure;

growing a second epitaxial structure over the first isolation structure; and forming a second isolation structure over the second epitaxial structure.

2. The method of claim 1, further comprising:

etching a dummy gate electrode to expose a first channel region of the stacked fin and a second channel region of the stacked fin, the first channel region corresponding to the lower portion, the second channel region corresponding to the upper portion, the first channel region separated from the second channel region by the separation structure;

depositing a first gate electrode adjacent the first channel region and the second channel region;

etching the first gate electrode to remove a portion of the first gate electrode adjacent the second channel region; and depositing a second gate electrode over the first gate electrode and adjacent the second channel region.

3. The method of claim 2, further comprising:

forming a third isolation structure after etching the first gate electrode, and depositing the second gate electrode on the third isolation structure.

4. The method of claim 2, further comprising:

etching a portion of the separation structure to form an air gap between the first channel region and the second channel region.

5. The method of claim 1, wherein the separation structure includes an insulating material layer.

6. The method of claim 5, wherein the insulating material layer extends continuously from the upper portion of the stacked fin to the lower portion of the stacked fin.

7. The method of claim 1, further comprising:

forming a multi-layered structure including a first semiconductor layer, a separation layer, and a second semiconductor layer, the separation layer interposed between the first semiconductor layer and the second semiconductor layer; and patterning the multi-layered structure to form the stacked fin, the lower portion of the stacked fin corresponding to the first semiconductor layer, the upper portion of the stacked fin corresponding to the second semiconductor layer, and the separation structure of the stacked fin corresponding to the separation layer.

8. The method of claim 7, further comprising:

providing the first semiconductor layer;

etching a portion of the first semiconductor layer to form a recess in the first semiconductor layer;

depositing a third semiconductor layer in the recess;

leveling an upper surface of the third semiconductor layer with an upper surface of the first semiconductor layer; and patterning a second stacked fin from the multi-layered structure, the second stacked fin including a lower portion corresponding to the third semiconductor layer, an upper portion corresponding to the second semiconductor layer, and a separation structure corresponding to the separation layer.

9. The method of claim 7, further comprising:

providing a second bonding dielectric layer over a second semiconductor substrate, the second semiconductor substrate corresponding to the second semiconductor layer; and attaching the second bonding dielectric layer to a first semiconductor substrate, the first semiconductor substrate including the first semiconductor layer and either a first bonding dielectric layer or a fourth semiconductor layer disposed on the first semiconductor substrate, the first semiconductor substrate corresponding to the first semiconductor layer, the separation structure including the second bonding dielectric layer and either the first bonding dielectric layer or the fourth semiconductor layer, the fourth semiconductor layer having an etch selectivity different from the first semiconductor layer and the second semiconductor layer.

10. The method of claim 1, further comprising forming a liner layer over the first epitaxial structure before forming the first isolation structure over the first epitaxial structure.

11. A method comprising:

exposing a dummy gate electrode, the dummy gate electrode disposed over and along sidewalls of a first structure, the first structure being a multi-layered structure comprising a first semiconductor layer, a separation structure over the first semiconductor layer, and a second semiconductor layer over the separation structure, the separation structure electrically separating the first semiconductor layer from the second semiconductor layer;

etching the dummy gate electrode to remove the dummy gate electrode from over the first structure and from sidewalls of the first structure, thereby forming a first opening;

forming a gate dielectric layer on a top of the first structure and on the sidewalls of the first structure;

forming a first gate electrode on the gate dielectric layer;

etching an upper portion of the first gate electrode to remove the upper portion of the first gate electrode;

forming an isolation structure over the first gate electrode; and after forming the isolation structure, forming a second gate electrode over the first gate electrode, the isolation structure electrically separating the first gate electrode from the second gate electrode.

12. The method of claim 11, wherein after etching the upper portion of the first gate electrode, an upper surface of the first gate electrode is disposed between the first semiconductor layer and the second semiconductor layer, adjacent the separation structure.

13. The method of claim 11, further comprising:

forming a first gate contact to the first gate electrode through a first interlayer dielectric (ILD); and forming a second gate contact to the second gate electrode through a second ILD, the first gate contact and the second gate contact disposed on opposing sides of the first gate electrode and the second gate electrode.

14. The method of claim 11, wherein a material of the first semiconductor layer is different than a material of the second semiconductor layer.

15. The method of claim 11, wherein an upper surface of the isolation structure is disposed between an upper surface of the separation structure and a lower surface of the separation structure.

16. A device comprising:

a first channel region of a first transistor;

a second channel region of a second transistor, the second channel region stacked over the first channel region;

a separation structure disposed between the first channel region and the second channel region, wherein the separation structure includes a first insulating layer disposed over a second insulating layer;

a first epitaxial pair of the first transistor disposed on opposing sides of the first channel region;

a second epitaxial pair of the second transistor disposed on opposing sides of the second channel region and stacked over the first epitaxial pair;

a first isolation structure disposed between the first epitaxial pair and the second epitaxial pair;

a first gate structure disposed adjacent the first channel region in a direction perpendicular to the first epitaxial pair; and a second gate structure disposed adjacent the second channel region and over the first gate structure.

17. The device of claim 16, wherein the first channel region has an opposite conductivity than the second channel region.

18. The device of claim 16, further comprising a second isolation structure disposed between the first gate structure and the second gate structure.

19. The device of claim 16, wherein the second insulating layer comprises a pair of spacers extending from the first insulating layer to an upper surface of the first channel region.

20. The device of claim 16, wherein the first insulating layer and the second insulating layer are bonded together by a fusion bond.

* * * * *